US012715334B2

(12) United States Patent
Shigemori et al.

(10) Patent No.: US 12,715,334 B2
(45) Date of Patent: Aug. 25, 2026

(54) MONITORING DEVICE, CONTROL DEVICE, BATTERY INFORMATION COMMUNICATION SYSTEM, NON-TRANSITORY COMPUTER READABLE MEDIUM, AND BATTERY INFORMATION COMMUNICATION METHOD

(71) Applicant: DENSO CORPORATION, Kariya-city (JP)

(72) Inventors: Shogo Shigemori, Kariya-city (JP); Takeshi Iida, Kariya-city (JP); Takuya Ohata, Kariya-city (JP); Tsuyoo Moriya, Kariya-city (JP); Tatsuhiro Numata, Kariya-city (JP)

(73) Assignee: DENSO CORPORATION, Kariya-city (JP)

(*) Notice: Subject to any disclaimer, the term of this patent is extended or adjusted under 35 U.S.C. 154(b) by 94 days.

(21) Appl. No.: 18/740,927

(22) Filed: Jun. 12, 2024

(65) Prior Publication Data

US 2025/0010758 A1 Jan. 9, 2025

(30) Foreign Application Priority Data

Jul. 4, 2023 (JP) ................................ 2023-109948

(51) Int. Cl.
*B60L 58/12* (2019.01)
*G01R 31/371* (2019.01)
(Continued)

(52) U.S. Cl.
CPC ............ *B60L 58/12* (2019.02); *G01R 31/371* (2019.01); *G01R 31/3842* (2019.01); *G01R 31/396* (2019.01)

(58) Field of Classification Search
CPC ........ B60L 58/12; B60L 58/10; B60L 3/0046; B60L 3/12; G01R 31/371; G01R 31/3842;
(Continued)

(56) References Cited

U.S. PATENT DOCUMENTS

| | | | | |
|---|---|---|---|---|
| 2003/0146737 A1* | 8/2003 | Kadouchi | ............... | B60L 58/14 320/132 |
| 2004/0039504 A1* | 2/2004 | Coffee | ...................... | B60P 3/03 701/482 |

(Continued)

FOREIGN PATENT DOCUMENTS

| | | | | |
|---|---|---|---|---|
| JP | 2006279927 A * | 10/2006 | | |
| KR | 102424982 B1 * | 7/2022 | ......... | H04B 10/2589 |
| WO | WO-2015189898 A1 * | 12/2015 | ................ | H02J 7/02 |

OTHER PUBLICATIONS

F. A. Rincon Vija, S. Cregut, G. Z. Papadopoulos and N. Montavont, "Autonomous Balancing Sleep Mode for Wireless BMS in Electric Vehicles," 2021 IEEE Conference on Standards for Communications and Networking (CSCN), Thessaloniki, Greece, 2021, pp. 65-71, doi: 10.1109/CSCN53733.2021.9686103. (Year: 2021).*

(Continued)

*Primary Examiner* — Abby J Flynn
*Assistant Examiner* — Merritt Levy
(74) *Attorney, Agent, or Firm* — Posz Law Group, PLC

(57) ABSTRACT

A monitoring device is configured to monitor a state of a battery and transmitting the state of the battery as battery information to a control device by wireless communication. The monitoring device includes a monitoring-device-side communication unit configured to execute a connection process with a control-device-side communication unit and communicate the battery information. The monitoring-device-side communication unit is configured to set a communication speed when at least a part of a predetermined (Continued)

connection process of the connection process is executed with the control-device-side communication unit to be lower than a communication speed when the battery information is transmitted to the control-device-side communication unit.

32 Claims, 26 Drawing Sheets

(51) Int. Cl.
*G01R 31/3842* (2019.01)
*G01R 31/396* (2019.01)

(58) Field of Classification Search
CPC ................ G01R 31/396; G01R 31/382; G01R 31/3646; B60R 16/0232; H04L 67/12
USPC ............................................................ 701/22
See application file for complete search history.

(56) References Cited

U.S. PATENT DOCUMENTS

2008/0219337 A1* 9/2008 Kawata ............... H01M 10/425 315/307
2011/0187326 A1* 8/2011 Kawata ............... H01M 10/425 320/116
2015/0214758 A1* 7/2015 Toya ..................... H04L 67/141 320/135
2016/0006343 A1* 1/2016 Terada ................ H02J 7/00712 307/104
2019/0132839 A1* 5/2019 Li ......................... H04W 74/04
2020/0142004 A1* 5/2020 Ito ........................ G01R 31/371
2021/0083955 A1* 3/2021 Kanaya ................. H04W 76/10
2021/0320745 A1* 10/2021 Kim ...................... H02J 50/402
2022/0407121 A1 12/2022 Lee et al.
2023/0054678 A1 2/2023 Hwang
2023/0062093 A1 3/2023 Ohata et al.
2023/0187945 A1 6/2023 Yang et al.
2024/0077539 A1 3/2024 Shigemori et al.

OTHER PUBLICATIONS

P. Bansal and P. R. Nagaraj, “Wireless Battery Management System for Electric Vehicles,” 2019 IEEE Transportation Electrification Conference (ITEC-India), Bengaluru, India, 2019, pp. 1-5, doi: 10.1109/ITEC-India48457.2019.ITECINDIA2019-83. (Year: 2019).*
P. Kindt, D. Yunge, M. Gopp and S. Chakraborty, “Adaptive online power-management for Bluetooth Low Energy,” 2015 IEEE Conference on Computer Communications (INFOCOM), Hong Kong, China, 2015, pp. 2695-2703, doi: 10.1109/INFOCOM.2015.7218661. (Year: 2015).*

* cited by examiner

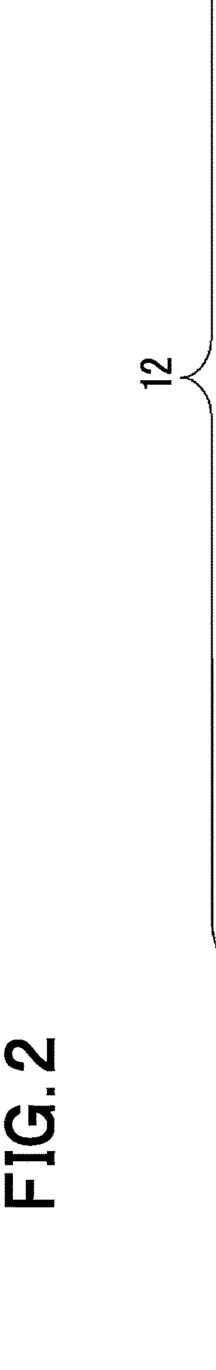
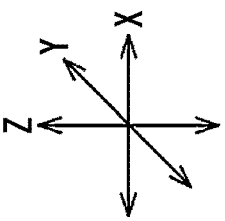
FIG. 2

S1
S1a
S1b
30
30a
30b
30e
30f
20
20a
22
23
24
25
26
27
40
44
46
50
X
Y
Z

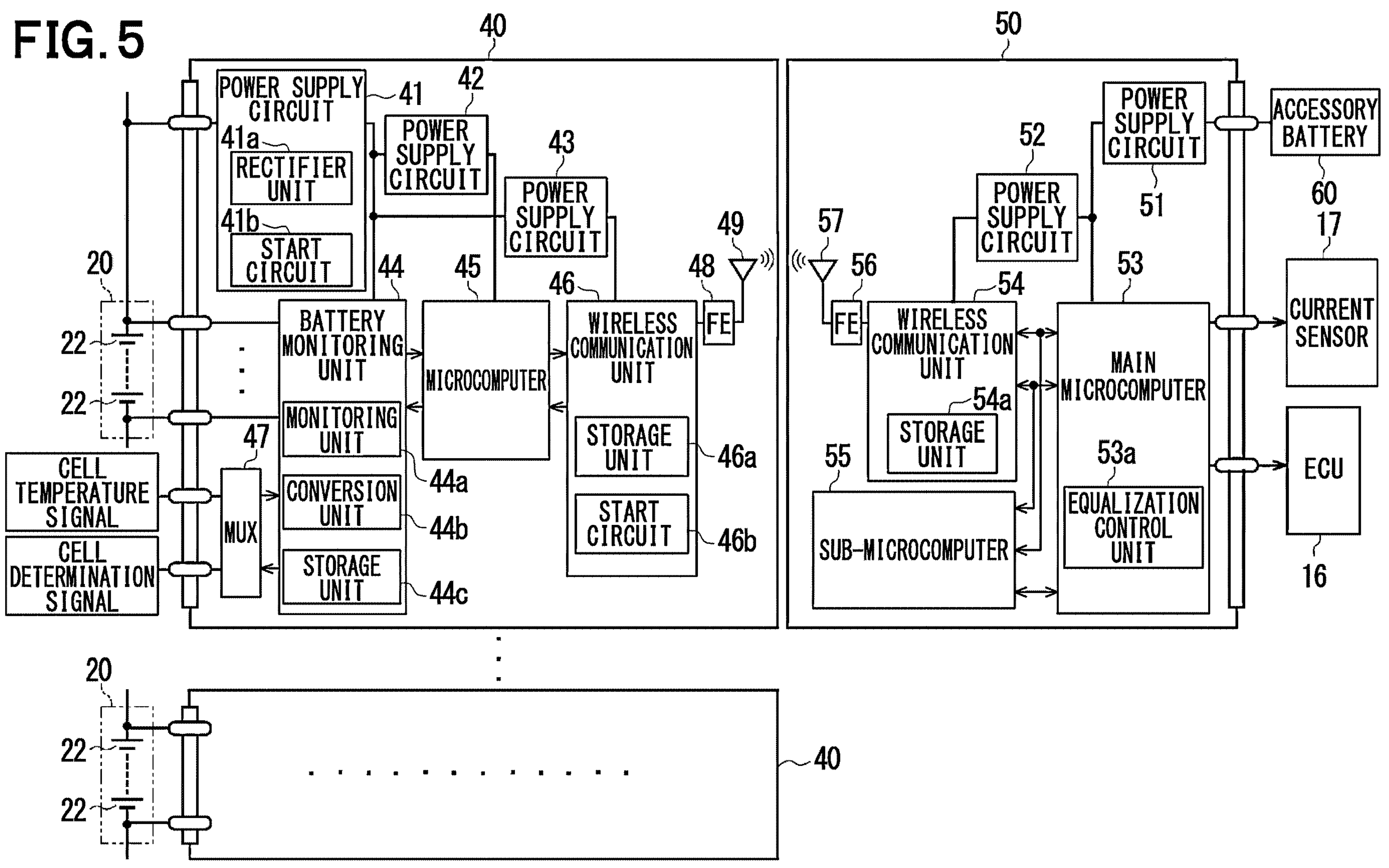
FIG. 5
40
POWER SUPPLY CIRCUIT
41
41a
RECTIFIER UNIT
41b
START CIRCUIT
42
POWER SUPPLY CIRCUIT
43
POWER SUPPLY CIRCUIT
20
22
22
44
BATTERY MONITORING UNIT
MONITORING UNIT
44a
CONVERSION UNIT
44b
STORAGE UNIT
44c
45
MICROCOMPUTER
46
WIRELESS COMMUNICATION UNIT
STORAGE UNIT
46a
START CIRCUIT
46b
47
MUX
48
FE
49
CELL TEMPERATURE SIGNAL
CELL DETERMINATION SIGNAL
50
57
56
FE
52
POWER SUPPLY CIRCUIT
54
WIRELESS COMMUNICATION UNIT
54a
STORAGE UNIT
55
SUB-MICROCOMPUTER
POWER SUPPLY CIRCUIT
51
53
MAIN MICROCOMPUTER
53a
EQUALIZATION CONTROL UNIT
ACCESSORY BATTERY
60
17
CURRENT SENSOR
ECU
16
20
22
22
40

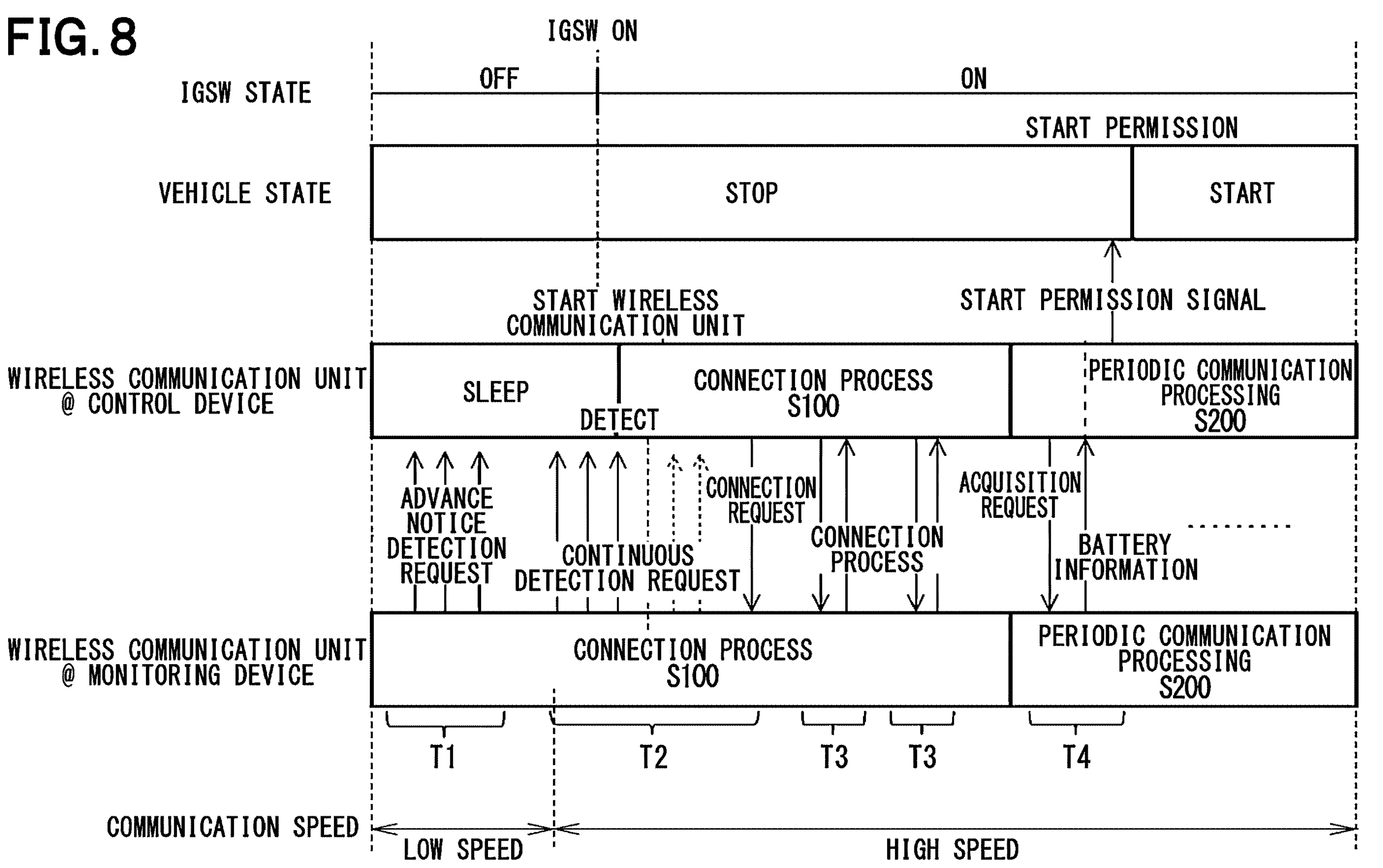
FIG. 8
IGSW ON
IGSW STATE
OFF
ON
START PERMISSION
VEHICLE STATE
STOP
START
START WIRELESS COMMUNICATION UNIT
START PERMISSION SIGNAL
WIRELESS COMMUNICATION UNIT @ CONTROL DEVICE
SLEEP
DETECT
CONNECTION PROCESS S100
PERIODIC COMMUNICATION PROCESSING S200
ADVANCE NOTICE DETECTION REQUEST
CONTINUOUS DETECTION REQUEST
CONNECTION REQUEST
CONNECTION PROCESS
ACQUISITION REQUEST
BATTERY INFORMATION
WIRELESS COMMUNICATION UNIT @ MONITORING DEVICE
CONNECTION PROCESS S100
PERIODIC COMMUNICATION PROCESSING S200
T1
T2
T3
T3
T4
COMMUNICATION SPEED
LOW SPEED
HIGH SPEED

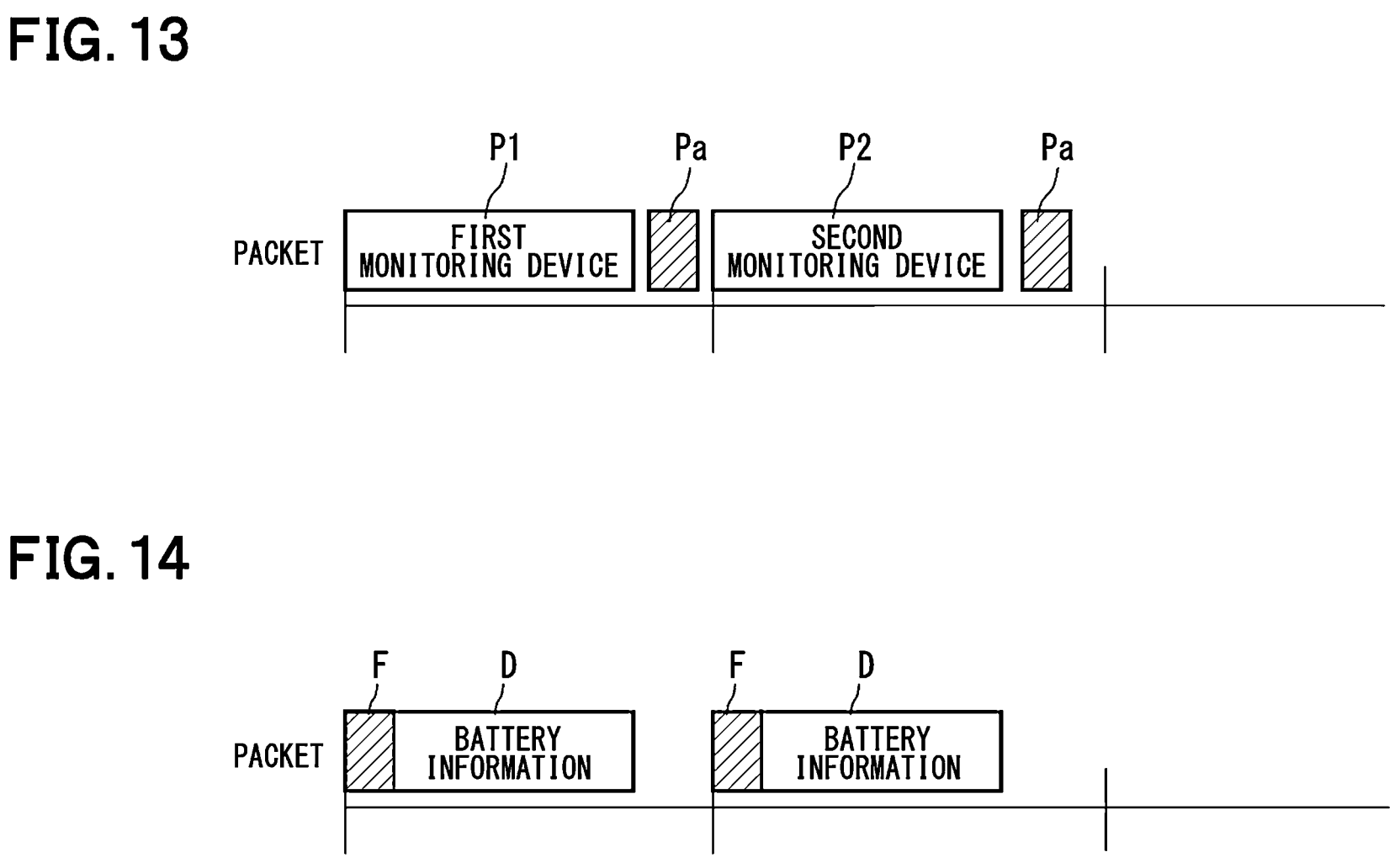

PACKET
P1
FIRST MONITORING DEVICE
Pa
P2
SECOND MONITORING DEVICE
Pa

FIG. 14

PACKET
F
D
BATTERY INFORMATION
F
D
BATTERY INFORMATION

FIG. 19

MODIFICATION OF SPEED CHANGE COMMUNICATION Sp1

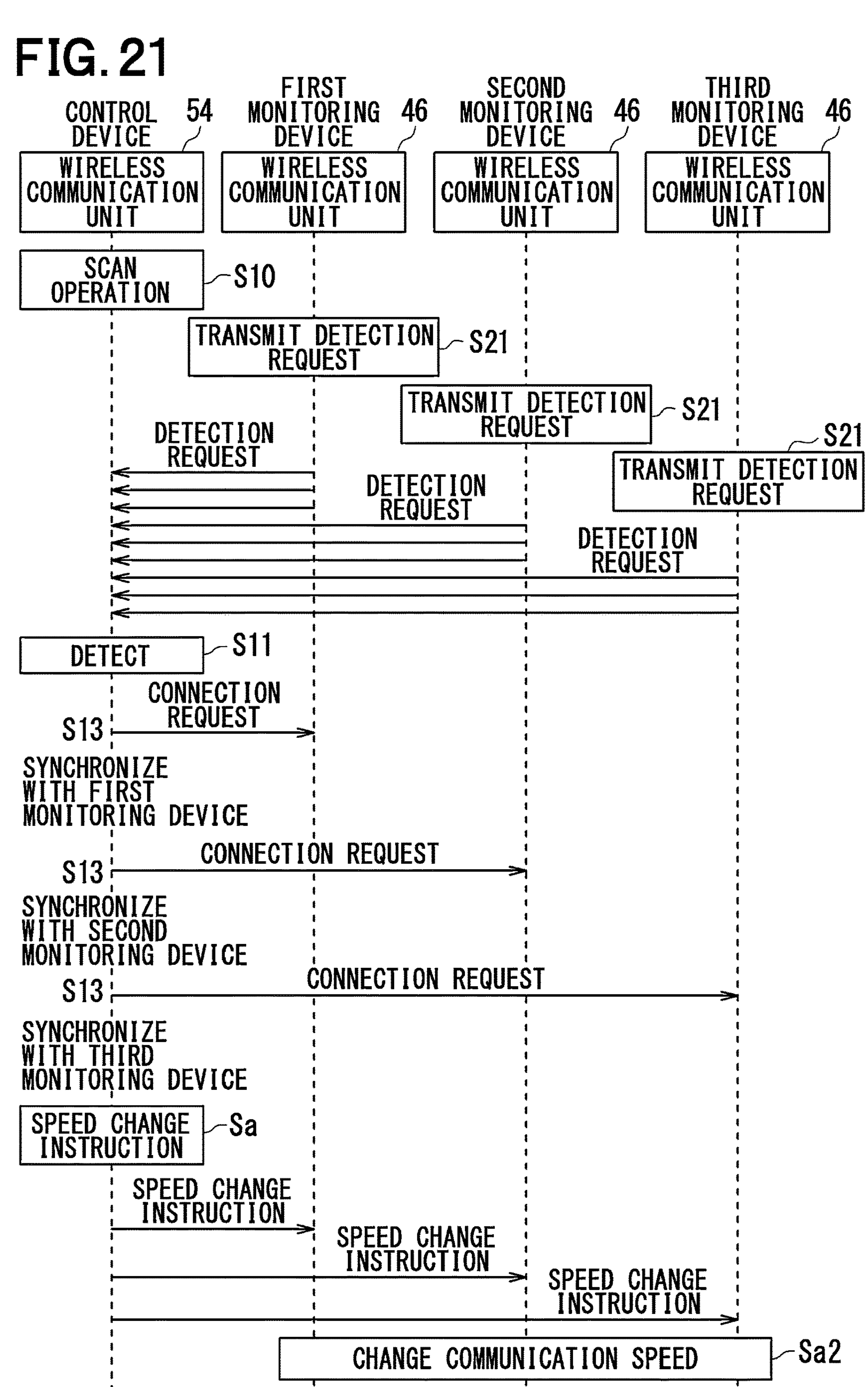
FIG. 21
CONTROL DEVICE
54
FIRST MONITORING DEVICE
46
SECOND MONITORING DEVICE
46
THIRD MONITORING DEVICE
46
WIRELESS COMMUNICATION UNIT
WIRELESS COMMUNICATION UNIT
WIRELESS COMMUNICATION UNIT
WIRELESS COMMUNICATION UNIT
SCAN OPERATION
S10
TRANSMIT DETECTION REQUEST
S21
TRANSMIT DETECTION REQUEST
S21
S21
TRANSMIT DETECTION REQUEST
DETECTION REQUEST
DETECTION REQUEST
DETECTION REQUEST
DETECT
S11
CONNECTION REQUEST
S13
SYNCHRONIZE WITH FIRST MONITORING DEVICE
CONNECTION REQUEST
S13
SYNCHRONIZE WITH SECOND MONITORING DEVICE
CONNECTION REQUEST
S13
SYNCHRONIZE WITH THIRD MONITORING DEVICE
SPEED CHANGE INSTRUCTION
Sa
SPEED CHANGE INSTRUCTION
SPEED CHANGE INSTRUCTION
SPEED CHANGE INSTRUCTION
CHANGE COMMUNICATION SPEED
Sa2

11
30
30f
22
20
20w
12
L
40
50
S1b
30e
30a
30b
S2
X
Y
Z 11
30
30f
22
12
20
20w
50
S1b
30e
X
Y
Z
44
46
40
L
S1a
S1
20a
30b
30d

MONITORING DEVICE, CONTROL DEVICE, BATTERY INFORMATION COMMUNICATION SYSTEM, NON-TRANSITORY COMPUTER READABLE MEDIUM, AND BATTERY INFORMATION COMMUNICATION METHOD

CROSS REFERENCE TO RELATED APPLICATION

The present application is based on Japanese Patent Application No. 2023-109948 filed on Jul. 4, 2023. The entire disclosures of all of the above applications are incorporated herein by reference.

TECHNICAL FIELD

The present disclosure relates to a monitoring device, a control device, a battery information communication system, a non-transitory computer readable medium, and a battery information communication method.

BACKGROUND

Conventionally, an electrified vehicle is mounted with a battery and a monitoring system therefor.

SUMMARY

According to an aspect of the present disclosure, a monitoring device is configured to monitor a state of a battery and transmit the state of the battery.

BRIEF DESCRIPTION OF THE DRAWINGS

The above and other objects, features and advantages of the present disclosure will become more apparent from the following detailed description made with reference to the accompanying drawings. In the drawings:

FIG. 2 is a perspective view schematically showing a structure of a battery pack;

FIG. 5 is an electric configuration diagram of the battery monitoring system;

FIG. 8 is a time chart schematically showing the flow of communication;

FIG. 9 is a sequence diagram schematically showing a flow of communication in a second embodiment;

FIG. 13 is a diagram (part 1) illustrating the content of a packet;

FIG. 14 is a diagram (part 2) illustrating the content of a packet;

FIG. 19 is a time chart schematically showing a flow of communication in Modification 3 of the third embodiment;

FIG. 21 is a sequence diagram schematically showing a method for changing a communication speed in a fourth embodiment;

DETAILED DESCRIPTION

Figure 1:
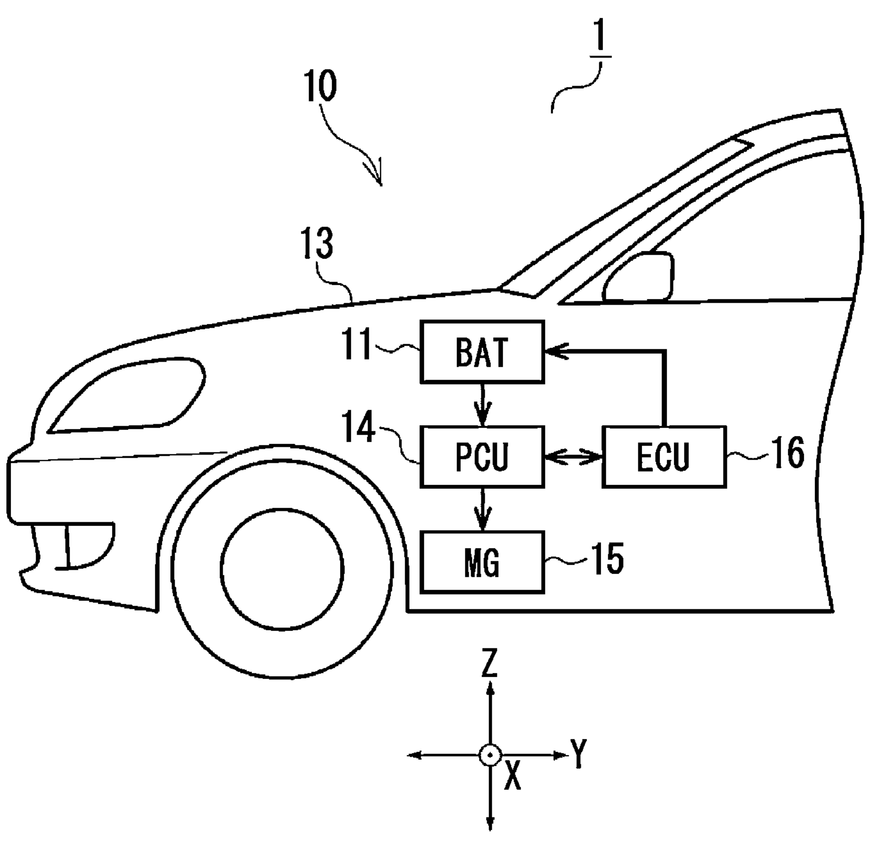
FIG. 1 is a block diagram schematically showing a battery monitoring system in a first embodiment.

Hereinafter, examples of the present disclosure will be described.

According to an example of the present disclosure, a vehicle such as a hybrid vehicle (HV), a plug-in hybrid vehicle (PHV), or an electric vehicle (EV) is mounted with a battery for driving the vehicle such as a lithium ion battery. A battery monitoring system in which a monitoring device monitors a state of a battery or the like has been proposed. In the battery monitoring system, the monitoring device acquires a state of a battery such as a voltage of a battery cell as battery information based on a command from a control device, and the control device wirelessly communicates with the monitoring device using a wireless communication unit to acquire the battery information. Accordingly, the control device is capable of comprehensively monitoring the state of the battery.

A device according to an example of the present disclosure is for transmitting data by wireless communication. According to the device, a starting unit determines that a first stage is received when a data pattern in the first stage of a radio start signal matches a predetermined data pattern, and determines that a second stage is received when a data pattern in the second stage of a radio start signal matches a predetermined data pattern. That is, an authentication technique using a data pattern at the time of the wireless communication is employed. A transmission rate of the data pattern in the first stage is set lower than a transmission rate of the data pattern in the second stage.

When communicating battery information, a battery monitoring system disclosed in a background literature transmits a large amount of data related to the battery information from a monitoring device to a control device. When the large amount of data is transmitted, it would be desirable to make a communication speed as high as possible. However, to improve reliability of communication, it would be desirable to reduce the communication speed.

According to an example of the present disclosure, a monitoring device is configured to monitor a state of a battery and transmit the state of the battery as battery information to a control device by wireless communication. The monitoring device comprises:

a monitoring-device-side communication unit configured to execute a connection process with a control-device-side communication unit and communicate the battery information.

The monitoring-device-side communication unit is configured to set a communication speed when executing at least a part of a predetermined connection process of the connection process with the control-device-side communication unit to be lower than a communication speed when transmitting the battery information to the control-device-side communication unit.

When the monitoring-device-side communication unit transmits the battery information, it would be desirable to improve the communication speed. Conversely, it would be desirable to avoid deterioration in communication reliability when the monitoring-device-side communication unit executes at least a part of the predetermined connection process of the connection process with the control-device-side communication unit. According to the above configuration, since the communication speed at the time of the predetermined connection process is set to be lower than the communication speed at the time of communicating the battery information, an error rate at the time of the predetermined connection process can be reduced, and communication reliability at the time of the predetermined connection process can be ensured. Since the communication speed at the time of communicating the battery information is higher than the communication speed at the time of the predetermined connection process, a data transmission amount of the battery information can be increased.

Hereinafter, several embodiments related to a monitoring device, a control device, and a battery monitoring system are to be described with reference to the drawings. In the embodiments described below, the same or similar configurations in the embodiments are denoted by the same or similar reference signs, and the description thereof may be omitted.

First Embodiment

A first embodiment is to be described with reference to FIGS. 1 to 8. As shown in FIG. 1, a battery monitoring system 1 mainly includes a battery pack system 2 and is built in a vehicle 10. The vehicle 10 is a hybrid vehicle (HV), a plug-in hybrid vehicle (PHV), an electric vehicle (EV), or the like, and travels with assembled batteries 12 (see FIG. 2) of a mounted battery pack 11 as at least a part of a driving source.

The battery pack 11, a power control unit (hereinafter abbreviated as PCU) 14, a motor 15, and a host ECU 16 are mounted inside a vehicle body 13. The host ECU 16 is implemented as an electronic control device. The battery pack 11 may be disposed in an engine compartment of the vehicle body 13, or may be disposed under a seat of an occupant, for example, a driver, around a frame of the vehicle body 13, or in a trunk room.

As shown in FIG. 2, the battery pack 11 includes a battery module 20 in which multiple battery cells 22 are grouped. The battery pack 11 includes multiple groups of battery modules 20. Many battery cells 22 are accommodated in the battery module 20 to constitute the assembled batteries 12. The assembled batteries 12 are used as the driving source of the vehicle 10 by storing electric power for driving the motor 15. The PCU 14 shown in FIG. 1 supplies electric power stored in the assembled batteries 12 of the battery pack 11 to the motor 15. During braking of the vehicle 10 or the like, the motor 15 returns regenerative electric power to the assembled batteries 12 of the battery pack 11, and the assembled batteries 12 are charged according to the electric power generated by the motor 15.

Structure of Battery Pack 11

Hereinafter, a structure example of the battery pack 11 is to be described with reference to FIGS. 2 to 4.

In FIG. 2, an inner wall of a housing 30 is indicated by two-dot chain lines. A longitudinal direction of the housing 30 is indicated as an X-direction, and a short direction thereof is indicated as a Y-direction. A vertical direction perpendicular to a mounting surface on the vehicle body 13 is referred to as a Z-direction. The X-direction, the Y-direction, and the Z-direction indicate an intersecting (for example, orthogonal) relationship to each other. The housing 30 includes a first wall surface 30*a* along the X-direction and a second wall surface 30*b* along the Y-direction. The housing 30 is formed in a flat or low-height rectangular box shape.

As shown in FIG. 2, the assembled batteries 12, multiple monitoring devices 40, and a control device 50 are accommodated in the housing 30 of the battery pack 11 over a planar direction along the X-direction and the Y-direction. The monitoring device 40 includes a battery monitoring unit 44 (see FIG. 5) that monitors a state of the assembled batteries 12 of the battery pack 11, and is referred to as a satellite battery module (SBM).

A lower surface of the housing 30 in the Z-direction serves as the mounting surface on the vehicle body 13. In the present embodiment, the X-direction is a left-right direction of the vehicle 10, the Y-direction is a front-rear direction of the vehicle 10, and the Z-direction is the vertical direction of the vehicle 10. Dispositions in FIGS. 2 to 4 are merely examples. A direction of mounting the battery pack 11 on the vehicle body 13 is an example, and the battery pack 11 may be disposed in any manner with respect to the vehicle 10.

The assembled batteries 12 include multiple battery modules 20 disposed side by side in the X-direction, and the multiple battery modules 20 are disposed side by side in the X-direction. The battery module 20 may be referred to as a cell stack, a battery block, or the like. The assembled batteries 12 may be implemented by connecting multiple battery modules 20 in series and/or in parallel. However, the present embodiment shows an example in which the multiple battery modules 20 are connected in series.

Each battery module 20 includes multiple battery cells 22 each having a rectangular box shape. The battery module 20 includes multiple battery cells 22 as a group. The battery module 20 includes multiple battery cells 22 disposed side by side in the Y-direction. Each of the multiple battery cells 22 is accommodated in a battery case (not illustrated). Accordingly, relative positions of the multiple battery cells 22 are fixed. The battery case is made of metal or resin. When the battery case is made of metal and formed in a rectangular box shape, an electrically insulating member is entirely interposed between a wall surface of the battery case and the battery cells 22. An insulating member may be partially interposed between the wall surface of the battery case and the battery cells 22.

The battery module 20 includes multiple battery cells 22 connected in series. The battery module 20 in the present embodiment is implemented by connecting multiple battery cells 22 disposed side by side in the Y-direction in series. The assembled batteries 12 provide a DC voltage source.

The battery cell 22 is a secondary battery that generates an electromotive voltage by a chemical reaction. As the secondary battery, a lithium ion secondary battery, a nickel-hydrogen secondary battery, an organic radical battery, or the like can be adopted. The lithium ion secondary battery is a secondary battery using lithium as a charge support. The secondary battery that can be used for the battery cell 22 may include a so-called all solid-state battery using a solid electrolyte in addition to a secondary battery in which an electrolyte is liquid.

Figure 3:
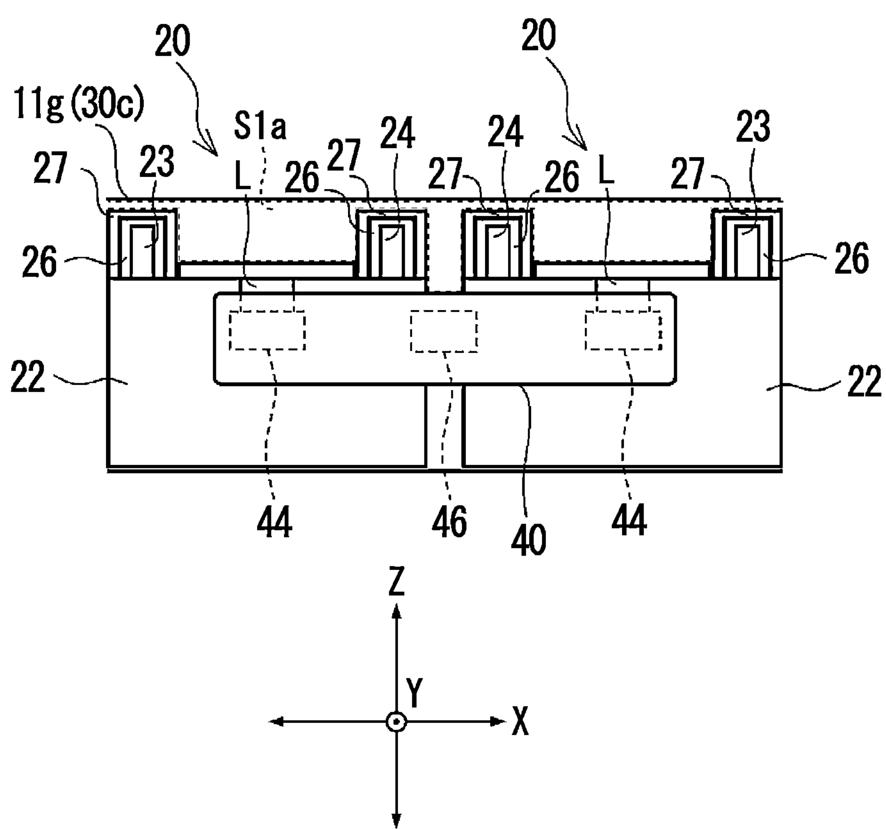
FIG. 3 is a side view schematically showing the structure of the battery pack.
Figure 4:
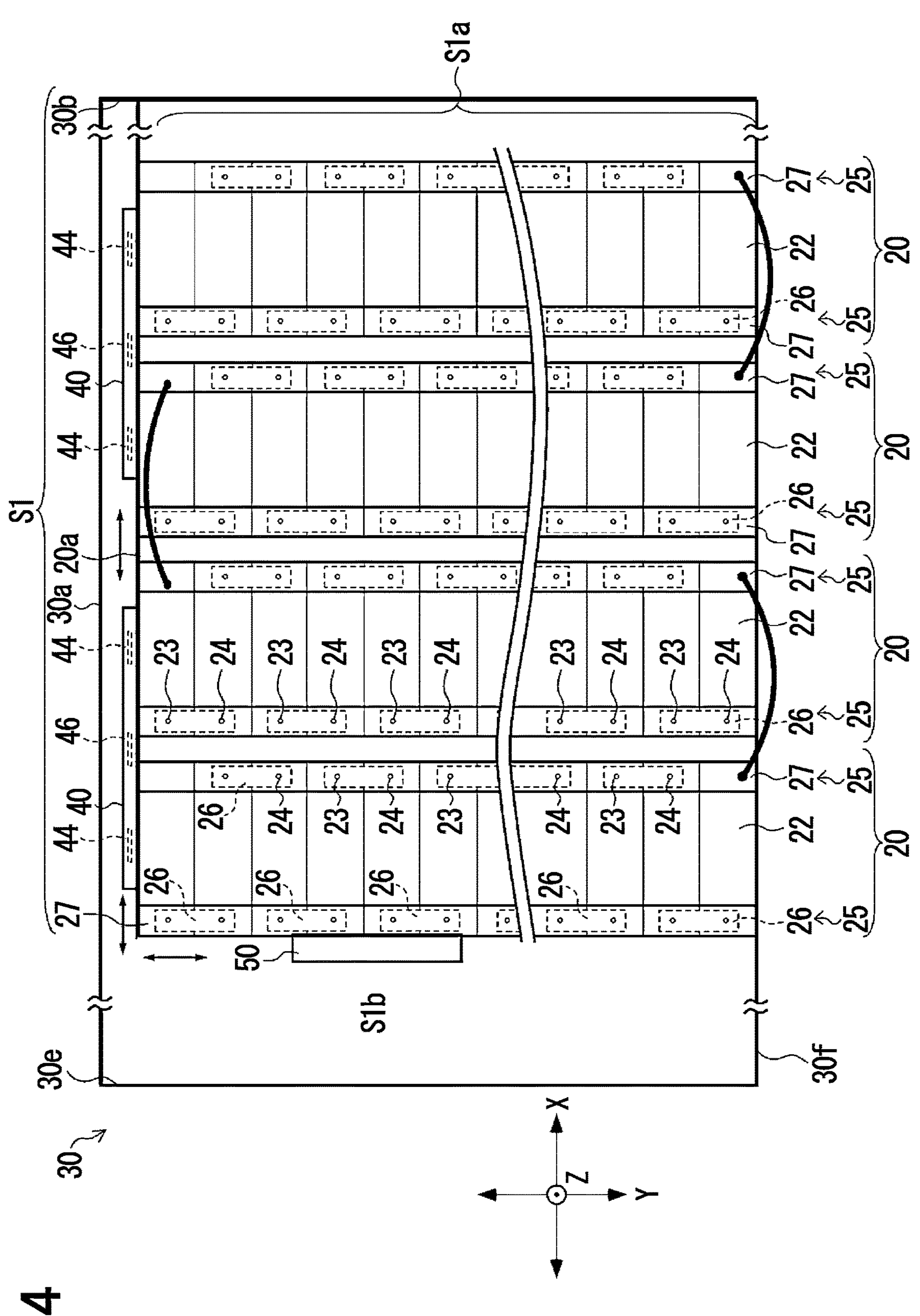
FIG. 4 is a top view schematically showing the structure of the battery pack.

As shown in FIGS. 2 to 4, the battery cells 22 are stacked such that side surfaces of the battery case are in contact with each other in the Y-direction. The battery cell 22 has a positive electrode terminal 23 and a negative electrode terminal 24 located at both ends in the X-direction and protruding in the Z-direction, more specifically, in a Z+ direction indicating an upper side. As shown in FIG. 3, protruding end surfaces of the positive electrode terminal 23 and the negative electrode terminal 24 are disposed at the same height in the Z-direction in the battery cell 22. As shown in FIG. 4, the battery cells 22 are stacked such that the positive electrode terminal 23 and the negative electrode terminal 24 are alternately disposed in the Y-direction.

As shown in FIG. 4, a pair of linear busbar units 25 are disposed at both ends in the X-direction on an upper surface of the battery module 20. The busbar units 25 are disposed at both ends in the X-direction on the protruding end surfaces of the positive electrode terminals 23 and the negative electrode terminals 24 of multiple battery cases.

As shown in FIGS. 3 and 4, each busbar unit 25 includes multiple busbars 26 that electrically connect the positive electrode terminals 23 and the negative electrode terminals 24 disposed alternately in the Y-direction, and busbar covers 27 that cover the multiple busbars 26. The busbar 26 is a plate member made of metal having good conductivity such as copper or aluminum. The busbar 26 electrically connects the positive electrode terminal 23 and the negative electrode terminal 24 of the battery cells 22 adjacent to each other in the Y-direction. Accordingly, multiple battery cells 22 are connected in series in the battery module 20.

The battery module 20 is implemented by disposing multiple battery cells 22 side by side in the Y-direction. As shown in FIGS. 3 and 4, the busbar covers 27 are disposed along the Y-direction to cover the positive electrode terminals 23 and the negative electrode terminals 24 of the multiple battery cells 22 of the battery module 20. As shown in FIG. 3, the busbar covers 27 are disposed at both ends of the battery cells 22 in the X-direction, and protrude upward from upper surfaces of the battery cells 22. As shown in FIG. 3, a space S1*a* is surrounded by a top surface 11*g* of the battery pack 11, that is, an upper inner surface 30*c* of the housing 30, inner side surfaces of the busbar cover 27, and the upper surface of the battery cell 22. The space Sla is located below the upper inner surface 30*c* of the housing 30 and communicates in the X-direction. The space Sla is provided as a propagation path for an electromagnetic wave.

An electrical connection state of a certain battery module 20 is to be described with reference to FIG. 4. In the certain battery module 20, one end portion of a certain first battery cell 22 in the X-direction serves as a positive electrode, and the other end portion serves as a negative electrode. The positive electrode terminal 23 is connected to the positive electrode of the battery cell 22. The negative electrode terminal 24 is connected to the negative electrode of the battery cell 22. A second battery cell 22 is disposed on a side portion of the first battery cell 22 in the Y-direction. In the second battery cell 22, positions of a positive electrode and a negative electrode in the X-direction are opposite to those in the first battery cell 22. The negative electrode terminal 24 of the first battery cell 22 is connected to the positive electrode terminal 23 of the second battery cell 22 by the busbar 26.

Further, a third battery cell 22 is disposed on a side portion of the second battery cell 22 in the Y-direction. In the third battery cell 22, positions of a positive electrode and a negative electrode in the X-direction are opposite to those in the second battery cell 22. The negative electrode terminal 24 of the second battery cell 22 and the positive electrode terminal 23 of the third battery cell 22 are connected by the busbar 26. Thus, many battery cells 22 are disposed side by side in the Y-direction while changing positions of positive electrodes and negative electrodes in the X-direction, and the positive electrode terminal 23 and the negative electrode terminal 24 are connected to the busbar 26. Accordingly, the battery cells 22 of the battery module 20 are electrically connected in series.

In the battery module 20, one of the two battery cells 22 located at an end portion of multiple battery cells 22 disposed side by side in the Y-direction has the highest potential and the other has the lowest potential. A wire 20*w* shown in FIG. 2 is connected to at least one of the positive electrode terminal 23 of the potential battery cell 22 with the highest potential and the negative electrode terminal 24 of the potential battery cell 22 with the lowest potential.

As shown in FIGS. 2 to 4, the positive electrode terminal 23 of the battery cell 22 with the highest potential in one of two battery modules 20 adjacent to each other in the X-direction and the negative electrode terminal 24 of the battery cell 22 with the lowest potential in the other battery module 20 are connected via the wire 20*w*. Accordingly, the multiple battery modules 20 are electrically connected in series.

One of two battery modules 20 located at an end portion of multiple battery modules 20 disposed side by side in the X-direction is on the highest potential side, and the other is on the lowest potential side. In the battery module 20 on the highest potential side, an output terminal is connected to the positive electrode terminal 23 of the battery cell 22 with the highest potential among the multiple battery cells 22.

In the battery module 20 on the lowest potential side, an output terminal is connected to the negative electrode terminal 24 of the battery cell 22 with the lowest potential among the multiple battery cells 22. The two output terminals are connected to electrical equipment such as the PCU 14 mounted on the vehicle 10. The positive electrode terminal 23 and the negative electrode terminal 24 may or may not partially face each other in the X-direction.

Two battery modules 20 adjacent to each other in the X-direction may not be electrically connected via the wire 20*w*, and any two of multiple battery modules 20 may be electrically connected via the wire 20*w*.

The busbar covers 27 shown in FIGS. 3 and 4 are provided using an electric insulating material such as resin. The busbar covers 27 are provided linearly from an end to an end of the battery module 20 along the Y-direction to cover the multiple busbars 26. The busbar covers 27 may have a partition wall. By providing the partition wall, it is possible to enhance insulation between two busbars 26 adjacent to each other in the Y-direction.

As shown in FIG. 2, one monitoring device 40 is provided for two battery modules 20 adjacent to each other in the X-direction among the multiple battery modules 20. A mode is shown in which the monitoring device 40 is provided for each pair of adjacent battery modules 20. However, the monitoring device 40 may be provided for each battery module 20 as shown in an embodiment to be described later, or may be provided for three or more battery modules 20.

The monitoring device 40 is provided on an inner side of the first wall surface 30*a* of the housing 30 along an extension direction (X-direction) of the first wall surface 30*a*, and is disposed across the two battery modules 20 along the X-direction. Multiple monitoring devices 40 are located at one end portion of the battery module 20 in the Y-direction and are disposed side by side in the X-direction. The monitoring device 40 is provided on the inner side of the first wall surface 30*a* of the housing 30 along the X-direction. The multiple monitoring devices 40 are disposed at the same position in the Y-direction.

In a structure shown in FIG. 2, the multiple monitoring devices 40 are disposed side by side at one end portion of the battery module 20 in the Y-direction. However, the invention is not limited to the structure. For example, the multiple monitoring devices 40 may be disposed alternately at one end portion or the other end portion for every two battery modules 20 in the Y-direction, or may not be disposed alternately regularly.

The monitoring device 40 is fitted into, for example, a recess provided in the battery module 20, and is fixed with a screw. A method for fixing the monitoring device 40 is not limited to the method. For example, the monitoring device 40 may be fixed to the battery module 20 by performing thermal caulking in which bonding and crimping are performed by applying heat and pressing. The monitoring device 40 may be fixed to the battery module 20 by a snap fit structure using elastic deformation of a metal or resin material.

When the monitoring device 40 is attached to the battery module 20, external dimensions of the monitoring device 40 have a relationship of X-direction>Z-direction>Y-direction. A space S1 is provided around the monitoring device 40. The space S1 is a space partially surrounded by the first wall surface 30*a* and the second wall surface 30*b* of the housing 30 and a wall surface 20*a* of the battery module 20. The monitoring device 40 has the smallest thickness in the Y-direction in the XYZ directions. Even when the battery module 20 is implemented by disposing many battery cells 22 in the Y-direction and is configured to be wide in the Y-direction, the monitoring device 40 can be disposed in the space S1 that is local minimum in the Y-direction. Accordingly, it possible to effectively use the space S1 on the inner side of the first wall surface 30*a* of the housing 30.

The monitoring device 40 may be provided such that a disposition location is closer to an upper side in the Z-direction than a lower side in the Z-direction from a center of a height of the battery cells 22 on the wall surface 20*a* of the battery module 20. As long as most of the monitoring device 40 is disposed above the center of the height of the battery cell 22, another portion thereof may be disposed below the center of the height of the battery cell 22. In other words, the monitoring device 40 is preferably provided such that a region disposed above the height center of the battery cell 22 is larger than a region disposed below. At this time, for example, the monitoring device 40 can be easily disposed from an upper side of the battery module 20, and ease of assembly when disposing the monitoring device 40 on the battery module 20 can be improved.

As shown in FIG. 2, the control device 50 is attached to an outer end surface of the battery module 20 in the X-direction located at an end portion of all the battery modules 20 in the X-direction. As shown in FIG. 5, the monitoring device 40 includes an antenna 49, the control device 50 includes an antenna 57, and the control device 50 and the multiple monitoring devices 40 are wirelessly connected.

If a structure for connecting the control device 50 to the monitoring device 40 by wire is adopted, it is necessary to connect a harness between the monitoring device 40 and the control device 50. For example, when an operator extends a harness to the space S1 on the inner side of the first wall surface 30*a* of the housing 30 to connect the monitoring device 40 and the control device 50, the ease of assembly is poor, and many steps are required. In this regard, since the monitoring device 40 and the control device 50 are configured to be wirelessly connected, even when the monitoring device 40 is disposed in the local minimum space S1, the monitoring device 40 can be disposed without deteriorating the ease of assembly.

A fixing member for fixing the monitoring device 40 to the battery module 20 may be made of, for example, a non-magnetic material. Accordingly, performance of wireless communication can be improved. A component provided in the battery module 20 may be made of a non-magnetic material, especially when the component does not require magnetism in characteristics.

The monitoring device 40 is fixed to an end surface of the battery module 20 in the Y-direction. As shown in FIGS. 2 and 3, a detection line L is connected to the monitoring device 40. The detection line L is implemented for each battery module 20. The detection line L extends in an upward direction from an upper portion of the monitoring device 40 and is bent at an end portion of the battery module 20, and extends across upper surfaces of the multiple battery cells 22 in the Y-direction. The detection line L indicates a harness for detecting a voltage between the positive electrode terminal 23 and the negative electrode terminal 24 of the battery cell 22.

The detection line L is configured to extend in the Y-direction along the upper surfaces of the multiple battery cells 22 constituting one battery module 20. The detection line L is formed between the busbar covers 27 formed at both the ends of the battery cell 22 in the X-direction. The detection line L is electrically connected to the positive electrode terminal 23 and the negative electrode terminal 24 of the battery cell 22 by core lines (not illustrated) extending from an intermediate position extending in the Y-direction to both sides in the X-direction.

Description of Structure of Housing 30

The housing 30 has performance of reflecting electromagnetic waves, for example, in order to cope with EMC. EMC is an abbreviation of electromagnetic compatibility. The housing 30 includes a resin material and metal having magnetic properties for reflecting electromagnetic waves, that is, a magnetic material. The housing 30 may include a resin material, but a magnetic material may be configured to cover the resin material or may be configured to be embedded inside the resin material. The housing 30 may be formed of a resin material, but may be covered with a chassis of the vehicle 10 to cope with EMC. The housing 30 may include carbon fibers. The housing 30 may include a material having performance of absorbing electromagnetic waves instead of performance of reflecting electromagnetic waves.

The wall surface 20*a* (see FIGS. 2 and 4) located at one end of the multiple battery modules 20 in the Y-direction is configured to extend in the X-direction. It is preferable to cover the wall surface 20*a* with a reflecting member (for example, metal or a magnetic material having magnetic properties) for reflecting electromagnetic waves. The space S1 located on the inner side of the first wall surface 30*a* of the housing 30 is, for example, a space whose vertical and horizontal dimensions in the YZ directions are about several mm to several cm to several tens of cm.

As described above, the space S1 is partially surrounded by the wall surface 20*a* of the battery module 20 and the first wall surface 30*a*, a lower inner surface 30*d*, the upper inner surface 30*c*, and the second wall surface 30*b* of the housing 30. The space S1 is a space that is partially closed by the metal serving as the reflecting member and is open only at one space S1*b* in the X-direction in which the control device 50 is disposed (the third wall surface 30*e* in the left direction in FIG. 4).

The multiple monitoring devices 40 are disposed periodically (for example, at equal intervals) in the X-direction in the space S1. When the space S1 is covered with metal, the space S1 constitutes a waveguide space similar to a so-called rectangular waveguide. As shown in FIG. 4, the housing 30 constitutes a closed space by the first wall surface 30*a*, the second wall surface 30*b*, the third wall surface 30*e*, and a fourth wall surface 30*f* in a plan view.

The first wall surface 30*a* faces the fourth wall surface 30*f*. The second wall surface 30*b* faces the third wall surface 30*e*. At this time, a propagation space for the electromagnetic wave when the control device 50 and the monitoring device 40 perform wireless communication is L-shaped in the plan view. A wireless electromagnetic wave emitted by the control device 50 is reflected by the first wall surface 30*a* and propagated to the space S1, and is reflected by the third wall surface 30*e*, propagated to the space S1, and reaches the monitoring device 40.

A wireless electromagnetic wave emitted by the monitoring device 40 propagates in the space S1 and is reflected on the first wall surface 30*a*, and reaches the control device 50, and propagates in the space S1, is reflected on the third wall surface 30*e*, and reaches the control device 50. Accordingly, when the control device 50 and the monitoring device 40 perform wireless communication, a radio wave propagates through an L-shaped propagation path including the space S1.

In the present embodiment, the propagation path for the electromagnetic wave when the control device 50 and the monitoring device 40 perform wireless communication also includes the space Sla shown in FIG. 3. The space Sla is sandwiched between the busbar covers 27 disposed at both the ends of the battery cell 22 in the X-direction and surrounded by the top surface 11*g* of the battery pack 11, that is, the upper inner surface 30*c* of the housing 30 and the upper surface of the battery cell 22. The space Sla is provided below the upper inner surface 30*c* of the housing 30 with a gap therebetween.

The space S1*a* communicates in the X-direction along a lower side of the upper inner surface 30*c* of the housing 30. The space Sla communicates in the X-direction to the space S1*b* in which the control device 50 is disposed. As described above, the spaces S1*a* and S1*b* can be used as propagation paths for wireless electromagnetic waves between the control device 50 and the monitoring device 40. Therefore, many communication paths can be ensured in addition to the above-described L-shaped propagation path.

The housing 30 has a hole communicating with an accommodation space of the battery pack 11 and a space outside the accommodation space. The hole is used for ventilation, energization of a power line and a signal line, and the like. In the case of a configuration having the hole, a covering portion (not illustrated) that covers the hole may be provided. The covering portion is formed of, for example, a connector, an electromagnetic shielding member, or a seal member, and closes a part or all of the hole between the accommodation space of the battery pack 11 and the space outside the accommodation space.

The covering portion includes, for example, a metal material having magnetic properties. The covering portion may include a resin material, but a magnetic material may be configured to cover the resin material or may be configured to be embedded inside the resin material. The covering portion may include carbon fibers.

The hole of the housing 30 may be covered with an element accommodated in the accommodation space of the housing 30 without providing a separate covering portion. The power line and the signal line may be disposed across the accommodation space and the external space in a state of being held by an electric insulation member that forms a part of the wall portion of the housing 30.

Modification of Disposition Mode of Multiple Monitoring Devices 40 and Control Device 50

An attachment structure of the multiple monitoring devices 40 and the control device 50 is not limited to the structure shown in FIG. 2. For example, the multiple monitoring devices 40 may be attached to the multiple battery modules 20 inside the housing 30, but the control device 50 may be attached to an outer side surface of the housing 30.

For example, an attachment structure may be adopted in which the wall surface of the housing 30 is provided in a region where the monitoring device 40 and the control device 50 face each other. In this case, although a propagation environment for a radio wave between the monitoring device 40 and the control device 50 is deteriorated as compared with the attachment structure shown in FIG. 2, it is sufficient that the monitoring device 40 and the control device 50 are capable of executing communication processing with each other. For example, the wall surface of the housing 30 on which the control device 50 is provided may be formed of resin through which a radio wave passes. An opening may be formed in the wall surface of the housing 30. The control device 50 may be disposed in a manner of closing the opening.

The antenna 49 in the monitoring device 40 may overlap the busbar unit 25 in the XY directions, that is, protrude further than the busbar unit 25 in the Z-direction. The antenna 57 of the control device 50 may protrude further than the busbar unit 25 in the Z-direction. It is preferable that the antenna 57 connected to the control device 50 is disposed at the same height in the Z-direction as the antenna 49 of the monitoring device 40, for example. A disposition relationship between the antennas 49 and 57 is not limited to the relationship.

Modification of Disposition Structure of Battery Module 20

In the present embodiment, a mode is shown in which multiple battery modules 20 in which multiple battery cells 22 are packed are prepared, and the battery modules 20 are directly accommodated in the housing 30. However, the invention may also be applied to a structure without a so-called battery module. For example, battery modularization of the battery cells 22 may be omitted, and the multiple battery cells 22 may be directly accommodated in the battery pack 11 according to a so-called "Cell to Pack" arrangement. "Cell to Pack" is abbreviated as "CTP".

The battery module 20 may be directly accommodated in a frame or a platform of the vehicle 10 according to a so-called "Module to Platform" arrangement. "Module to Platform" is abbreviated as "MTP". When the battery cells 22 are directly packed in a chassis of the vehicle 10, the battery cells 22 may be mounted in the chassis as a part of the vehicle body structure according to a so-called "Cell to Chassis" arrangement. "Cell to Chassis" is abbreviated as "CTC".

Description of Configurations of PCU 14, Motor 15, and Host ECU 16

The host ECU 16 and the control device 50 may be implemented by integrating a part or the whole thereof or may be provided separately. The PCU 14 shown in FIG. 1 executes bidirectional electric power conversion between the battery pack 11 and the motor 15 in accordance with a control signal from the host ECU 16. The PCU 14 includes, for example, an inverter that drives the motor 15, and a converter that boosts a DC voltage supplied to the inverter to be equal to or larger than an output voltage of the battery pack 11.

The motor 15 is an alternating current rotary electric machine, for example, a three-phase AC synchronous motor in which a permanent magnet is embedded in a rotor. The motor 15 is driven by the PCU 14 to generate a rotational driving force, and the driving force generated by the motor 15 is transmitted to driving wheels. Meanwhile, during braking of the vehicle 10, the motor 15 operates as a generator and performs regenerative power generation. Electric power generated by the motor 15 is supplied to the battery pack 11 through the PCU 14 and stored in the assembled batteries 12 of the battery pack 11.

The host ECU 16 includes a CPU, memories such as a ROM, a RAM, and a non-volatile semiconductor storage device, input-output ports for inputting and outputting various signals, and the like. A processing program executed by the host ECU 16 is written in the memory. The CPU executes the program stored in the memory. The memory is used as a non-transitory tangible storage medium. The control device 50 receives information on a cell voltage of the battery cell 22 of the assembled batteries 12 from the monitoring device 40 of the battery pack 11, measures a state of charge (SOC), and controls the PCU 14 to control driving of the motor 15 and charging and discharging of the battery pack 11.

A current sensor 17 (see FIG. 5) is connected in series to the assembled batteries 12. Accordingly, a current flowing through the entire assembled batteries 12 can be measured by the current sensor 17. As shown in FIG. 5, the current sensor 17 is connected to the control device 50. The host ECU 16 is capable of acquiring information on a current flowing through the assembled batteries 12 or the battery cell 22 from the current sensor 17 through the monitoring device 40 and the control device 50.

A mode is shown in which the current sensor 17 is connected to the control device 50. However, the current sensor 17 may be connected to the host ECU 16. The control device 50 and the host ECU 16 can be communicably connected. Therefore, the information on the current flowing through the assembled batteries 12 can be shared regardless of which configuration acquires the current information of the current sensor 17.

Hereinafter, electrical block configurations of the monitoring device 40 and the control device 50 are to be described.

Electrical Block Configuration Example of Monitoring Device 40

As shown in FIG. 5, the monitoring device 40 includes power supply circuits 41 to 43, the battery monitoring unit 44, a microcomputer 45, a wireless communication unit 46, a selection circuit 47, a matching circuit 48, and the antenna 49. The power supply circuit 41 of the monitoring device 40 generates an operating voltage using a voltage supplied from the battery module 20, supplies the generated voltage to the power supply circuits 42 and 43, and supplies the generated voltage to the battery monitoring unit 44.

The power supply circuit 41 includes a rectifier unit **41*a* and a start circuit 41*b*. The rectifier unit 41*a* receives power supply from the battery module 20 serving as a power supply unit, rectifies and smooths the power supply, and generates DC power supply. The start circuit 41*b* receives the DC power supply rectified and smoothed by the rectifier unit 41*a*, and generates a start signal for starting a part or the whole of the monitoring device 40**.

It is desirable that the start circuit **41*b* receives power supply only from the battery module 20**, which serves as one or more power supply units connected by wire, at the time of a startup. That is, it is desirable to receive power supply by wire, and it is desirable not to receive power supply wirelessly. Security can be easily ensured by receiving power supply by wire and starting up.

If a startup is performed from an outside via wireless communication, diffused reflection may occur inside the housing 30, and start of the battery monitoring unit 44 is delayed. As a result, a monitoring schedule of the assembled batteries 12 may not be managed by the battery monitoring unit 44. By starting the power supply in a wired manner, a wireless sequence for starting the power supply can be eliminated, and schedule management of battery monitoring can be facilitated.

The start circuit **41*b* starts some or all of the battery monitoring unit 44, the microcomputer 45, and the wireless communication unit 46. As shown in S30 in FIG. 7, a monitoring IC constituting the battery monitoring unit 44 is preferably started when or before a wireless communication unit 54 of the control device 50 (a "control-device-side communication unit") and the wireless communication unit 46 of the monitoring device (a "monitoring-device-side communication unit") are synchronized. In the present embodiment, a mode is shown in which the start circuit 41*b* is provided in the power supply circuit 41. However, the start circuit 41*b* may also be provided in the wireless communication unit 46**, as to be described in the embodiment below.

The power supply circuit 42 generates an operating voltage from the output of the power supply circuit 41 and supplies the generated voltage to the microcomputer 45. The power supply circuit 43 generates an operating voltage from the output of the power supply circuit 41 and supplies the generated voltage to the wireless communication unit 46.

The selection circuit 47 of the monitoring device 40 receives, as battery information, a cell temperature signal from a temperature sensor (not illustrated) that measures a temperature of the battery cell 22 and a cell determination signal that determines a type of the battery cell 22, selects the battery information, and inputs the battery information to the battery monitoring unit 44. The battery monitoring unit

44 of the monitoring device 40 senses battery information on a cell voltage, a cell temperature, cell determination, and the like of the battery cell 22.

The battery monitoring unit 44 includes a monitoring unit 44*a* that acquires battery information on the battery cell 22 of the assembled batteries 12, a conversion unit 44*b* that converts an analogue value of the battery information input through the selection circuit 47 into a digital value and outputs the digital value, and a storage unit 44*c* that stores the digital value of the battery information. The monitoring unit 44*a* includes one or more monitoring ICs. When the battery monitoring unit 44 includes multiple monitoring ICs, the battery cells 22 that are in charge of acquiring battery information are determined in advance. The storage unit 44*c* is implemented by a register or the like. The battery monitoring unit 44 sequentially stores the battery information on the battery cells 22 in the storage unit 44*c*, and erases battery information as necessary to ensure memory capacity.

The battery monitoring unit 44 stores, in a storage unit 46*a* of the wireless communication unit 46 through the microcomputer 45, the battery information, for example, cell voltage information, battery temperature information, and determination information on the battery cell 22 as battery monitoring information. The battery monitoring unit 44 executes failure diagnosis on a circuit portion of the monitoring device 40, monitors failure diagnosis information, and stores the failure diagnosis information as battery information in the storage unit 46*a* of the wireless communication unit 46 through the microcomputer 45.

The microcomputer 45 of the monitoring device 40 receives the battery information input from the battery monitoring unit 44 and transmits the battery information to the wireless communication unit 46. The microcomputer 45 is a control circuit having a function of controlling an acquisition schedule of battery information and the like of the battery monitoring unit 44.

The wireless communication unit 46 includes the storage unit 46*a* and wirelessly transmits information stored in the storage unit 46*a* to the wireless communication unit 54 of the control device 50. When the wireless communication unit 46 of the monitoring device 40 receives the battery information from the microcomputer 45, the wireless communication unit 46 stores the battery information in the storage unit 46*a* and transmits the battery information to the master control device 50. The wireless communication unit 46 transmits information to the wireless communication unit 54 of the control device 50, and the battery information from the wireless communication unit 54 of the control device 50 is stored in the storage unit 46*a*. The wireless communication unit 46 indicates a communication device that controls a communication data size, a communication format, a schedule, error detection, and the like between the monitoring device 40 and the control device 50.

A predetermined frequency region is allocated as a band in which wireless communication with the wireless communication units 54 and 46 is possible. Multiple usable frequency bands obtained by frequency-dividing the predetermined frequency region are divided for each channel. The multiple channels are divided into a first channel group in a non-battery information communication frequency band and a second channel group in a battery information communication frequency band. Each of the first channel group and the second channel group includes one or more channels. Although both the first channel group and the second channel group can communicate both battery information and non-battery information, the second channel group is mainly used for communicating battery information, and the first channel group is mainly used for communicating information other than battery information.

The wireless communication unit 54 of the control device 50 and the wireless communication unit 46 of the monitoring device 40 perform digital modulation on the single carrier wave using a predetermined digital modulation system in the usable frequency band for each channel in the first channel group or the second channel group to communicate information. The predetermined digital modulation system is based on, for example, a frequency modulation system, but other various modulation systems such as amplitude modulation and phase modulation may be applied.

The wireless communication unit 54 of the control device 50 and the wireless communication unit 46 of the monitoring device 40 are capable of changing a communication speed of each piece of information between the wireless communication units 54 and 46 stepwise to two or more by changing the modulation speed of the predetermined digital modulation system. In the present embodiment, in particular, the communication speed of various types of information such as non-battery information and battery information transmitted from the wireless communication unit 46 of the monitoring device 40 to the wireless communication unit 54 of the control device 50 can be changed stepwise. The communication speed indicates a data transfer amount per unit time assuming that an error rate is constant.

In the present embodiment, a mode is described in which communication is performed at a relatively high communication speed in the second channel group in the battery information communication frequency band allocated in advance, and communication is performed at a relatively low communication speed in the first channel group in the non-battery information communication frequency band allocated in advance. That is, a mode in which communication is performed at two-stage communication speeds is described. In the description of the present embodiment and other embodiments, a mode in which the modulation speed is changed in two stages and the communication speed is changed in two stages is described. However, the invention may be applied to a mode in which the modulation speed is changed in three or more stages and the communication speed is changed in three or more stages.

In a storage unit 54*a* of the wireless communication unit 54 and the storage unit 46*a* of the wireless communication unit 46 of the monitoring device 40, it is stored in advance that, when high-speed communication is performed in the second channel group in the battery information communication frequency band, digital modulation and demodulation is performed at a relatively high predetermined modulation speed. When low-speed communication is performed in the first channel group in the non-battery information frequency band, it is stored in advance that digital modulation and demodulation are performed at a relatively low predetermined modulation speed.

Therefore, the wireless communication unit 54 of the control device 50 communicates with the wireless communication unit 46 of the monitoring device 40 at a low speed when communicating on a channel in the first channel group, and communicates at a high speed when communicating on a channel in the second channel group.

The matching circuit 48 and the antenna 49 of the monitoring device 40 represent a physical interface for converting an output signal of the wireless communication unit 46 into a radio wave, radiating the radio wave to a space, receiving the radio wave propagated in the space, and inputting the radio wave to the wireless communication unit 46.

The microcomputer 45 described above may not be mounted, and in this case, the wireless communication unit 46 and the battery monitoring unit 44 may directly communicate with each other. The wireless communication unit 46 of the monitoring device 40 may manage an acquisition schedule or a transmission schedule of battery monitoring information and failure diagnosis information of the battery monitoring unit 44.

Specific Configuration Example of Control Device 50

The control device 50 includes power supply circuits 51 and 52, a main microcomputer 53, the wireless communication unit 54, a sub-microcomputer 55, a matching circuit 56, and the antenna 57. The power supply circuit 51 of the control device 50 generates an operating voltage using a voltage supplied from an accessory battery 60, and supplies the operating voltage to the power supply circuit 52 and the main microcomputer 53. The power supply circuit 52 generates an operating voltage using the output of the power supply circuit 51 and supplies the operating voltage to the wireless communication unit 54.

The matching circuit 56 and the antenna 57 of the control device 50 represent a physical interface for converting a signal output from the wireless communication unit 54 into a radio wave, radiating the radio wave to a space, receiving the radio wave propagated in the space, and inputting the radio wave to the wireless communication unit 54.

The wireless communication unit 54 of the control device 50 receives, as battery information, the battery monitoring information, or the failure diagnosis information from the wireless communication unit 46 of the monitoring device 40, and transmits the information to the main microcomputer 53 of the control device 50. The control-device-50-side wireless communication unit 54 receives data transmitted from the main microcomputer 53 and transmits the data to the wireless communication unit 46 of the monitoring device 40. The wireless communication unit 54 indicates a communication device that controls a communication data size, a communication format, a schedule, error detection, and the like between the monitoring device 40 and the control device 50.

The main microcomputer 53 of the control device 50 uses information such as a voltage and temperature of the battery cell 22 transmitted from the wireless communication unit 46 to calculate SOC and diagnostic information, which are state indicators of the battery cell 22, and transmits the information to the host ECU 16. The main microcomputer 53 performs switching control according to an on or off state of an ignition switch. The main microcomputer 53 has a function as an equalization control unit **53*a* for equalizing cell voltages of the battery cells 22**.

The main microcomputer 53 transmits information such as a control signal to the monitoring device 40 by wireless communication through the wireless communication units 46 and 54, and controls an operation state of the monitoring device 40. The sub-microcomputer 55 of the control device 50 monitors data between the wireless communication unit 54 and the main microcomputer 53, and monitors an operation state of the main microcomputer 53. The sub-microcomputer 55 may monitor an operation state of the wireless communication unit 54.

In the present embodiment, the control device 50 includes the sub-microcomputer 55, and the sub-microcomputer 55 monitors data between the wireless communication unit 54 and the main microcomputer 53, and monitors the operation state of the main microcomputer 53. However, a configuration of the control device 50 is not limited to such an example. For example, the control device 50 may not include the sub-microcomputer 55.

As described above, when the microcomputer 45 is not mounted on the monitoring device 40, the main microcomputer 53 of the control device 50 may manage the acquisition schedule of the battery monitoring information, the acquisition schedule of the failure diagnosis information, or a communication schedule of the battery monitoring unit 44, instead of the microcomputer 45.

In the present embodiment, the main microcomputer 53 of the control device 50 uses information such as a voltage and temperature of the battery cell 22 transmitted from the wireless communication unit 46 to calculate the SOC and the diagnostic information, which are the state indicators of the battery cell 22, and transmits the information to the host ECU 16. However, the calculation of the battery information is not limited to such an example.

For example, the microcomputer 45 of the monitoring device 40 may calculate the SOC, diagnostic information, or the like, which are the state indicators of the battery cell 22, using the battery information such as the voltage, temperature, or the like of the battery cell 22 acquired by the battery monitoring unit 44, and transmit a calculation result to the wireless communication unit 54 of the control device 50. In addition, the microcomputer 45 of the monitoring device 40 may perform abnormality diagnosis for the battery cell 22 or the battery monitoring unit 44 using the calculation result, and transmit a result of the abnormality diagnosis to the wireless communication unit 54 of the control device 50.

The battery information such as the voltage and temperature of the battery cell 22 acquired by the battery monitoring unit 44 of the monitoring device 40 may be calculated by the wireless communication unit 46 of the monitoring device 40. Further, the battery information such as the voltage and temperature of the battery cell 22 acquired by the battery monitoring unit 44 of the monitoring device 40 may be calculated by the wireless communication unit 54 of the control device 50. In addition, the microcomputer 45 of the monitoring device 40 may perform abnormality diagnosis for the battery cell 22 using the calculation result, or transmit the result of the abnormality diagnosis as the battery information to the wireless communication unit 54 of the control device 50.

Wireless Communication

Figure 6:
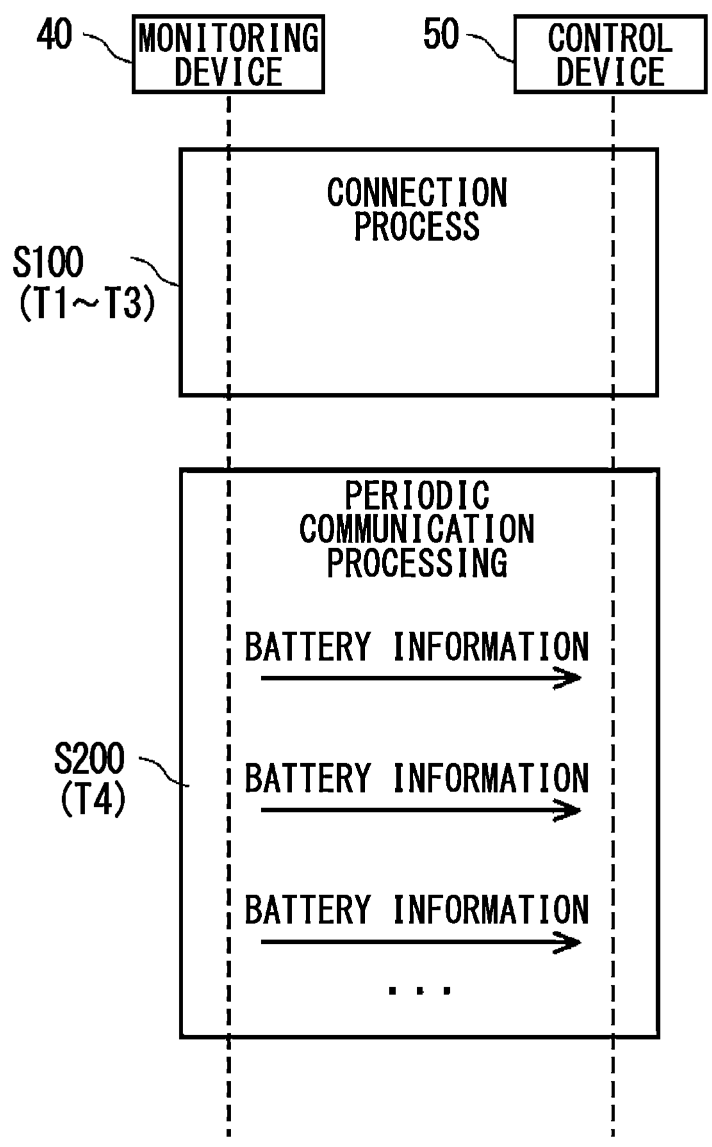
FIG. 6 is a sequence diagram (part 1) schematically showing a flow of communication.

Next, wireless communication processing between the monitoring device 40 and the control device 50 is to be described with reference to FIGS. 6 and 7. In the battery monitoring system 1 according to the present embodiment, multiple monitoring devices 40 centered around the control device 50 are network-connected in a star shape, and packet communication is possible. The control device 50 individually establishes communication with each of the multiple monitoring devices 40 and wirelessly communicates information.

When Vehicle 10 is Stopped

When the vehicle 10 is stopped, monitoring the assembled batteries 12 is less important than in a start state in which the vehicle 10 is started. This is because safety of traveling is not affected. It is preferable to change a quality of wireless communication according to a start state or a stop state of the vehicle 10. It is preferable that the monitoring device 40 performs communication at a lower speed when the vehicle 10 is in the stop state than when the vehicle 10 is in the start state. It is preferable to perform communication with a high success rate by reducing the communication speed. Accordingly, the number of times of retransmission due to communication failures can be reduced. As a result, it is possible to reduce discomfort of a user due to a delay in starting when the vehicle 10 is started.

When Vehicle 10 is Started

As shown in FIG. 8, when the vehicle 10 is started, the user operates the ignition switch from off to on, and at this time, a start signal is given to the control device 50. When the control device 50 is started, a connection process S100 (connection processes T1 to T3 to be described later) is executed between the control device 50 and all the monitoring devices 40. When the connection process S100 is successful, the control device 50 executes periodic communication processing S200 (periodic communication processing T4 to be described later) with the monitoring device 40 with which the connection is established.

In the periodic communication processing S200, the wireless communication unit 54 of the control device 50 forms a command in one or more packets for instructing the monitoring device 40 for which the connection process S100 is completed to acquire battery information, and transmits the command. At this time, the wireless communication unit 54 of the control device 50 transmits a command to the wireless communication units 46 of the multiple monitoring devices 40 by time-division unicast communication. The multiple monitoring devices 40 return the battery information to the wireless communication unit 54 of the control device 50 to respond to the command.

Details of Connection Process S100

The wireless communication unit 46 of the monitoring device 40 periodically transmits an advance notice detection request S21 and a continuous detection request S22 in the non-battery information communication frequency band while processing other tasks whose schedules are managed until a connection request S13 is received from the wireless communication unit 54 of the control device 50.

Figure 7:
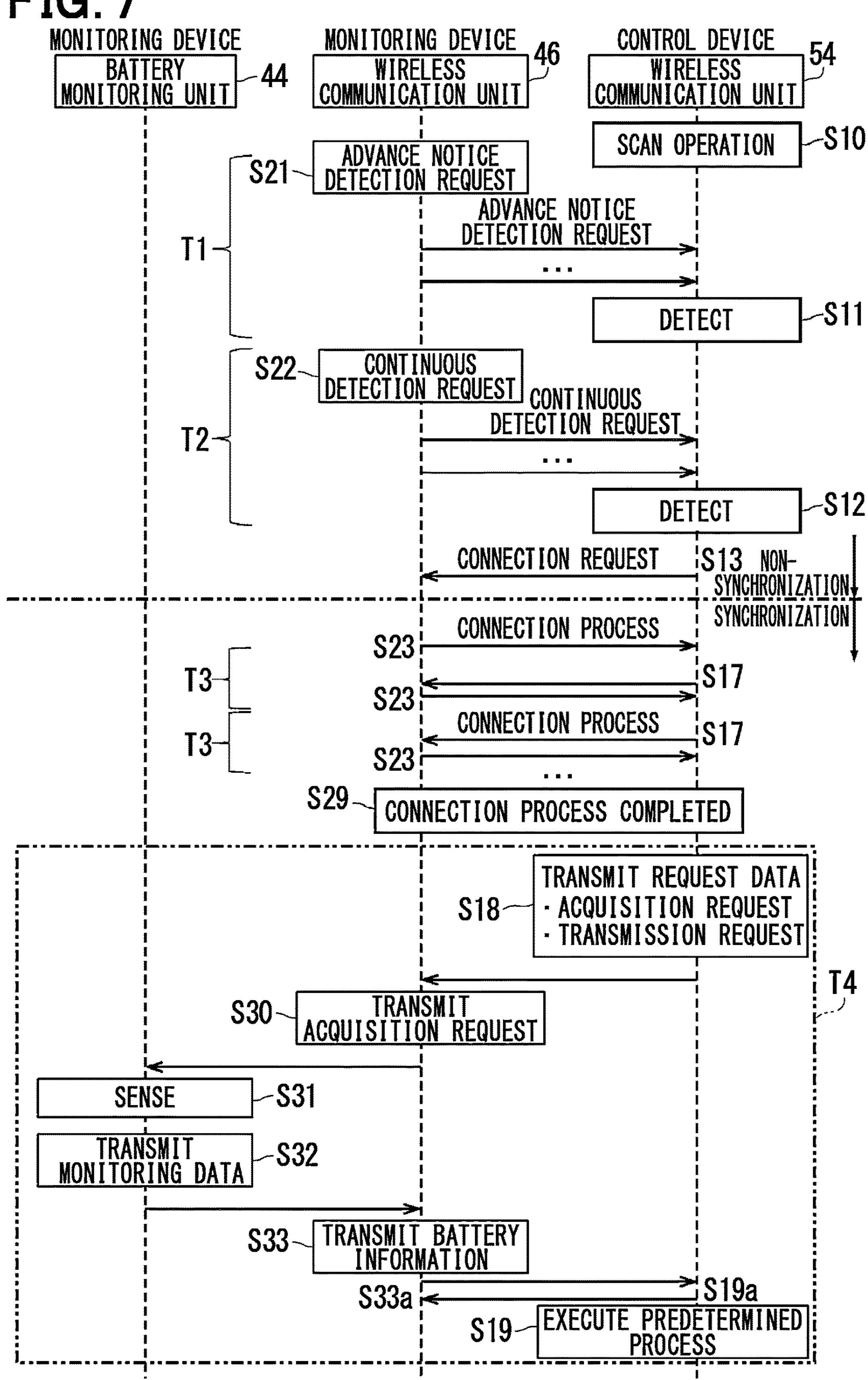
FIG. 7 is a sequence diagram (part 2) schematically showing the flow of communication.

The advance notice detection request S21 in the connection process T1 in FIGS. 7 and 8 indicates an understood command to notify the outside of presence of the wireless communication unit 46 of the monitoring device 40.

The advance notice detection request S21 includes transmission reservation timing information indicating a transmission timing of the continuous detection request S22 transmitted after transmission of the advance notice detection request S21. The transmission reservation timing information is data indicating that transmission is performed after a predetermined time. Therefore, the advance notice detection request S21 becomes an advance notice command for giving an advance notice of the transmission timing of the continuous detection request S22 to be described later. The wireless communication unit 46 of the monitoring device 40 continues to periodically transmit the advance notice detection request S21 and the continuous detection request S22 even when the ignition switch is off.

The advance notice detection request S21 continues to be periodically transmitted in a non-synchronization process in order to cause the wireless communication unit 54 of the control device 50 present in the vicinity to detect presence of the wireless communication unit 46. Since the wireless communication unit 46 of the monitoring device 40 continues to transmit the advance notice detection request S21 while a communication partner is not specified, it is difficult to establish a connection. Therefore, it is preferable that a communication speed when transmitting at least a part of a predetermined connection process in the connection process S100, for example, the initial advance notice detection request S21 in the connection process S100 is lower than a communication speed at the time of the periodic communication processing S200 of communicating battery information to be described later. It is desirable that the wireless communication unit 46 of the monitoring device 40 specifies a communication partner, establishes a connection, performs synchronization, and then performs high-speed communication. Accordingly, it is possible to implement communication of battery information having a large data amount, for example, communication suitable for properties of the periodic communication processing S200 and the connection process S100 having a small data amount.

As shown in the connection process T2 in FIGS. 7 and 8, the wireless communication unit 46 of the monitoring device 40 transmits the continuous detection request S22 at a timing indicated by the transmission reservation timing information that is in the advance notice detection request S21 and that is given an advance notice. The wireless communication unit 46 of the monitoring device 40 transmits the continuous detection request S22 at the timing when a transmission reservation timing time elapses, and processes another task whose schedule is managed, and waits for the connection request S13 from the monitoring device 40.

At this time, it is desirable that the wireless communication unit 46 of the monitoring device 40 transmits the continuous detection request S22 at a high speed through one or more channels in the second channel group in the battery information communication frequency band described above. The wireless communication unit 46 of the monitoring device 40 may transmit the continuous detection request S22 through one or more channels in the first channel group in the non-battery information communication frequency band. The wireless communication unit 46 of the monitoring device 40 preferably communicates at least the advance notice detection request S21 at a low speed. Reference is made to the connection process T2 in the continuous detection request S22 in FIG. 8.

Even when the wireless communication unit 46 of the monitoring device 40 does not receive the connection request S13 during a predetermined time from a transmission timing in the advance notice detection request S21 or a predetermined time from a transmission timing in the continuous detection request S22, the wireless communication unit 46 of the monitoring device 40 continues periodic transmission of the advance notice detection request S21 and the continuous detection request S22. Accordingly, the so-called non-synchronization process is continued.

On the other hand, the control device 50 maintains a sleep state and stops battery monitoring control while the ignition switch is off. When the ignition switch transitions to on, the control device 50 is started. Specifically, the control device 50 is started by receiving a signal indicating that the ignition switch is turned on from the host ECU 16 of the vehicle 10.

When the control device 50 is started, the wireless communication unit 54 of the control device 50 starts a scanning operation for a device that is present in a surrounding region (S10). The wireless communication unit 54 of the control device 50 is capable of scanning the advance notice detection request S21 if the advance notice detection request S21 is transmitted from the wireless communication unit 46 of the monitoring device 40. When the scan of the advance notice detection request S21 is successful, the control device 50 reads the transmission reservation timing information on the continuous detection request S22 in the advance notice detection request S21.

Accordingly, the wireless communication unit 54 of the control device 50 is capable of grasping in advance that the next continuous detection request S22 arrives from the wireless communication unit 46 of the monitoring device

40, and is capable of waiting at a timing when the wireless communication unit 46 of the monitoring device 40 transmits the continuous detection request S22. Thereafter, when the wireless communication unit 54 of the control device 50 successfully detects the continuous detection request S22, the wireless communication unit 54 transmits the connection request S13.

After transmitting the continuous detection request S22, the wireless communication unit 46 of the monitoring device 40 receives the connection request S13 corresponding to the continuous detection request S22. When the wireless communication unit 46 of the monitoring device 40 receives the connection request S13 from the wireless communication unit 54 of the control device 50, the connection process is considered successful. After the connection request S13 is received, a synchronization process of the connection process is started. The synchronization means processing of waiting until a response is received after a request is transmitted from either the wireless communication unit 54 of the control device 50 or the wireless communication unit 46 of the monitoring device 40. Reference is made to a continuous connection response S17 by the wireless communication unit 54 of the control device 50 shown in FIG. 7 and a continuous connection request S23 by the wireless communication unit 46 of the monitoring device 40.

After the wireless communication unit 46 of the monitoring device 40 receives the connection request S13, the wireless communication unit 46 of the monitoring device 40 stops the transmission of the advance notice detection request S21 and the continuous detection request S22. Upon receiving the connection request S13, the wireless communication unit 46 of the monitoring device 40 transmits the continuous connection request S23.

At least after the synchronization, it is preferable to set the communication speed to be higher than that in the non-synchronization process described above. The communication speed for the advance notice detection request S21 is preferably lower than that of the continuous connection request S23. Originally, it is desirable to perform high-speed communication of both the advance notice detection request S21 and the continuous connection request S23. However, since the one-sided broadcast communication is performed from the monitoring device 40 to the control device 50, reliability of the communication may decrease. Therefore, by setting the communication speed of the advance notice detection request S21 to be lower than that of the continuous connection request S23, it is possible to improve communication reliability when the connection process T1 and the connection process T2 are viewed as a whole.

The continuous connection request S23 includes information necessary for completing connection establishment before the periodic communication processing S200, for example, unique information, key information, and information for generating a key. The continuous connection request S23 may include a response to the connection request S13 in addition to information such as key information.

The wireless communication unit 46 of the monitoring device 40 sets a command of the continuous connection request S23 in a packet to perform synchronous communication with the wireless communication unit 54 of the control device 50, and receives the continuous connection response S17. By repeating the continuous connection request S23 and the continuous connection response S17, the connection process S100 can be completed. The wireless communication unit 46 of the monitoring device 40 and the wireless communication unit 54 of the control device 50 execute a pairing process based on the continuous connection request S23 and the continuous connection response S17 in the connection process S100 after the start of the synchronous communication.

The pairing process is a process for performing encrypted data communication. The pairing process includes a process of exchanging unique information, and unique information held by each other may be exchanged and stored in the storage units 46*a* and 54*a*. After execution of the process, encryption using the exchanged unique information becomes possible. The unique information is key information on a common key or information for generating a key. Accordingly, as shown in S29 in FIG. 7, the connection process S100 can be completed.

Details of Periodic Communication Processing S200

Upon completion of the connection process S100, the wireless communication units 46 and 54 execute the periodic communication processing S200. When proceeding to the periodic communication processing S200, both the control device 50 and the monitoring device 40 are switched to a battery control mode for controlling a battery state of the assembled batteries 12. The periodic communication processing S200 is executed using one or more specific channels in the second channel group in the battery information communication frequency band.

Specifically, the wireless communication unit 54 of the control device 50 first transmits an acquisition request and a transmission request S18 to the wireless communication unit 46 of the monitoring device 40 (S15). The wireless communication unit 46 of the monitoring device 40 transmits an acquisition request for battery information to the battery monitoring unit 44 (S24). The battery monitoring unit 44 senses the battery cell 22 of the assembled batteries 12 and acquires battery monitoring information such as a voltage of the battery cell 22 (S25). Upon acquiring the battery monitoring information, the battery monitoring unit 44 transmits the battery monitoring information as the battery information to the wireless communication unit 46 of the monitoring device 40 (S26). Upon receiving the battery information, the wireless communication unit 46 of the monitoring device 40 transmits the battery information to the wireless communication unit 54 of the control device 50 (S27).

When the main microcomputer 53 of the control device 50 receives the battery information from the wireless communication unit 54, the main microcomputer 53 determines whether the assembled batteries 12 are usable based on the battery information. If the battery pack 12 is not usable, the battery information is repeatedly acquired, and a determination process is repeated until the assembled batteries 12 become usable. For example, when the main microcomputer 53 of the control device 50 cannot acquire the battery information from the monitoring device 40 no matter how many times the process is executed, the main microcomputer 53 determines that the communication is abnormal and notifies the host ECU 16 of the communication abnormality. When the assembled batteries 12 become usable, the main microcomputer 53 of the control device 50 executes a predetermined process such as outputting a start permission of the vehicle 10 in S19.

The microcomputer 45 of the monitoring device 40 may determine whether the assembled batteries 12 are usable. In this case, for example, when the microcomputer 45 of the monitoring device 40 cannot acquire the battery information from the battery monitoring unit 44 no matter how many times the process is executed, the microcomputer 45 determines that the battery monitoring is abnormal, and notifies the control device 50 and the host ECU 16 through the wireless communication units 46 and 54. In such a case, thereafter, for example, a warning to notify a driver is output.

Upon confirming that the assembled batteries 12 are usable, the main microcomputer 53 of the control device 50, in the predetermined process of S19, permits start of a contactor that connects the battery pack 11 and a built-in electric load (not illustrated), or transmits a start permission signal for permitting start of the contactor to the host ECU 16 of the vehicle 10. The wireless communication unit 54 may determine whether the assembled batteries 12 are usable and execute the control. That is, the main microcomputer 53 of the control device 50 outputs the start permission signal for the vehicle 10 with the reception of the battery information as a trigger.

On the other hand, when the host ECU 16 receives the start permission signal, the host ECU 16 grasps that the assembled batteries 12 are in a normal state. The host ECU 16 also determines that the vehicle information received from another ECU or a sensor (not illustrated) mounted in the vehicle 10 satisfies a start condition as other conditions. When the host ECU 16 determines that the vehicle 10 can be started normally, the host ECU 16 starts the vehicle 10 and enables electric traveling. Accordingly, the vehicle 10 can travel safely.

In such periodic communication processing S200, it is desirable that the wireless communication unit 54 of the control device 50 allocates a time slot for receiving battery information for each of the multiple monitoring devices 40, and the wireless communication unit 46 of the monitoring device 40 allocates the battery information to the time slot and transmits the battery information at a speed higher than a communication speed when the connection process T1 associated with the advance notice detection request S21 is executed. At this time, it is preferable to change the communication speed at the time of transmitting the battery information to a high speed so as to fall within the time slot. The control device 50 includes schedule information around the monitoring device 40, for example, information on transmission and reception cycles, and it is preferable to allocate a time slot to each monitoring device 40 using the schedule information.

As a specific example, when the number of the monitoring devices 40 is n, the transmission and reception cycle is T, a time slot per monitoring device 40 in one cycle T is T/n [sec], the communication speed is x [Mbps], and a maximum data amount required for battery monitoring is D [Mbits], it is preferable to perform allocation to satisfy $D<x\times T/n$. It is preferable that D includes management data necessary for wireless communication. The time slot for one monitoring device 40 is set so that one or more transmission packets and reception packets can fall within the time slot. The time slot may be provided with a time margin in addition to the transmission packet and the reception packet, and it is preferable to provide the time margin as an idle time. A data length of the battery information may be adjusted in accordance with a length of a packet allocated to the time slot.

When the number of the battery modules 20 as monitoring targets increases, there is a possibility that battery information having large capacity cannot be communicated within a predetermined cycle in a time slot required on the battery monitoring system 1. By the wireless communication unit 54 of the control device 50 controlling the time slot and the communication speed for wirelessly transmitting the battery information, it is possible to suitably cope with the case of transmitting large-capacity battery information data.

For example, a hybrid vehicle (HEV) includes an engine operated by gasoline and a motor 15 operated on electricity. On the other hand, an electric vehicle (BEV) includes the motor 15 that operates on electricity. Both the hybrid vehicle and the electric vehicle include the battery monitoring system 1 described above.

When a developer applies, for example, a technique such as know-how cultured in a hybrid vehicle to development of an electric vehicle, the number of battery modules 20 as the monitoring targets increases. Thus, when automobiles using different power systems are developed in parallel or sequentially, by applying a similar time slot allocation technique as described above, the development can be speeded up and the development can be made while making use of know-how.

Summary of Present Embodiment

As described above, according to the present embodiment, the wireless communication unit 46 of the monitoring device 40 executes a predetermined connection process with the wireless communication unit 54 of the control device 50. For example, the wireless communication unit 46 of the monitoring device 40 sets a communication speed when transmitting the advance notice detection request S21 to be lower than a communication speed when transmitting the battery information to the wireless communication unit 54 of the control device 50. Since the communication speed at the time of the predetermined connection process is set to be lower than the communication speed at the time of communicating the battery information, an error rate at the time of the connection process can be reduced, and reliability of the communication at the time of the predetermined connection process can be ensured. Since the communication speed at the time of communicating the battery information is higher than the communication speed at the time of the predetermined connection process, a data transmission amount of the battery information can be increased. In particular, the communication speed may be set to a low speed when a communication data amount is small during the predetermined connection process before the battery information is acquired.

According to the present embodiment, by transmitting the advance notice detection request S21 using the non-battery information frequency band, the wireless communication unit 46 of the monitoring device 40 is capable of transmitting the transmission reservation timing information on the continuous detection request S22 transmitted using the battery information frequency band to the wireless communication unit 54 of the control device 50. Accordingly, the wireless communication unit 54 of the control device 50 can grasp a timing of receiving the continuous detection request S22 in advance, can ensure a schedule of receiving the continuous detection request S22 in advance, and can improve connection reliability of communication.

According to the present embodiment, the wireless communication unit 46 of the monitoring device 40 changes the communication speed when the battery information is transmitted from the wireless communication unit 46 of the monitoring device 40 to the wireless communication unit 54 of the control device 50 after the connection request S13 received during the connection process S100. Accordingly, when the connection request S13 is received during the connection process S100, the communication speed can be changed to high speed, and the wireless communication unit 46 of the monitoring device 40 is capable of transmitting the battery information at high speed.

The battery monitoring system 1 ensures safety of the vehicle 10 by monitoring the battery information on all the battery modules 20. In this case, when the communication speeds between the control device 50 and the multiple monitoring devices 40 are simultaneously changed, radio wave interference may occur inside the battery pack 11. In the present embodiment, the wireless communication unit 46 of the monitoring device 40 switches the communication speed for the wireless communication unit 54 of the control device 50, and switches the communication speed individually for each wireless communication unit 46 of each monitoring device 40.

As a specific example, in the present embodiment, the wireless communication unit 46 of each of the multiple monitoring devices 40 is capable of transmitting the advance notice detection request S21 and the continuous detection request S22 at a convenient time in consideration of its own task schedule. In this way, when the continuous detection request S22 is transmitted, the communication speed can be spontaneously switched from the wireless communication unit 46 of the monitoring device 40 by using the second channel group. Accordingly, after the connection request S13 is received, the communication can be switched to high-speed communication, and the battery information can be communicated at high speed. After transmitting the advance notice detection request S21, the wireless communication unit 46 of each monitoring device 40 may not only switch to high-speed communication when transmitting the continuous detection request S22, but also switch to high-speed communication by using the second channel group in communication after receiving the connection request S13. Therefore, the communication speed can be switched at different timings for each of the wireless communication units 46 of the multiple monitoring devices 40, and the safety of the vehicle 10 can be further enhanced.

According to the first embodiment, the communication is executed by dividing use into the first channel group in the non-battery information communication frequency band and the second channel group in the battery information communication frequency band in the entire usable frequency band. A communication method is determined in advance so that the communication speed is changed between the first channel group and the second channel group. Accordingly, the communication speed can be easily changed.

Specifically, the wireless communication unit 46 of the monitoring device 40 performs communication with the wireless communication unit 54 of the control device 50 by switching between the second channel group in the battery information communication frequency band for transmitting the battery information to the wireless communication unit 54 of the control device 50 and the first channel group in the non-battery information communication frequency band that is a band for transmitting the advance notice detection request S21 to notify the control device 50 of the presence of the monitoring device 40. At this time, the wireless communication unit 46 of the monitoring device 40 transmits the advance notice detection request S21 in the non-battery information communication frequency band before transmitting the continuous detection request S22 for a continuous connection in the battery information communication frequency band.

By the wireless communication unit 46 of the monitoring device 40 transmitting the advance notice detection request S21 that gives an advance notice of the transmission of the continuous detection request S22 in advance in the non-battery information frequency band, the wireless communication unit 54 of the control device 50 easily receives the continuous detection request S22 in the battery information frequency band, and reliability of the connection process S100 between the wireless communication unit 46 of the monitoring device 40 and the wireless communication unit 54 of the control device 50 can be improved.

The second channel group in the battery information frequency band includes more channels than the first channel group in the non-battery information frequency band. Although the connection process S100 is executed using both the battery information frequency band and the non-battery information frequency band, a communication amount used in the connection process S100 in the second channel group in the battery information frequency band is larger than that in the first channel group in the non-battery information frequency band.

The non-battery information frequency band includes multiple channels. The wireless communication unit 46 of the monitoring device 40 transmits a detection request using all of the multiple usable frequency bands belonging to the non-battery information frequency band. The wireless communication unit 46 of the monitoring device 40 may select one or more frequency bands among multiple frequency bands belonging to the non-battery information frequency band and transmit the detection request.

At this time, it is desirable that the wireless communication unit 46 of the monitoring device 40 transmits the continuous detection request S22 at a higher speed than the advance notice detection request S21. Since the continuous detection request S22 is transmitted at high speed in the battery information frequency band, it is not necessary to switch the communication speed for each data to be communicated. Since the communication is switched to the high-speed communication at a time of the continuous detection request S22, it is possible to save a trouble of changing the speed in subsequent communication. Therefore, it is possible to proceed to periodic communication processing S200 early. As a result, the battery monitoring starts quickly. Accordingly, wireless communication between the wireless communication unit 46 of the monitoring device 40 and the wireless communication unit 54 of the control device 50 can be suitably executed.

According to the present embodiment, when the wireless communication unit 46 of the monitoring device 40 performs communication with the wireless communication unit 54 of the control device 50 in a non-synchronous manner, and transmits the advance notice detection request S21 to notify the presence of the monitoring device 40, the wireless communication unit 46 transmits the advance notice detection request S21, and performs synchronization, and then performs transmission at a speed lower than a communication speed when receiving a signal necessary for the connection process S100.

When the wireless communication unit 54 of the control device 50 executes communication with the wireless communication unit 46 of the monitoring device 40 in a non-synchronous manner, and receives the advance notice detection request S21 transmitted from the wireless communication unit 46 of the monitoring device 40 to notify the presence of the monitoring device 40, the wireless communication unit 54 receives the advance notice detection request S21 from the wireless communication unit 46 of the monitoring device 40, and performs synchronization, and then performs reception at a speed lower than a communication speed when the receiving a signal necessary for the connection process S100. Therefore, the wireless communication between the wireless communication unit 46 of the monitoring device 40 and the wireless communication unit 54 of the control device 50 can be suitably executed.

In the present embodiment, while the ignition switch is off, the monitoring device 40 continues to transmit the detection request while maintaining a start state, and the control device 50 is in a sleep state. Accordingly, while the control device 50 is in the sleep state, a connection can be disconnected, and power consumption of the control device 50 can be reduced. Moreover, since the detection request can be received immediately after the control device 50 is started, the control device 50 can quickly execute the connection process with the monitoring device 40 and quickly start a monitoring process of the assembled batteries 12.

Modification 1

For example, both the control device 50 and the monitoring device 40 may be started in a state in which the ignition switch is off, and while maintaining the connection, a frequency of communication may be lower than normal, and a communication speed may be made lower than normal. In this case, a connection state can be maintained while reducing power consumption. In this case, when the ignition switch is turned on, a communication frequency may be set to a normal frequency by detecting an on-signal, and a communication cycle may be returned to a normal cycle.

Both the control device 50 and the monitoring device 40 may be started in a state in which the ignition switch is off, and while maintaining the connection, the frequency of communication may be lower than normal, and the communication speed may be maintained. When the ignition switch is turned on, it is possible to speed up the start of the vehicle 10 without separately executing a process of changing the communication speed.

Summary of Present Embodiment

Since the battery information changes from moment to moment, the communication data amount of the battery information that the monitoring device 40 communicates with the control device 50 becomes large. Therefore, rather than reducing the number of times of packet retransmission by ensuring the reliability of communication per one time, it is better to increase the transmission data amount by increasing the communication speed even when the number of times of packet retransmission increases.

Generally, when the transmission data amount per unit time of the battery information is increased by increasing the communication speed of the packet, an error rate occurring in the packet increases. In the present embodiment, in response to the first advance notice detection request S21 at the time of the connection process, transmission reservation timing information indicating the timing when the continuous detection request S22 scheduled to be continuously transmitted thereafter is included and transmitted.

Accordingly, when the control device 50 receives an understood signal from the monitoring device 40, the control device 50 is also capable of receiving the scheduled transmission timing of the continuous detection request S22 in advance. Therefore, by waiting for reception in accordance with the scheduled transmission timing of the continuous detection request S22, the control device 50 can appropriately manage a data communication schedule between the wireless communication unit 46 of the monitoring device 40 and the wireless communication unit 54 of the control device 50, and can reduce the error rate of packets.

Modification 2

It is desirable that the wireless communication unit 46 of the monitoring device 40 and the wireless communication unit 54 of the control device 50 are capable of reliably executing the connection process S100 for establishing a connection. This is because it is preferable to continue to monitor the state of the battery module 20 of the assembled batteries 12 both during stopping and during traveling, and when an abnormality occurs in the assembled batteries 12, traveling safety of the vehicle 10 deteriorates.

A dedicated non-battery information frequency band in which battery information is not transmitted may be prepared, and both the advance notice detection request S21 and the continuous detection request S22 of the connection process S100 may be transmitted. When the connection process S100 is executed by using the non-battery information communication frequency band, the number of packets related to battery information is small, and communication can be performed without packets related to battery information occupying traffic. In this case, the reliability of the connection process S100 can be improved.

Modification 3

In the above-described embodiment, the connection process S100 is executed when the vehicle 10 is started from a state in which the vehicle 10 is stopped. However, even when the vehicle 10 is in a stop state, the connection process S100 may be executed to maintain the connection state. In this case, since the connection state is maintained and the connection is established when the vehicle 10 is started, the vehicle 10 can be started early. Since the connection state is maintained, the control device 50 can control the multiple monitoring devices 40. Therefore, the wireless communication unit 46 of the monitoring device 40 is also capable of instructing the wireless communication unit 54 of the control device 50 to change the communication speed at which the battery information is transmitted.

Second Embodiment

Figure 10:
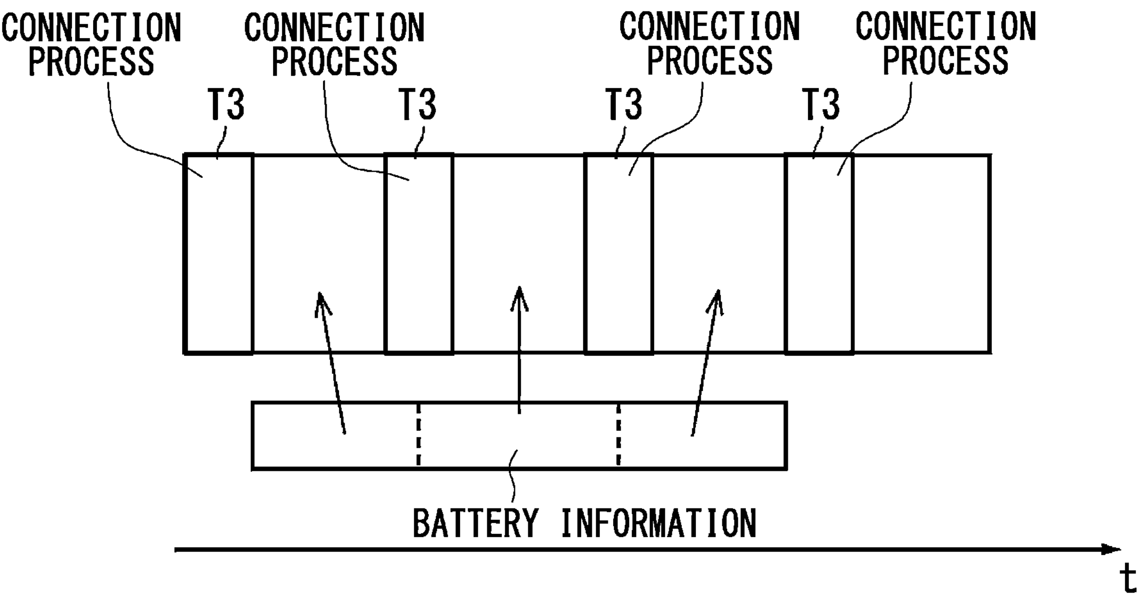
FIG. 10 is a diagram schematically showing a time course of a connection process and battery information communication processing.
Figure 11:
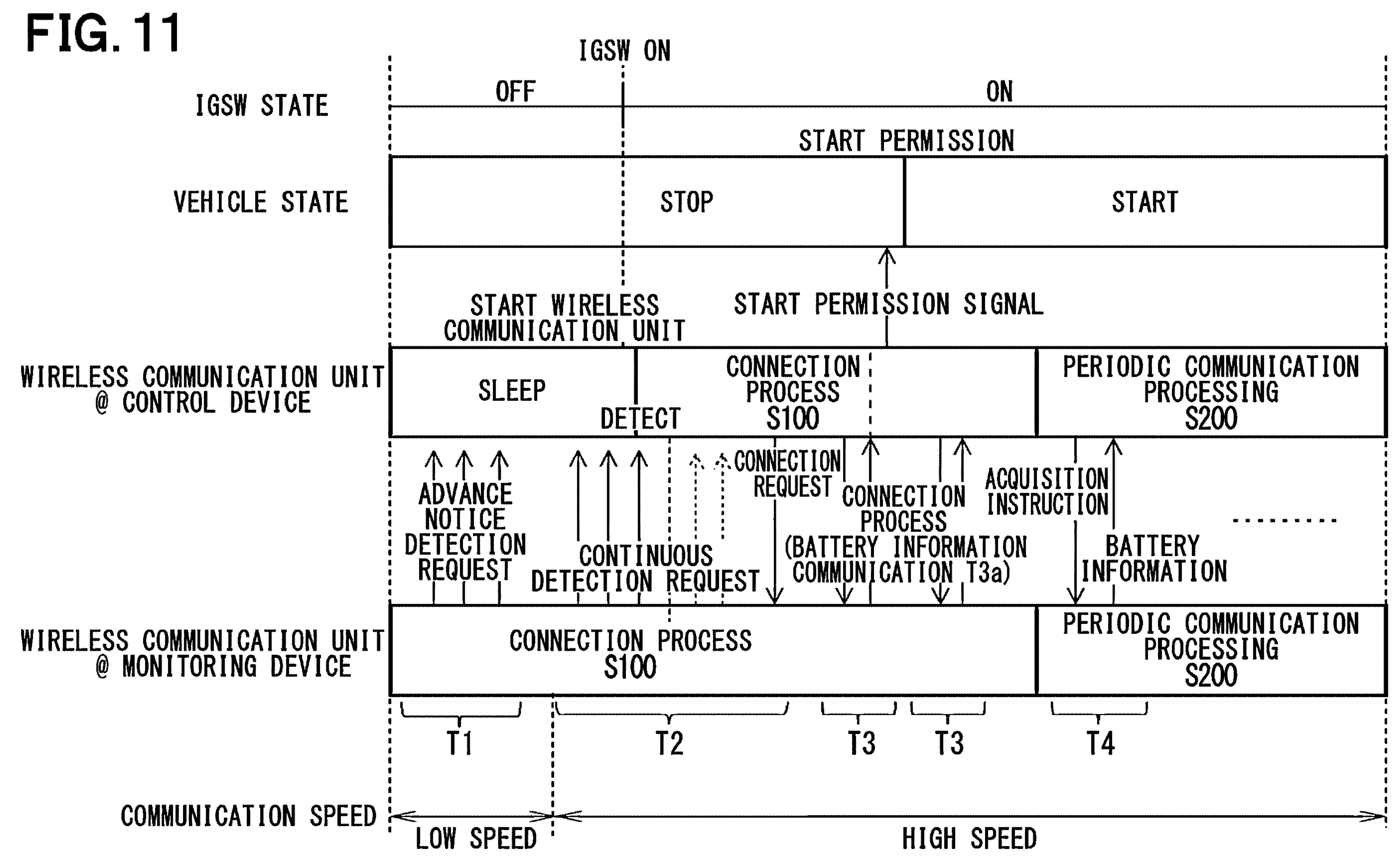
FIG. 11 is a time chart schematically showing the flow of communication.

A second embodiment is to be described with reference to FIGS. 9 to 11. Portions different from the above-described embodiment are to be described. A wireless communication unit 46 of a monitoring device 40 in the present embodiment transmits battery information to a wireless communication unit 54 of a control device 50 during an execution period of a connection process S100, in addition to transmitting battery information in periodic communication processing S200.

As described in the above-described embodiment, the wireless communication unit 46 of the monitoring device 40 transmits multiple packets to the wireless communication unit 54 of the control device 50 in the connection process S100. The wireless communication unit 46 of the monitoring device 40 includes battery information in a part of the packet to be transmitted in the connection process S100 and transmits the packet. One or more packets including the battery information may be transmitted, and a transmission mode is not particularly limited. The wireless communication unit 46 of the monitoring device 40 may include the battery information in the packet in the connection process S100.

When the monitoring device 40 executes a detection operation, it is desirable to include the battery information in a packet of a continuous connection request S23 for the control device 50. In addition, the battery information may be in a packet of a continuous detection request S22, or may be in a packet transmitted together with the packet of the continuous detection request S22. In the periodic communication processing S200, the battery information may be communicated in advance before the battery information is transmitted.

The wireless communication unit 46 of the monitoring device 40 may include the battery information in a packet during a pairing process. The monitoring device 40 may include the battery information in a packet transmitted after completion of an exchange of unique information. In a part of a connection process T3 in the connection process S100, the monitoring device 40 may include the battery information in a packet to be transmitted before the exchange of the unique information is completed, or may transmit the battery information after the exchange of the unique information is completed. Battery information may be in a packet for exchanging unique information. By transmitting the battery information in advance, a vehicle 10 can be started quickly.

Hereinafter, specific examples are to be described with reference to the drawings. The wireless communication unit 54 of the control device 50 is similar to that of the first embodiment until the wireless communication unit 54 is synchronized with the wireless communication unit 46 of the monitoring device 40, so a description thereof is omitted.

Figure 9:
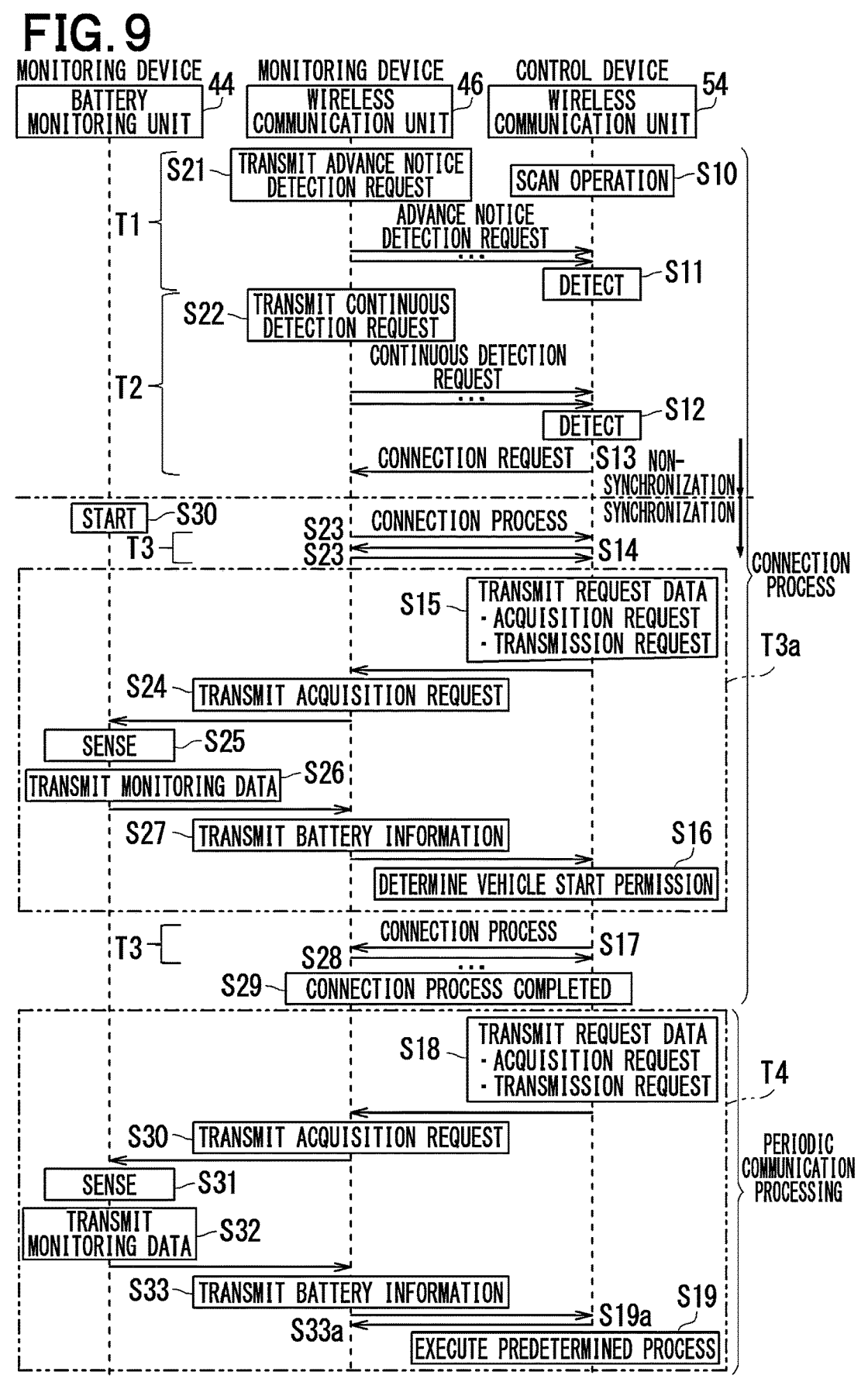

As shown in FIG. 9, the wireless communication unit 54 of the control device 50 transmits a connection request S13 to the wireless communication unit 46 of the monitoring device 40, and the wireless communication unit 46 of the monitoring device 40 transmits the continuous connection request S23 to the wireless communication unit 54 of the control device 50 to respond to the connection request S13. The battery information is transmitted while various connection processes T3 such as the pairing process are continuously executed. For example, reference is made to battery information communication processing T3*a* in FIGS. 9 and 11. The connection process T3 indicates one or more of round-trip connections of the continuous connection request S23 and a continuous connection response S14, or a continuous connection request S28 and a continuous connection response S17 shown in FIG. 9.

In the battery information communication processing T3*a*, the wireless communication unit 54 of the control device 50 first transmits an acquisition request and a transmission request S15 to the wireless communication unit 46 of the monitoring device 40. The wireless communication unit 54 of the control device 50 performs communication at a high communication speed on one or more second channels in a battery information wireless communication frequency band. The wireless communication unit 46 of the monitoring device 40 transmits a battery information acquisition request S24 to a battery monitoring unit 44.

The battery monitoring unit 44 senses the assembled batteries 12 in S25, and acquires battery monitoring information such as a voltage of the battery cell 22 as the battery information. Upon acquiring the battery information, the battery monitoring unit 44 transmits the battery information as monitoring data to the wireless communication unit 46 of the monitoring device 40 (S26). Upon receiving the battery information, the wireless communication unit 46 of the monitoring device 40 transmits the battery information to the wireless communication unit 54 of the control device 50 (S27). The battery information may be collectively transmitted in one packet, but since a data amount is relatively large, the battery information is divided into packets and wirelessly transmitted. In this case, the battery information may be divided into packets and wirelessly transmitted. The battery information may not be divided.

At this time, the wireless communication unit 54 of the control device 50 preferably commands the wireless communication unit 46 of the monitoring device 40 to transmit the battery information during the multiple connection processes T3. Then, the wireless communication unit 46 of the monitoring device 40 transmits the battery information during a period in which the connection process T3 with the control device 50 is executed. By transmitting the battery information during the connection process T3, the start of the vehicle 10 can be accelerated. As a result, it is possible to reduce discomfort of a user due to a delay in starting when the vehicle 10 is started.

The wireless communication unit 46 of the monitoring device 40 preferably transmits information necessary for monitoring a battery module 20 of a battery pack 12 before completing the connection process S100. The information necessary for monitoring the battery modules 20 of the battery pack 12 targets a part or all of the battery information that can be acquired from the battery monitoring unit 44. Examples of the battery information may include information on a cell voltage of the battery cell 22, temperature information, and information on a current flowing through the assembled batteries 12. As shown in FIG. 10, it is desirable to transmit the above-described battery information in a divided manner between multiple connection processes T3. At this time, it is preferable that the wireless communication unit 46 of the monitoring device 40 divides and transmits data of the battery information so as to fall within an allocated time slot. At this time, it is preferable to divide the data of the battery information into meaningful data segments. The meaningful segmentation indicates data in units that can be recognized as battery information. The data of the battery information may not be divided.

When the vehicle 10 is, for example, an electric vehicle, the electric vehicle travels using electric power of the assembled batteries 12. Therefore, when the electric vehicle is started, battery information is required. When it is determined that the battery information is normally operated, it is important to permit the start of the vehicle 10 to ensure safety of the vehicle 10.

The control device 50 and a host ECU 16 preferably start the vehicle 10 under a condition that the assembled batteries 12 operate normally. As shown in FIG. 11, the vehicle 10 is started on condition that the battery information is received. However, the host ECU 16 preferably starts the vehicle 10 on condition that vehicle information received from another ECU or a sensor (not illustrated) mounted in the vehicle 10 satisfies a start condition, in addition to a normal operating condition of the assembled batteries 12. In this case, as shown in FIG. 11, the vehicle 10 can be started early while maintaining safety while the connection process T3 is continued.

In the present embodiment, the wireless communication unit 46 of the monitoring device 40 does not need to set data related to a timing in the continuous connection requests S23 and S28. Therefore, the control device 50 is capable of setting the battery information in a data field of the packet, and is capable of effectively using the data field of the packet.

Communication schedules of the continuous connection requests S23 and S28 are managed in advance between the wireless communication unit 54 of the control device 50 and the wireless communication unit 46 of the monitoring device 40. Therefore, large data can be in a packet and transmitted during the continuous connection requests S23 and S28. Thereafter, the monitoring device 40 executes the periodic communication processing S200, and is capable of transmitting battery information having a large data amount to the control device 50 in advance before executing the periodic communication processing S200.

According to the present embodiment, the wireless communication unit 46 of the monitoring device 40 causes a communication speed when the battery information is in the packet and transmitted to the wireless communication unit 54 of the control device 50 during a period in which the connection process with the wireless communication unit 54 of the control device 50 is executed to be the same as a communication speed when the battery information is transmitted to the wireless communication unit 54 of the control device 50 after the connection process S100. Accordingly, even when the battery information is transmitted during the connection process S100 before the periodic communication processing S200 is executed, the battery information can be transmitted at high speed.

Modification of Startup Timing of Battery Monitoring Unit 44

A modification of a startup timing of the battery monitoring unit 44 is to be described with reference to FIGS. 5 and 9. As shown in FIG. 5, the wireless communication unit 46 may have a function of a start circuit 46*b* for the battery monitoring unit 44. The start circuit 46*b* is configured to output a start signal to the battery monitoring unit 44 when receiving the connection request S13 received from the wireless communication unit 54 of the control device 50.

That is, as shown in FIG. 9, the wireless communication unit 54 of the control device 50 transmits the connection request S13 to the wireless communication unit 46 of the monitoring device 40, and the start circuit 46*b* of the wireless communication unit 46 transmits a start signal to the battery monitoring unit 44 at a timing when the control device 50 and the monitoring device 40 are in a synchronous state. The battery monitoring unit 44 can be started in S30 in FIG. 9.

The wireless communication unit 54 of the control device 50 may issue a start instruction of the battery monitoring unit 44 to the wireless communication unit 46 of the monitoring device 40 simultaneously with the connection request S13. In addition, a timing at which the wireless communication unit 54 transmits a start signal to the battery monitoring unit 44 may be a timing immediately before the wireless communication unit 46 of the monitoring device 40 transmits an acquisition instruction, that is, a timing at which the wireless communication unit 46 of the monitoring device 40 receives request data from the wireless communication unit 54 of the control device 50.

When the wireless communication unit 46 of the monitoring device 40 executes the connection process with the wireless communication unit 54 of the control device 50, it is preferable to switch the communication speed to a speed higher than the communication speed when the connection process is executed, before the battery monitoring unit 44 is started. By switching the communication speed to high-speed communication before the battery monitoring unit 44 is started, the battery information can be quickly transmitted to the control device 50. As a result, the start of the vehicle 10 becomes faster, and the discomfort of the user due to a delay in starting can be reduced.

In a flow in FIG. 9, at the time of power supply start of the battery monitoring unit 44 shown in S30 in FIG. 9, since high-speed communication is already performed using the second channel in the battery information communication frequency band, it is not particularly necessary to increase the speed before and after the start. When low-speed communication is performed, it is preferable to switch the communication to high-speed communication before the battery monitoring unit 44 is started (S30).

The start may be delayed from a timing of S30 shown in FIG. 9. For example, at a timing immediately before the wireless communication unit 46 of the monitoring device 40 receives an acquisition request and a transmission request S18 from the wireless communication unit 54 of the control device 50, a start signal may be output to the battery monitoring unit 44 of the monitoring device 40 to start the battery monitoring unit 44.

According to the present embodiment, similar effects as those of the above-described embodiment can be obtained. When the battery information is transmitted alternately with the continuous detection request S22 during the connection process S100, reliability of the communication can be obtained even when the communication speed for transmitting the battery information is increased. By optimizing a communication schedule, the reliability of communication can be improved while increasing the number of times of communication.

The description of the startup timing of the battery monitoring unit 44 in the present embodiment may be applied to other embodiments, for example, any one of first and third to ninth embodiments.

Third Embodiment

A third embodiment is to be described with reference to FIG. 12. In the present embodiment, another mode of a method for changing a communication speed is to be described. For example, the communication speed can be changed when a battery monitoring system 1 is applied in which battery information and non-battery information are communicated together using a channel group having the same one or more channels. Portions different from the above-described embodiment are to be described. In the present embodiment, since connection processes T1 and T2 are changed to a connection process T2*a*, the connection process T2*a* is to be described first.

Connection Process S100

A wireless communication unit 46 of a monitoring device 40 continues to periodically transmit a detection request S22*a* in a predetermined channel group while processing other tasks whose schedules are managed until a connection request S13 is received from a wireless communication unit 54 of a control device 50.

Figure 12:
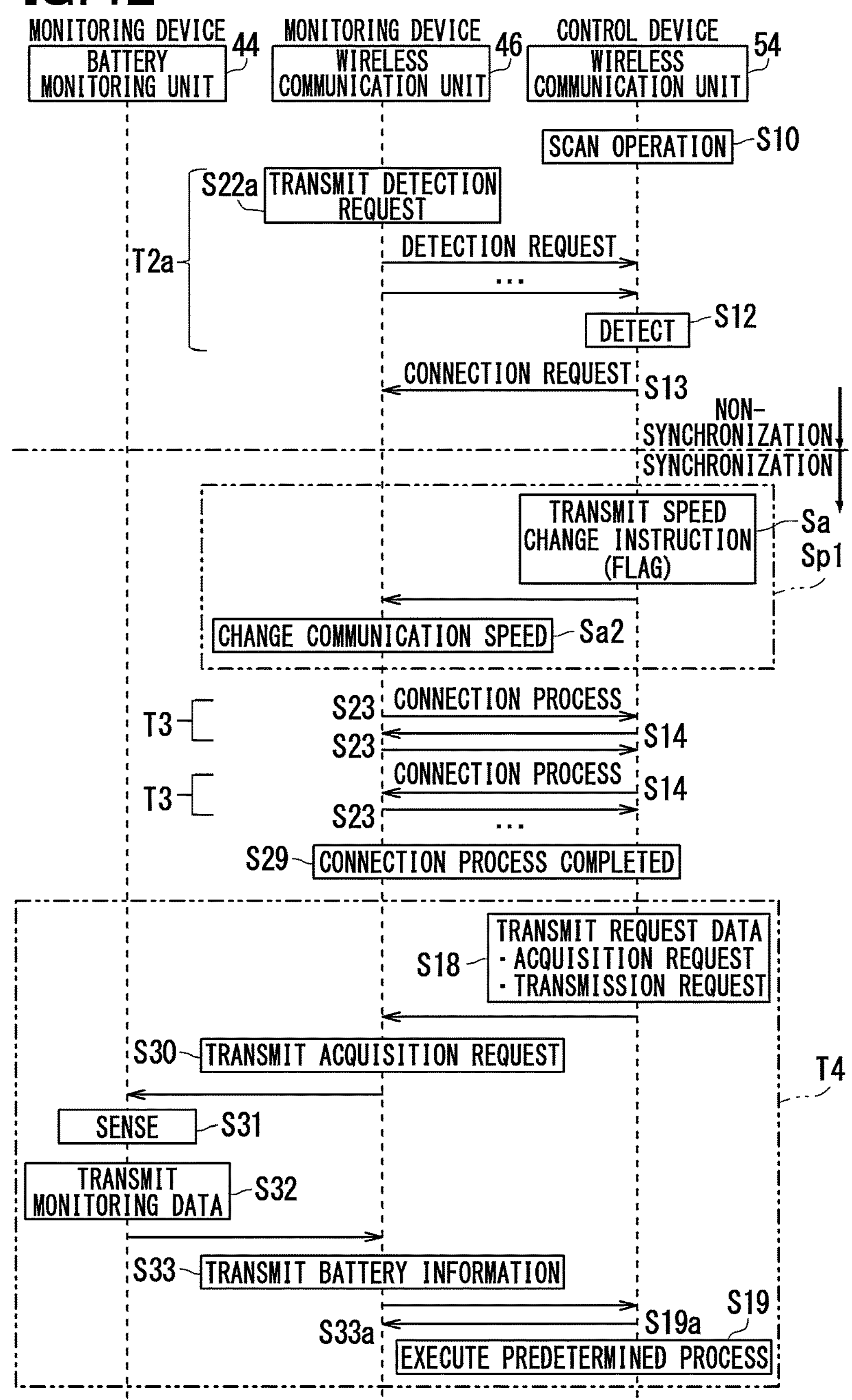
FIG. 12 is a sequence diagram schematically showing a flow of communication in a third embodiment.

The detection request S22*a* in the connection process T2*a* in FIG. 12 is an understood command to notify an outside of presence of the wireless communication unit 46 of the monitoring device 40, and indicates a request command required to receive the connection request S13 from the wireless communication unit 54 of the control device 50. The wireless communication unit 46 of the monitoring device 40 continues to periodically transmit the detection request S22*a* even when an ignition switch is off.

The detection request S22*a* continues to be transmitted more periodically in a non-synchronization process to cause the wireless communication unit 54 of the control device 50 present in the vicinity to detect the presence of the wireless communication unit 46. Since the wireless communication unit 46 of the monitoring device 40 continues to transmit the detection request S22*a* while a communication partner is not specified, it is difficult to establish a connection. Therefore, it is preferable to transmit the detection request at a lower communication speed than a communication speed when the battery information is communicated. It is preferable that the wireless communication unit 46 of the monitoring device 40 specifies a communication partner, establishes a connection, performs synchronization, and then performs high-speed communication. Accordingly, it is possible to implement communication of battery information having a large data amount, for example, communication suitable for properties of the periodic communication processing S200 and the connection process S100 having a small data amount.

On the other hand, the control device 50 maintains a sleep state and stops battery monitoring control while the ignition switch is off. When the ignition switch transitions to on, the control device 50 is started. Specifically, the control device 50 is started by receiving a signal indicating that the ignition switch is turned on from the host ECU 16 of the vehicle 10.

When the control device 50 is started, the wireless communication unit 54 of the control device 50 starts a scanning operation for a device that is present in a surrounding region (S10). The wireless communication unit 54 of the control device 50 is capable of scanning the detection request S22*a* if the detection request S22*a* is transmitted from the wireless communication unit 46 of the monitoring device 40. When the detection for the detection request S22*a* succeeds, the control device 50 transmits the connection request S13.

After transmitting the detection request S22*a*, the wireless communication unit 46 of the monitoring device 40 receives the connection request S13 corresponding to the detection request S22*a*. When the wireless communication unit 46 of the monitoring device 40 receives the connection request S13 from the wireless communication unit 54 of the control device 50, the connection process is considered successful. After the connection request S13 is received, a synchronization process of the connection process is started. Reference is made to a connection process T3 shown in FIG. 12, that is, a continuous connection response S14 by the wireless communication unit 54 of the control device 50, and a continuous connection request S23 by the wireless communication unit 46 of the monitoring device 40.

About Speed Change Method and Speed Change Timing

For example, as shown in FIG. 12, it is preferable to change a communication speed by performing packet communication immediately after synchronization. Specifically, immediately after the synchronization, the wireless communication unit 46 of the monitoring device 40 executes a speed change process Sp1 with the wireless communication unit 54 of the control device 50. In the speed change process Sp1, the wireless communication unit 54 of the control device 50 sets data indicating a speed change instruction Sa for changing from a low speed to a high speed in a flag packet Pa and transmits the speed change instruction Sa.

Upon receiving the speed change instruction Sa, the wireless communication unit 46 of the monitoring device 40 changes the communication speed to a high speed. As shown in FIG. 13, a command of the speed change instruction Sa in the flag packet Pa is preferably transmitted sequentially between packets P1 and P2 of the connection process T3 transmitted to the wireless communication units 46 of the multiple monitoring devices 40. As shown in FIG. 14, a data packet D may be transmitted with a flag F.

Thereafter, the wireless communication unit 46 of the monitoring device 40 is capable of performing high-speed communication with the wireless communication unit 54 of the control device 50 also in the connection process T3. As shown in FIG. 12, high-speed communication can be similarly performed in periodic communication processing T4 (periodic communication processing S200) after the connection process S100 is completed.

A timing of changing the communication speed between the wireless communication units 46 and 54 may be before the wireless communication unit 46 of the monitoring device 40 transmits the battery information.

Modification 1

Figure 15:
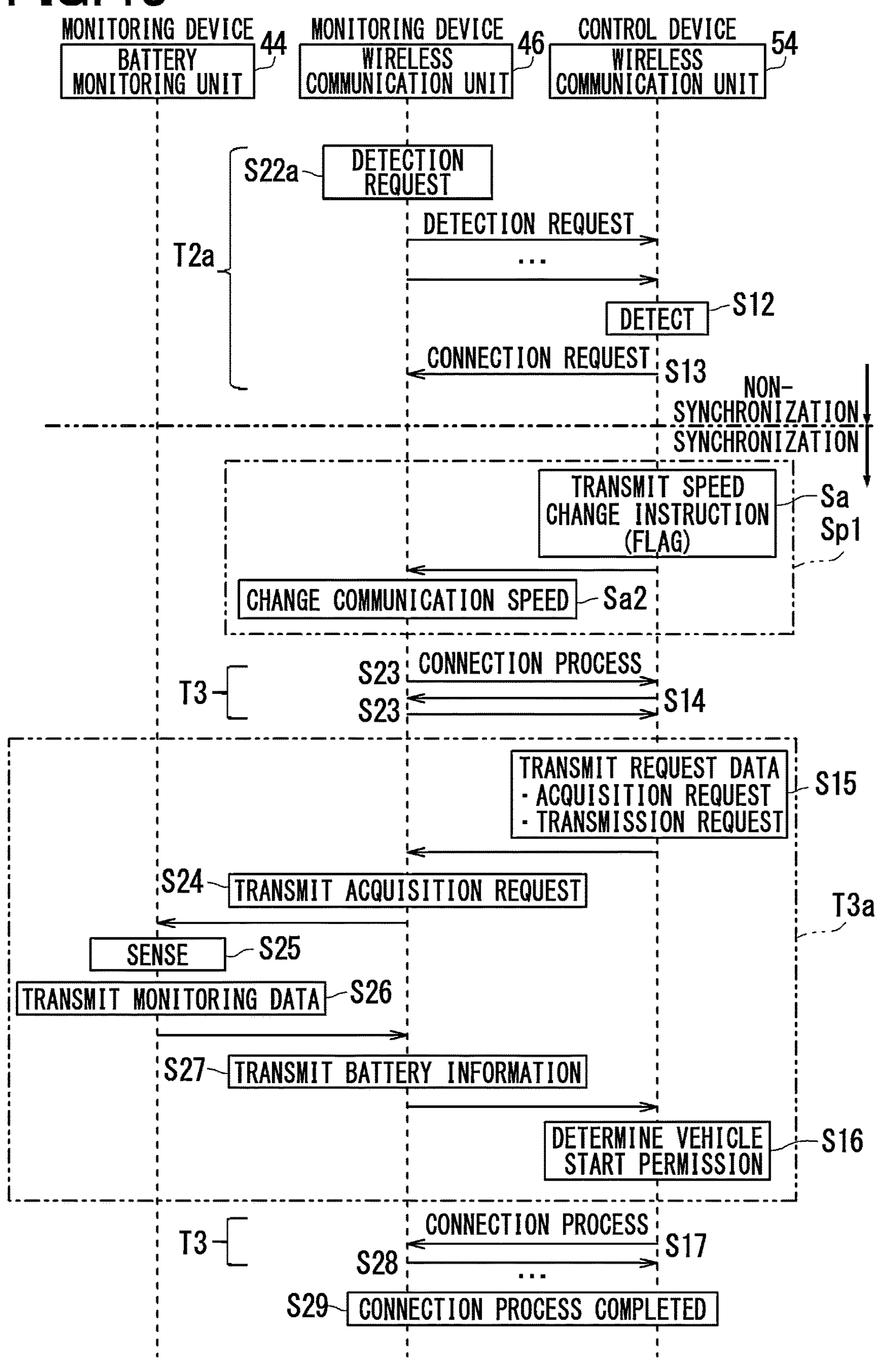
FIG. 15 is a sequence diagram schematically showing a flow of communication in Modification 1 of the third embodiment.
Figure 16:
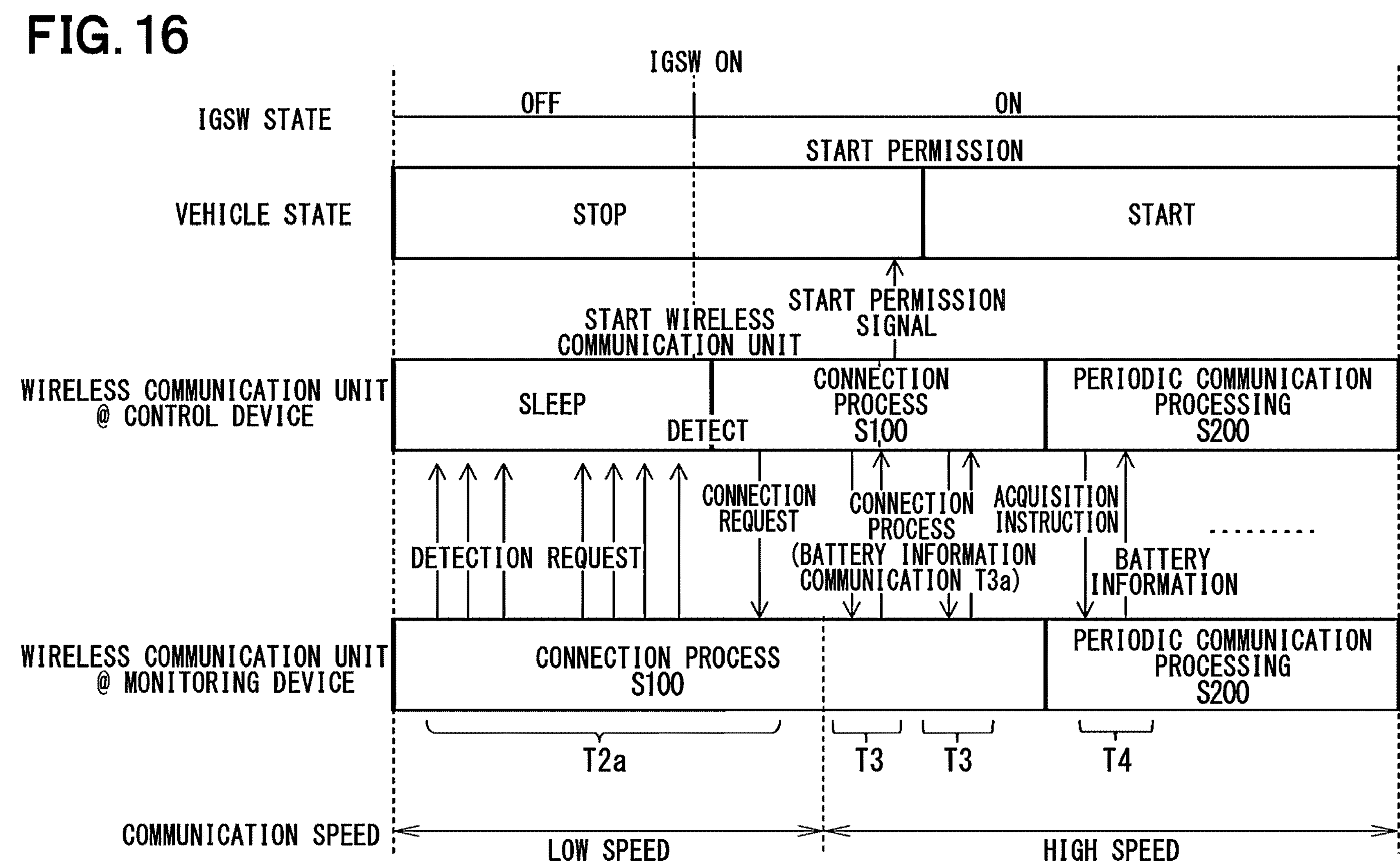
FIG. 16 is a time chart schematically showing the flow of communication.

As shown in FIGS. 15 and 16, by executing battery information communication processing T3*a* before completing the connection process S100 with the wireless communication unit 54 of the control device 50 (S29), the wireless communication unit 46 of the monitoring device 40 is capable of transmitting the battery information before the periodic communication processing S200 in advance. At this time, high-speed communication of the battery information can be performed in advance, and similar effects as those of the above-described embodiment are achieved. The battery information may not be communicated in advance before the periodic communication processing S200.

Modification 2

Figure 17:
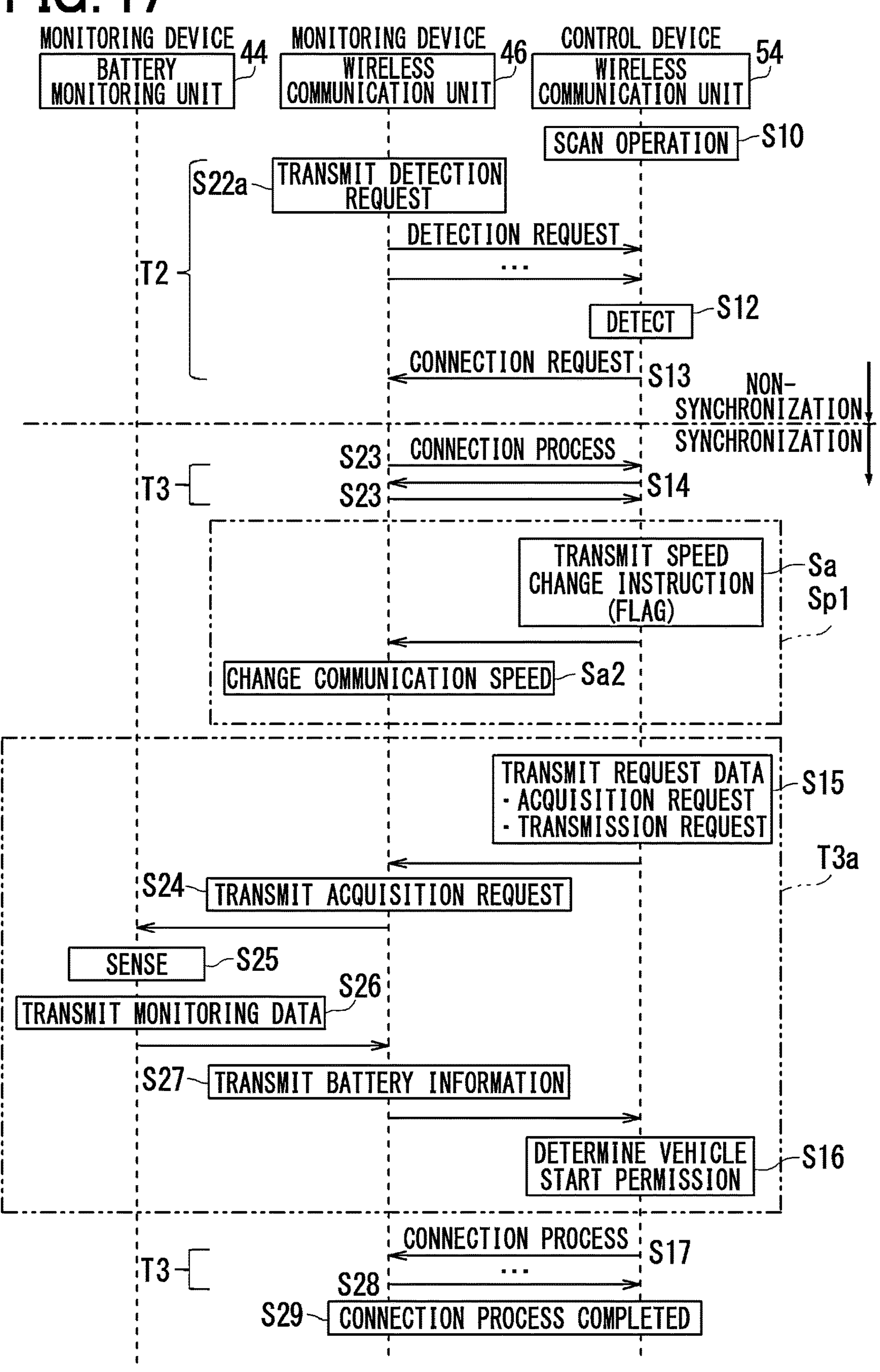
FIG. 17 is a sequence diagram schematically showing a flow of communication in Modification 2 of the third embodiment.

In addition, as shown in FIG. 17, after synchronizing with the wireless communication unit 54 of the control device 50, the wireless communication unit 46 of the monitoring device 40 may execute the speed change process Sp1 during execution of multiple connection processes T3. That is, as a part of the connection process T3 after the synchronization, after the continuous connection request S23 and the continuous connection response S14 are repeated once or more times, the speed change process Sp1 may be executed, and the continuous connection request S28 and the continuous connection response S17 of another connection process T3 may be executed once or more times. Accordingly, similar effects as those of the above-described embodiment are obtained.

Further, by executing the battery information communication processing T3*a* before completing the connection process S100 with the wireless communication unit 54 of the control device 50 (S29), the wireless communication unit 46 of the monitoring device 40 is capable of transmitting the battery information before the periodic communication processing S200 in advance. At this time, high-speed communication of the battery information can be performed in advance, and similar effects as those of the above-described embodiment are achieved. The battery information may not be communicated in advance before the periodic communication processing S200.

Modification 3

Figure 18:
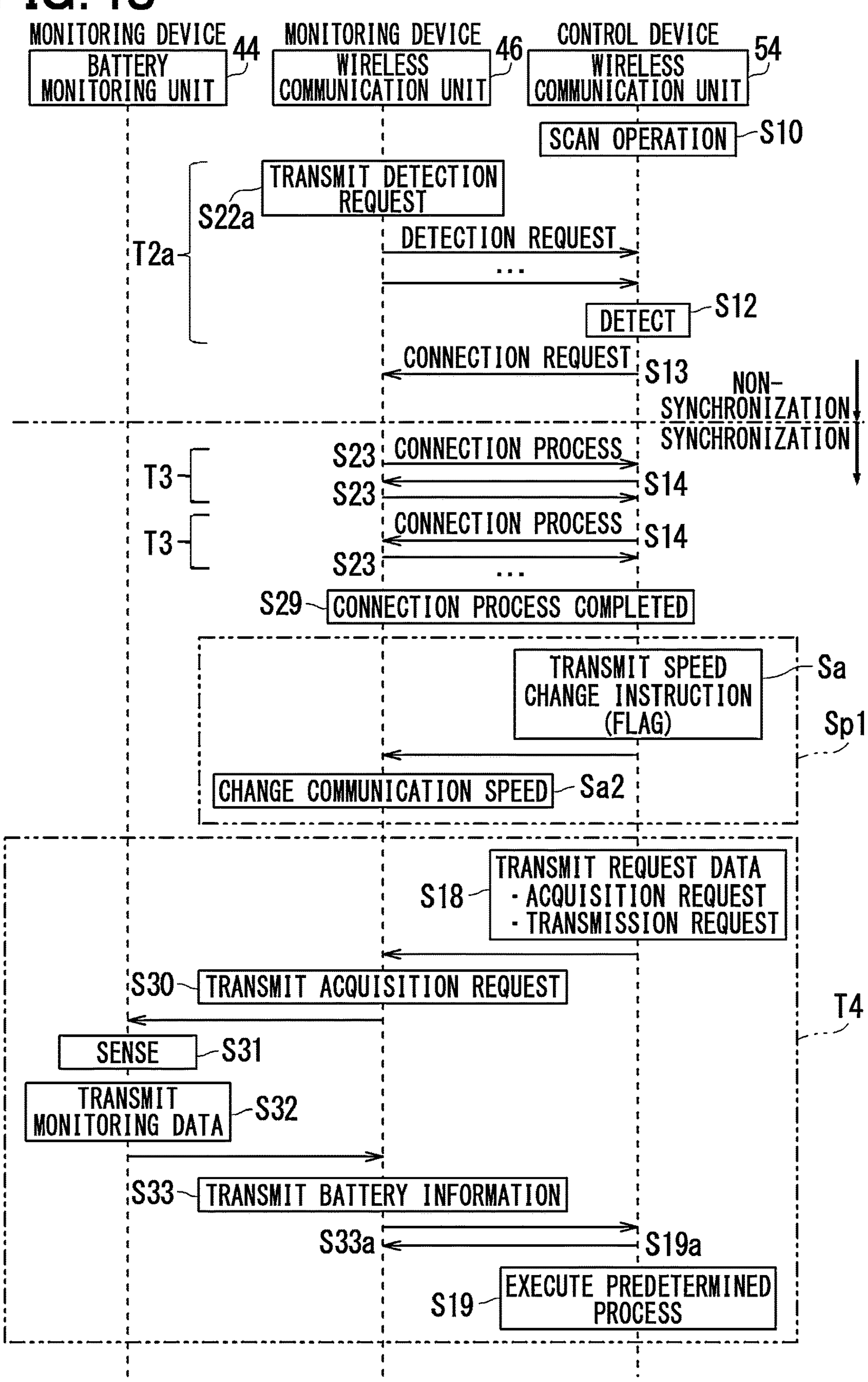
FIG. 18 is a sequence diagram schematically showing a method for changing a communication speed in Modification 3 of the third embodiment.
Figure 19:
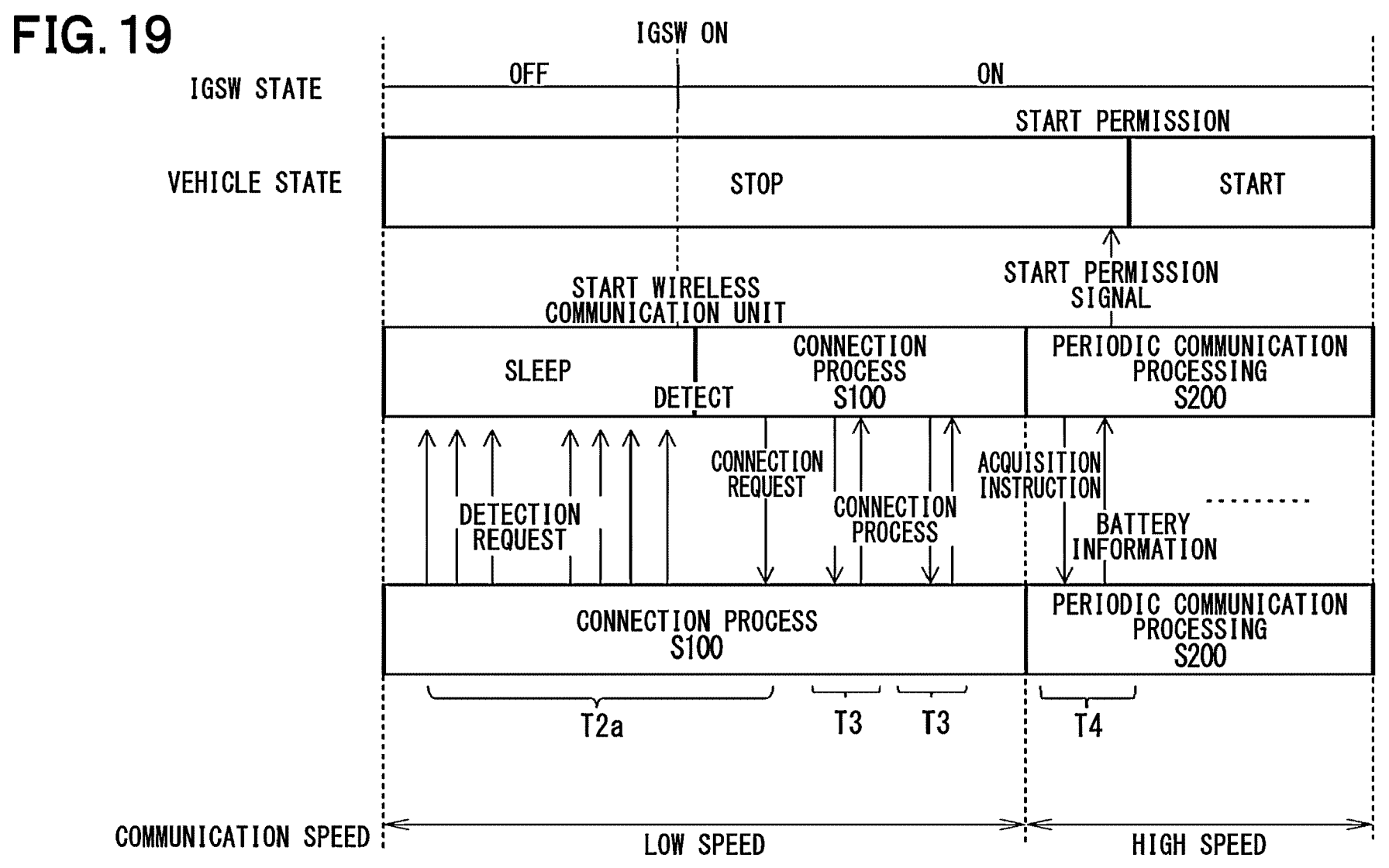

In addition, as shown in FIGS. 18 and 19, the wireless communication unit 46 of the monitoring device 40 may execute the speed change process Sp1 after synchronizing with the wireless communication unit 54 of the control device 50, after completing the connection process S100 (S29), and before executing the periodic communication processing T4, that is, before executing the periodic communication processing S200. Accordingly, similar effects as those of the above-described embodiment are obtained.

Modification 4

Figure 20:
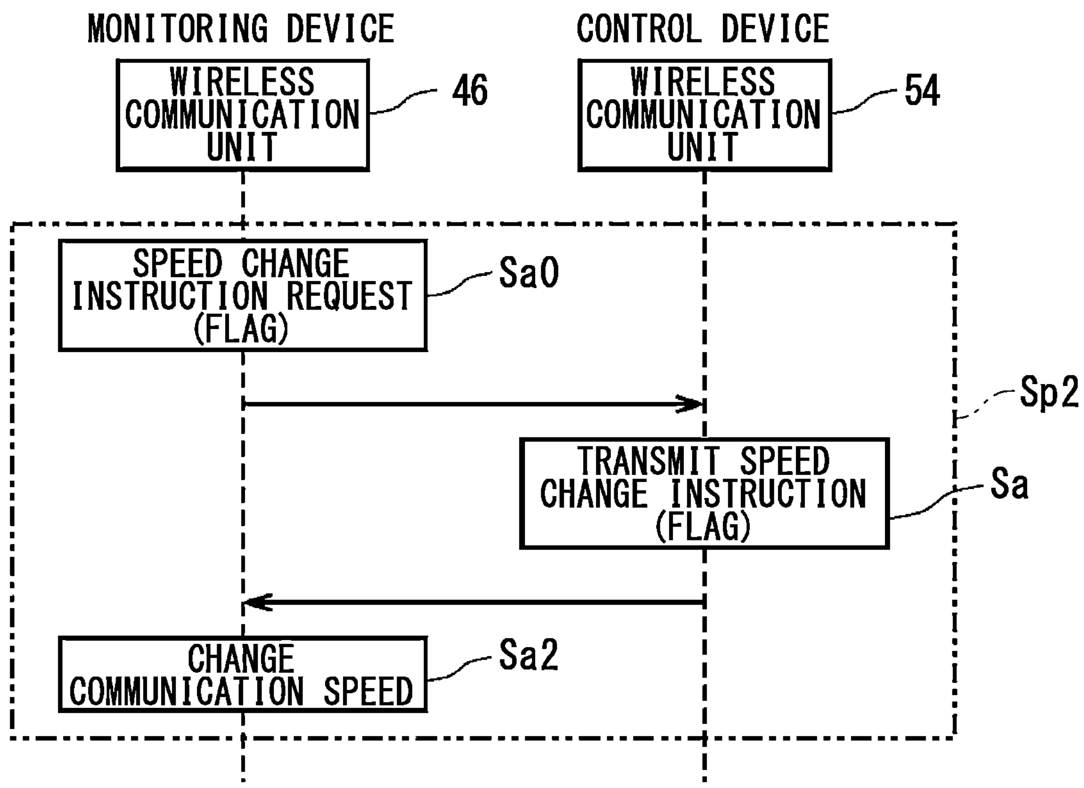
FIG. 20 is a sequence diagram schematically showing a method for changing a communication speed in Modification 4 of the third embodiment.

In the above description, the wireless communication unit 54 of the control device 50 is a subject of a speed instruction and executes the speed change process Sp1. However, the invention is not limited thereto. In addition, instead of the speed change process Sp1, as shown in FIG. 20, a speed change process Sp2 may be executed so that the wireless communication unit 46 of the monitoring device 40 becomes a subject requesting a speed instruction.

That is, in the speed change process Sp2, the wireless communication unit 46 of the monitoring device 40 transmits a speed change instruction request Sa0 for changing from a low speed to a high speed to the wireless communication unit 54 of the control device 50. The wireless communication unit 54 of the control device 50 receives the speed change instruction request Sa0 from the wireless communication unit 46 of the monitoring device 40. Then, the wireless communication unit 54 of the control device 50 transmits the speed change instruction Sa to the wireless communication unit 46 of the monitoring device 40. The wireless communication unit 46 of the monitoring device 40 changes the communication speed from a low speed to a high speed. Accordingly, a similar speed change as the speed change process Sp1 of the above-described embodiment can be executed.

According to the present embodiment, the communication speed can be changed between the wireless communication unit 54 of the control device 50 and the wireless communication unit 46 of the monitoring device 40 even in the battery monitoring system 1 that communicates the non-battery information and the battery information together in the channel group including the same one or more channels.

According to the present embodiment, when the detection request S22*a* is transmitted to establish a connection with the wireless communication unit 54 of the control device 50 without synchronization, after the detection request S22*a* is transmitted and the synchronization is performed, a signal necessary for the connection process is transmitted at a speed lower than the communication speed. As a result, similar effects as those of the above-described embodiments can be obtained.

According to the present embodiment, when the wireless communication unit 54 of the control device 50 receives the detection request S22*a* transmitted from the wireless communication unit 46 of the monitoring device 40 to establish a connection in a non-synchronous manner with the wireless communication unit 46 of the monitoring device 40, the wireless communication unit 54 of the control device 50 receives the detection request S22*a* from the wireless communication unit 46 of the monitoring device 40, performs synchronization, and then performs reception at a speed lower than the communication speed when receiving a signal necessary for the connection process. As a result, similar effects as those of the above-described embodiments can be obtained.

Fourth Embodiment

A fourth embodiment is to be described with reference to FIG. 21. In the present embodiment, as a specific example of the third embodiment, a mode in which a wireless communication unit 54 of a control device 50 subjectively changes a communication speed with wireless communication units 46 of multiple monitoring devices 40 is to be described. In the following description, transmission of information from the control device 50 to the multiple monitoring devices 40 is referred to as downlink communication, and transmission of information from the monitoring device 40 to the control device 50 is referred to as uplink communication.

The wireless communication unit 54 of the control device 50 is configured to individually communicate with the multiple monitoring devices 40. The wireless communication unit 54 of the control device 50 is configured to individually switch a communication speed from the wireless communication unit 46 of the monitoring device 40 to the wireless communication unit 54 of the control device 50. If the wireless communication unit 54 of the control device 50 has a function of subjectively instructing switching of the communication speed, the communication speed can be individually switched for each monitoring device 40 by performing unicast communication, for example. When the wireless communication unit 54 of the control device 50 is capable of subjectively switching and controlling the communication speed, as shown in a speed change instruction Sa in FIG. 21, for example, it is also possible to instruct the wireless communication units 46 of all the multiple monitoring devices 40 to change the communication speed simultaneously by performing broadcast communication. The communication speed from the wireless communication unit 54 of the control device 50 to the wireless communication unit 46 of the monitoring device 40 may be individually changed and switched. That is, the communication speed between the wireless communication unit 54 and the wireless communication unit 46 may be changeable or switchable in any direction.

It is preferable that the wireless communication unit 54 of the control device 50 switches communication from the monitoring device 40 that completes a connection process S100 to communication of battery information, continues the communication, and executes periodic communication processing S200, for example. The wireless communication unit 54 of the control device 50 sequentially switches to the high-speed communication from the monitoring device 40 that completes the connection process S100. Therefore, compared with a configuration in which the communication is simultaneously switched to high-speed communication after connection processes of all the monitoring devices 40 are completed, the wireless communication unit 54 is less likely to be affected by radio wave interference due to diffused reflection of a radio wave inside the battery pack 11 formed of an electromagnetic reflection material. Accordingly, the communication speed can be suitably changed. After the connection processes of all the monitoring devices 40 are completed, all the monitoring devices 40 may be simultaneously switched to high-speed communication, as targets.

While the communication speed from the wireless communication unit 46 of another monitoring device 40 to the wireless communication unit 54 of the control device 50 is switched, it is preferable not to switch communication speeds from the wireless communication unit 54 of the control device 50 to the wireless communication units 46 of the other monitoring devices 40.

The downlink communication is one-to-many communication. To switch the communication speed with each monitoring device 40, switching control is performed for each monitoring device 40. In contrast, in the present embodiment, it is preferable to perform communication without switching communication speed of downlink communication even while communication speed of uplink communication from multiple monitoring devices 40 to the control device 50 is switched. Therefore, it does not take time to complete the downlink communication for each monitoring device 40, and it is possible to start the battery monitoring early. As a result, the vehicle 10 can be started at a high speed, and discomfort of a user can be reduced.

Fifth Embodiment

Figure 22:
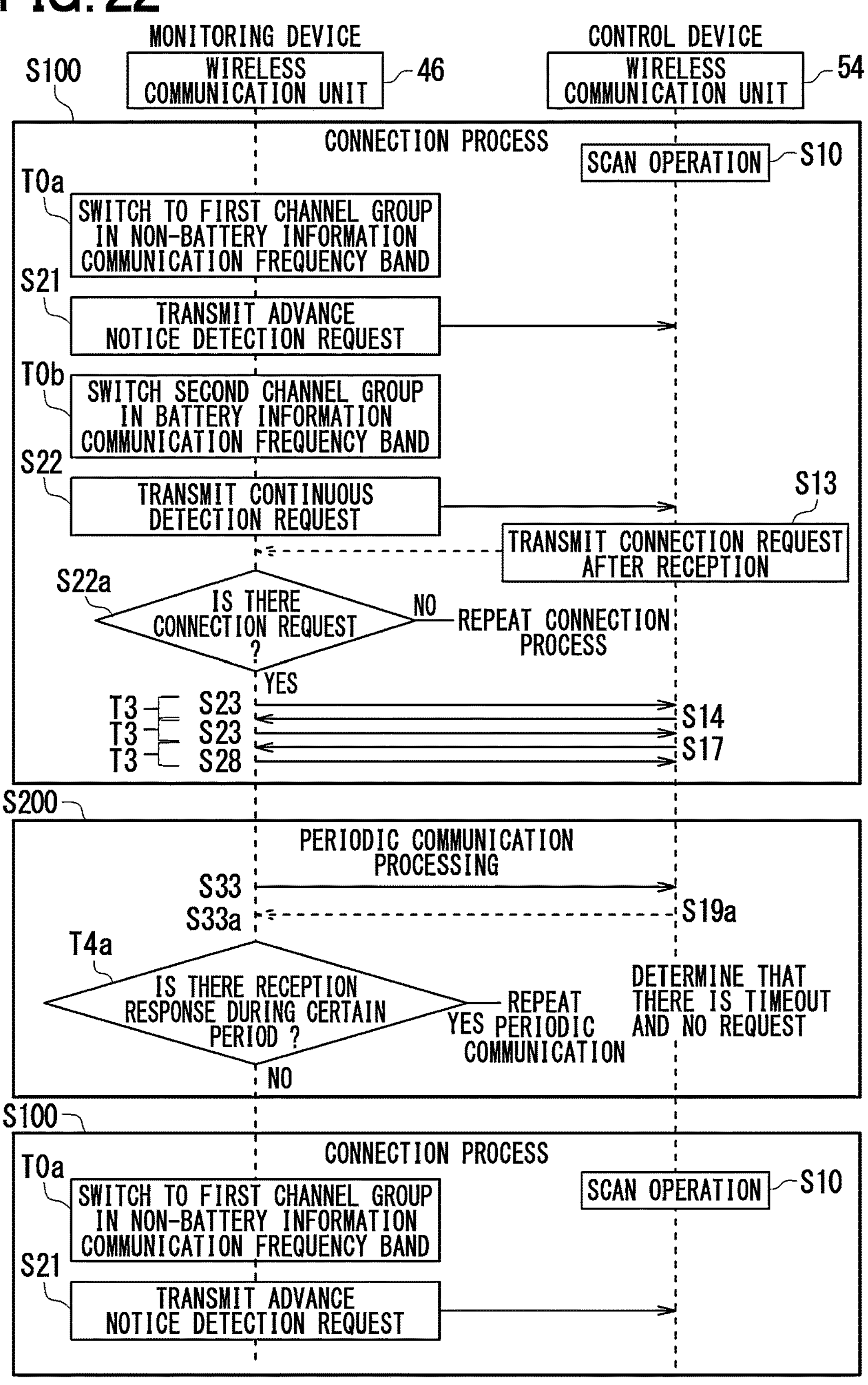
FIG. 22 is a sequence diagram (part 1) schematically showing a flow of communication in a fifth embodiment.

A fifth embodiment is to be described with reference to FIGS. 22 and 23. Since the present embodiment is a modification of the first or second embodiment, the configuration of the first or second embodiment will be applied and described, and portions different from the first or second embodiment are to be described. As described in the first and second embodiments, as shown in FIG. 22, a wireless communication unit 46 of a monitoring device 40 switches to and sets a first channel group in a non-battery information communication frequency band (T0*a*) and transmits an advance notice detection request S21 in a non-synchronization process of a connection process S100.

Thereafter, the wireless communication unit 46 of the monitoring device 40 switches to and sets a second channel group in a battery information communication frequency band (T0*b*) and transmits a continuous detection request S22. When a connection request S13 is received (YES in S22*a*), the wireless communication unit 46 of the monitoring device 40 considers that synchronization is established, and then proceeds to periodic communication processing S200 through a connection process T3.

In the periodic communication processing S200 described in the first or second embodiment, the wireless communication unit 46 of the monitoring device 40 communicates battery information with a wireless communication unit 54 of a control device 50 using the second channel group in the battery information communication frequency band (S33).

At this time, when the wireless communication unit 46 of the monitoring device 40 does not receive its own battery information from the wireless communication unit 54 of the control device 50, it is preferable that the wireless communication unit 46 of the monitoring device 40 switches from the second channel group in the battery information communication frequency band to the first channel group in the non-battery information communication frequency band and executes the connection process S100 with the wireless communication unit 54 of the control device 50.

For example, when communication becomes impossible due to an influence such as deterioration of a radio wave propagation environment, the battery information may not be received by the wireless communication unit 54 of the control device 50. In this case, the wireless communication unit 46 of the monitoring device 40 starts a timer at a timing when the battery information is transmitted in S33, and waits while measuring a certain period.

When a reception response S33*a* for the battery information is not received and the reception cannot be confirmed after the certain period elapses in T4*a*, the wireless communication unit 46 of the monitoring device 40 determines that the battery information is not received and determines that unintended communication interruption occurs. In this case, the wireless communication unit 46 of the monitoring device 40 switches from the second channel group in the battery information communication frequency band to the first channel group in the non-battery information communication frequency band, and executes the connection process S100 with the wireless communication unit 54 of the control device 50. Accordingly, it is possible to recover from the unintended communication interruption.

When a host ECU 16 detects that an ignition switch is off and the control device 50 recognizes that the ignition switch is off, communication interruption may occur based on an external interrupt factor caused by an external user operation or the like. In this case as well, when the reception response S33*a* for the battery information is not received and the reception cannot be confirmed after the certain period elapses in T4*a*, the wireless communication unit 46 of the monitoring device 40 determines that the battery information is not received.

The wireless communication unit 46 of the monitoring device 40 switches from the second channel group in the battery information communication frequency band to the first channel group in the non-battery information communication frequency band, and executes a connection process with the wireless communication unit 54 of the control device 50. Accordingly, the connection establishment can be recovered from unintended communication interruption. As a result, when there is a monitoring device 40 that cannot receive an important cell voltage in the battery information in a certain period, by transmitting the advance notice detection request S21 using the first channel group in the non-battery information communication frequency band, the connection process S100 can be reliably executed and reconnection can be executed with high probability.

Figure 23:
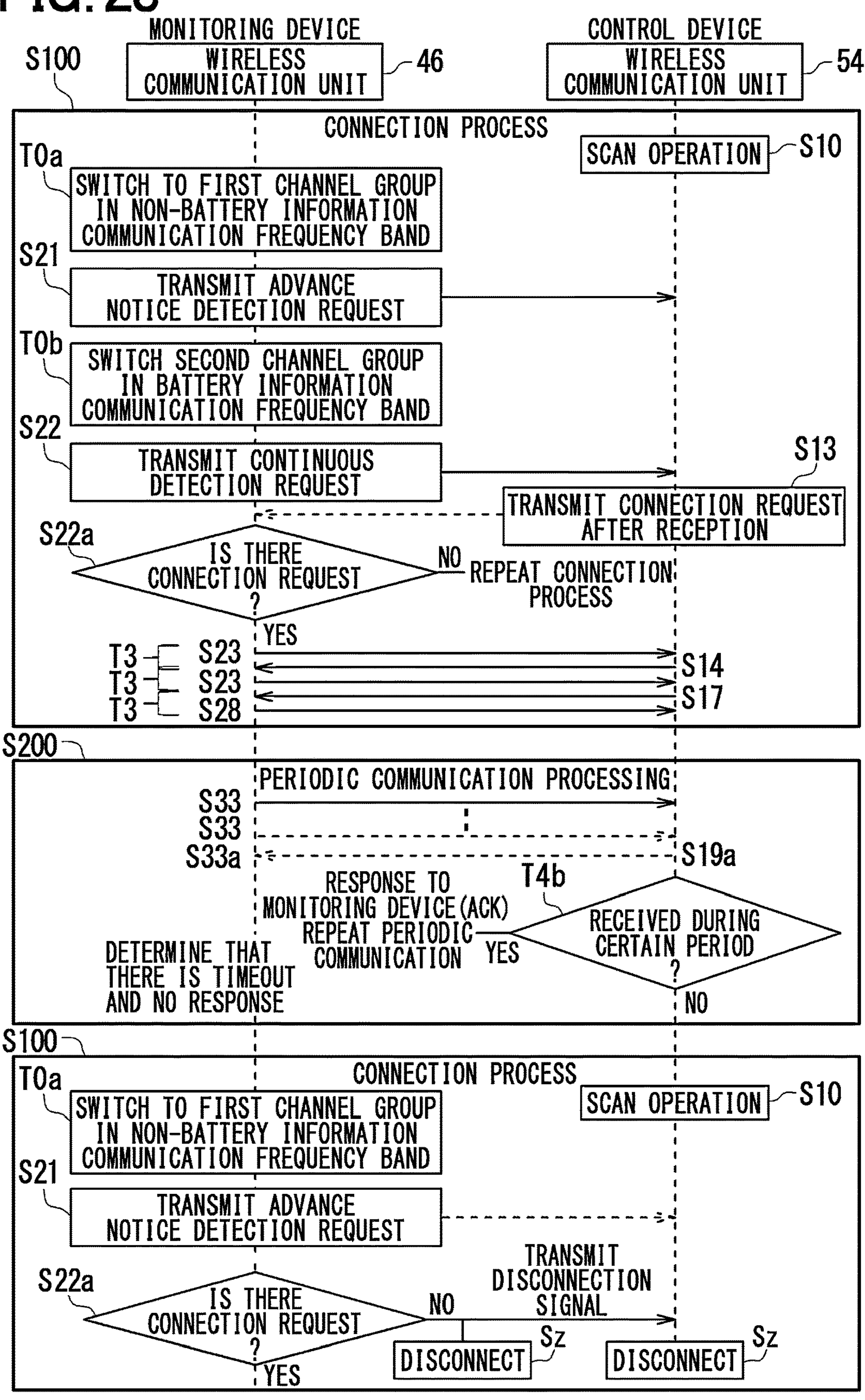
FIG. 23 is a sequence diagram (part 2) schematically showing the flow of communication.

In another example, the similar applies to a case where, as in the periodic communication processing S200 shown in FIG. 23, when the wireless communication unit 54 of the control device 50 receives a cell voltage of assembled batteries 12 as battery information from the wireless communication unit 46 of the monitoring device 40, the battery information on the cell voltage is not received from the wireless communication unit 46 of the monitoring device 40 in a certain period. In this case, it is preferable that the wireless communication unit 54 of the control device 50 executes the connection process S100 with the wireless communication unit 46 of the monitoring device 40 at a speed lower than a communication speed of the battery information with the wireless communication unit 46 of the monitoring device 40 other than the monitoring device 40 that does not receive the cell voltage.

If the wireless communication unit 54 of the control device 50 does not receive the cell voltage as the battery information, the monitoring-device-40-side wireless communication unit 46 does not transmit a reception response S19*a*. The similar applies to a case where although the wireless communication unit 54 of the control device 50 transmits the reception response S19*a*, the monitoring-device-40-side wireless communication unit 46 cannot receive the reception response S33*a*. In any case, since the wireless communication unit 46 of the monitoring device 40 does not receive the reception response S33*a*, the wireless communication unit 46 determines that there is a timeout or no response, and proceeds to the connection process S100.

In the battery information, a cell voltage of a battery cell 22 is particularly important information. When the communication of the battery information is difficult, it is preferable to decrease the communication speed to reliably transmit the cell voltage. As described in the present embodiment, it is preferable that the wireless communication unit 54 of the control device 50 executes the connection process S100 to slow down the communication speed when a session connection is disconnected due to not being able to receive data during a certain period at T4*b*. By executing the process in this manner, it is possible to increase reliability of establishing the connection of the communication between the wireless communication unit 46 of the monitoring device 40 and the wireless communication unit 54 of the control device 50. As a result, it is possible to reliably transmit particularly important cell voltage information in the battery information.

Further, when the wireless communication unit 46 of the monitoring device 40 cannot establish communication without being received by the control device 50 even when the advance notice detection request S21 is retransmitted, and further cannot establish communication even after waiting for a predetermined certain period, and a timeout occurs, as shown in FIG. 23, a disconnection signal for spontaneously disconnecting the connection process S100 may be transmitted to execute a disconnection process Sz.

The wireless communication unit 46 of a specific monitoring device 40 may transmit the battery information to the wireless communication unit 54 of the control device 50 via the wireless communication unit 46 of the monitoring device 40 other than the self monitoring device 40. In this case, since a signal transmission path length is large, it is desirable to perform high-speed communication rather than low-speed communication.

Sixth Embodiment

A sixth embodiment is to be described with reference to FIGS. 24 and 25. Since the present embodiment is a modification of the first or second embodiment, the configuration of the first or second embodiment will be applied and described, and portions different from the first embodiment are to be described.

Equalization Control

While an ignition switch is off, a control device 50 executes equalization control for equalizing cell voltages of battery cells 22 constituting a battery module 20 of assembled batteries 12.

A main microcomputer 53 of the control device 50 has a function as an equalization control unit 53*a*, measures a time cycle for equalization control using a timer, is periodically restored from a sleep state, and executes equalization control over the assembled batteries 12. A monitoring device 40 includes an equalization circuit (not illustrated) for equalizing the cell voltages of the battery cells 22.

Figure 24:
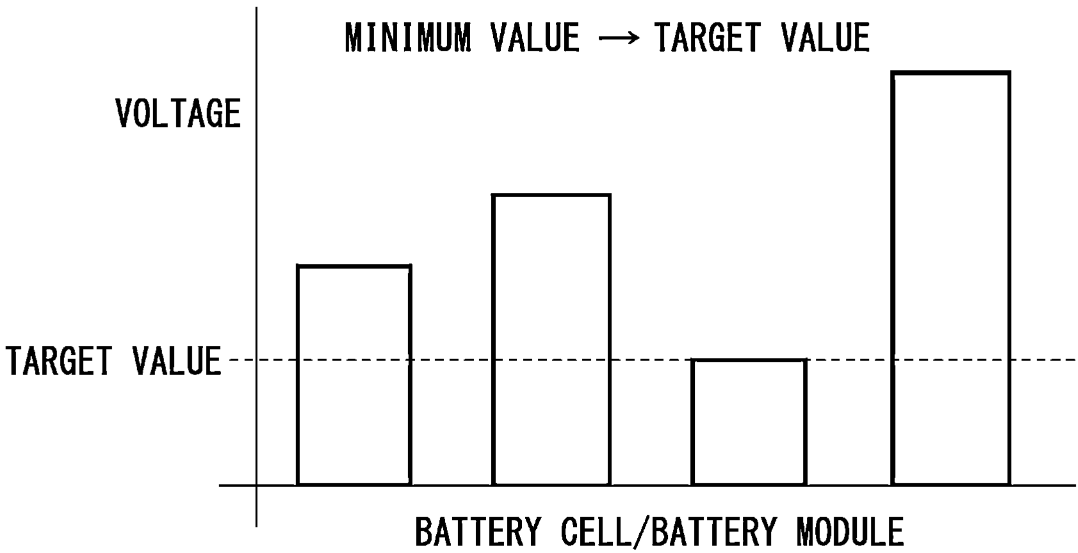
FIG. 24 is a diagram (part 1) illustrating a cell voltage equalization method shown in a sixth embodiment.
Figure 25:
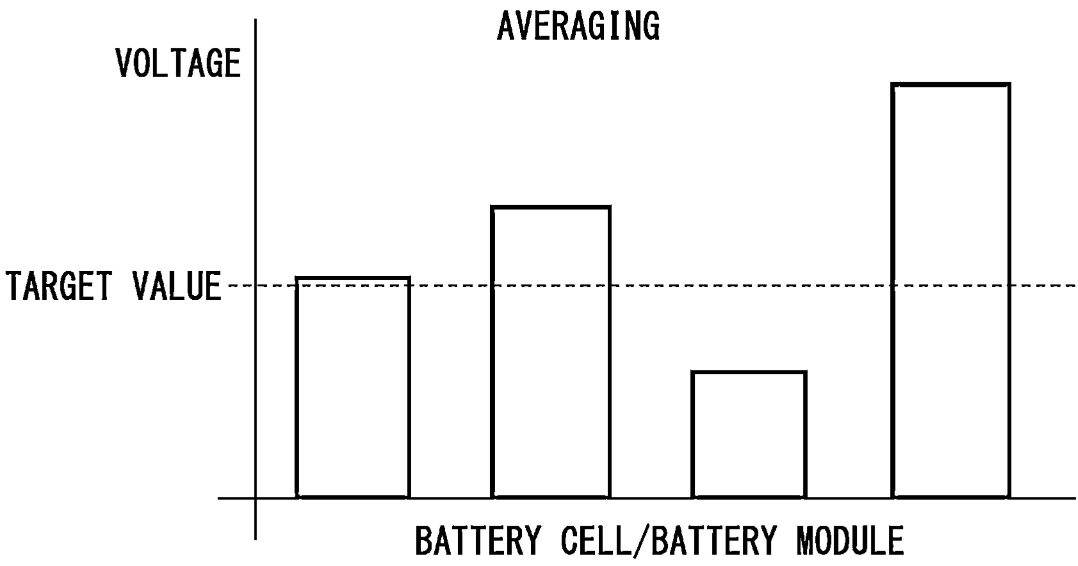
FIG. 25 is a diagram (part 2) illustrating the cell voltage equalization method.

When the main microcomputer 53 receives battery information on a cell voltage from the monitoring device 40, as shown in FIG. 24, the main microcomputer 53 determines a voltage with the lowest voltage value of the cell voltage as a target value and executes equalization control. When the main microcomputer 53 receives the battery information on the cell voltage from the monitoring device 40, as shown in FIG. 25, the main microcomputer 53 may calculate an average value of voltage values of cell voltages, determine the average value as the target value, and execute the equalization control. When the equalization control ends, the control device 50 returns to a sleep mode.

A mode is shown in which the control device 50 returns to the sleep mode when the equalization control ends, but the invention is not limited thereto. In addition, the control device 50 may receive a state of the cell voltage of the battery cell 22/the battery module 20 from the monitoring device 40, and may sleep after confirming that discharging or charging of the battery cell 22/the battery module 20 farthest from the target value of the cell voltage is completed.

The control device 50 may sleep after transmitting a signal indicating the target value to each battery cell 22/battery module 20. The main microcomputer 53 of the control device 50 may issue an acquisition instruction of battery information on the battery cell 22/battery module 20 after the equalization control by the equalization control unit 53*a*, and may sleep after confirming the battery information.

While the ignition switch is off, it is desirable to communicate information having a small data amount at a relatively low speed. This is to reduce an error rate per communication. However, when the control device 50 performs the equalization control, the wireless communication unit 46 of the monitoring device 40 transmits a transmission data amount of the battery information such as the cell voltage of the battery cell 22 to the wireless communication unit 54 of the control device 50, and the control device 50 collects the battery information as a target.

The control device 50 transmits information indicating that the battery information is collected to a host ECU 16. The host ECU 16 outputs an equalization instruction based on the collected information to the monitoring device 40 through the control device 50. Accordingly, the monitoring device 40 is capable of performing equalization of the cell voltages of the battery cells 22. Therefore, in order to increase a frequency of an equalization process and to increase reliability of the assembled batteries 12, it is preferable to increase a transmission data amount per unit time of the transmission data amount of the battery information as much as possible.

In the wireless communication unit 54 of the control device 50, it is desirable that a communication speed at which the battery information is received from the wireless communication unit 46 of the monitoring device 40 during the equalization process for commanding the equalization process when a vehicle 10 is in a stop state is higher than a speed at which an advance notice detection request S21 is received from the wireless communication unit 46 of the monitoring device 40 when the vehicle 10 is in the stop state. Then, the host ECU 16 is capable of quickly outputting an equalization instruction based on the information, an execution frequency of the equalization process can be increased, and operation reliability of the assembled batteries 12 can be increased.

When the equalization process is executed, it is preferable to increase a communication speed by increasing the number of times of communication per unit time that the wireless communication unit 46 of the monitoring device 40 transmits to the wireless communication unit 54 of the control device 50. Then, it is possible to increase the execution frequency of the equalization process per unit time, and to improve system reliability in an entire battery monitoring system 1.

Even when the vehicle 10 is in a stop state, when the vehicle 10 needs battery monitoring for equalization, it is desirable to perform communication at a high communication speed. A case where a monitoring process for the assembled batteries 12 is required is not limited to the above-described case. Therefore, when the monitoring process for the assembled batteries 12 is required, it is desirable to enable high-speed communication of battery information.

For example, when a HEMS (not illustrated) is connected to the battery monitoring system 1 in a wired or wireless manner, a trigger indicating that battery monitoring is necessary may be given from an external HEMS. HEMS is an abbreviation for a home energy management system.

The HEMS periodically outputs a start trigger to the control device 50 through the host ECU 16 of the vehicle 10. The control device 50 is capable of starting the vehicle 10 by acquiring the battery information from the monitoring device 40. At this time, as described in the above-described embodiment, it is desirable to perform high-speed communication of the battery information while adjusting a communication speed in a connection process S100 and periodic communication processing S200.

Seventh Embodiment

Figure 26:
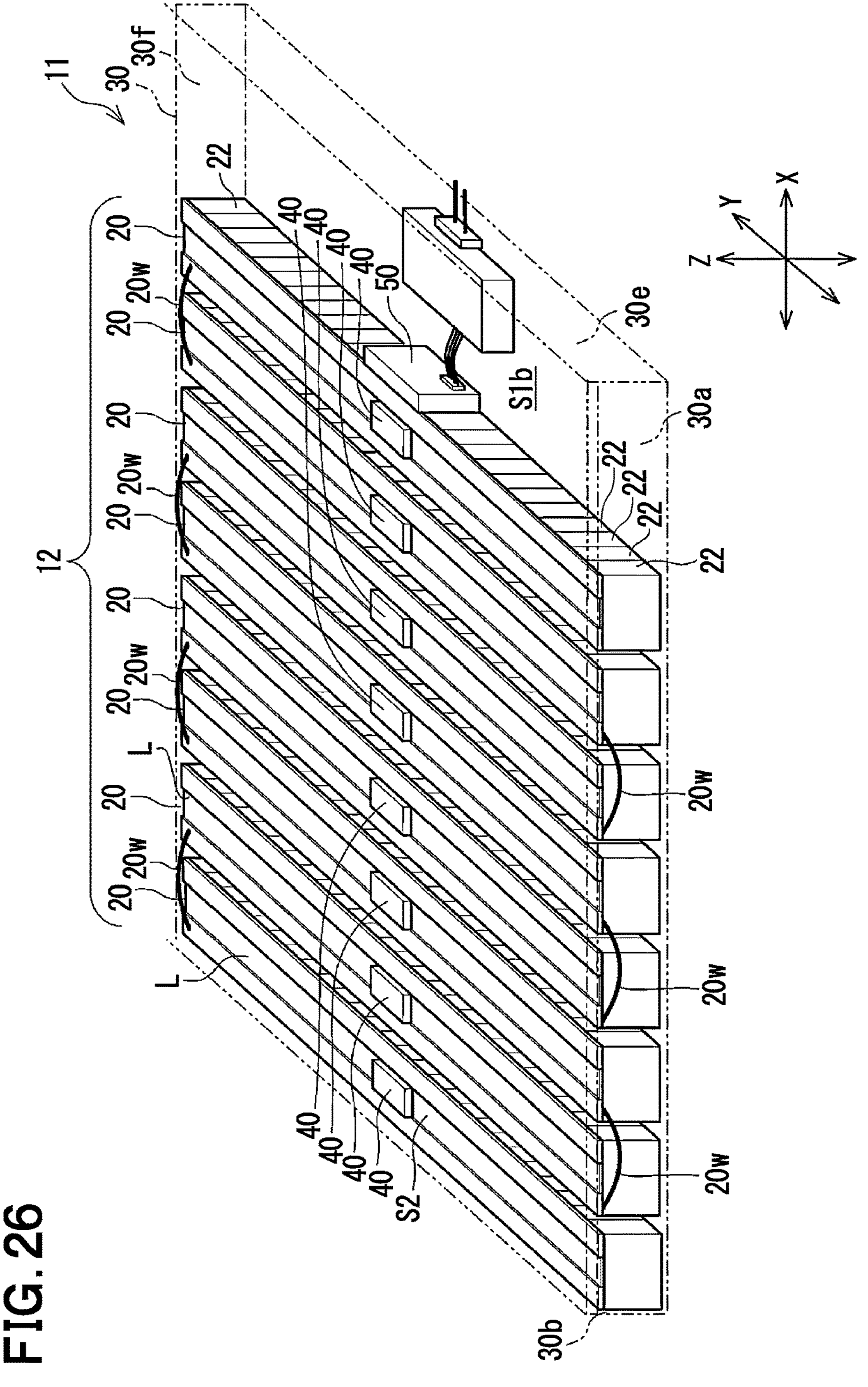
FIG. 26 is a perspective view schematically showing a structure of a battery pack in a seventh embodiment.

A seventh embodiment is to be described with reference to FIG. 26. As shown in FIG. 26, a monitoring device 40 may be disposed on an upper surface of each of multiple battery modules 20. The monitoring device 40 is disposed at an intermediate point of the battery module 20 extending in a Y-direction, and connects detection lines L in both directions in the Y-direction. FIG. 26 shows a mode in which the monitoring device 40 is disposed at a center position in the Y-direction on an upper surface of the battery module 20. However, the monitoring device 40 may not necessarily be disposed at a center in the Y direction. A position is not limited to the center in the Y-direction and may be any position as long as it is an intermediate point in the Y-direction.

The monitoring devices 40 is mounted with a battery monitoring unit 44, and is implemented by connecting the detection line L to the battery monitoring unit 44. The battery monitoring unit 44 includes an integrated circuit device including one or more monitoring ICs. The battery monitoring unit 44 is capable of detecting voltages of multiple battery cells 22 of the battery module 20 by the detection line L. An upper end of the monitoring device 40 protrudes further than an upper end of a busbar cover 27 in a Z-direction.

Similarly to the above-described embodiment, a control device 50 includes a wireless communication unit 54, and the monitoring device 40 includes a wireless communication unit 46. A housing 30 has a gap at an upper inner end in the Z-direction, and the gap is provided as a wireless propagation space S2. The control device 50 is capable of performing wireless communication with multiple monitoring devices 40 via the propagation space S2. If the wireless communication unit 54 of the control device 50 can directly communicate with the wireless communication units 46 of the multiple monitoring devices 40, it is possible to maintain a good wireless propagation environment.

Since the monitoring device 40 protrudes further than the upper end of the busbar cover 27, by propagating a radio in the propagation space S2 above the upper end of the busbar cover 27, communication between the control device 50 and the monitoring device 40 becomes easier. According to the present embodiment, since the monitoring device 40 does not need to be disposed on a side surface of the battery module 20 in the Y-direction, it is possible to reduce a width of the housing 30 in the Y-direction and reduce a size of the housing 30.

Eighth Embodiment

Figure 27:
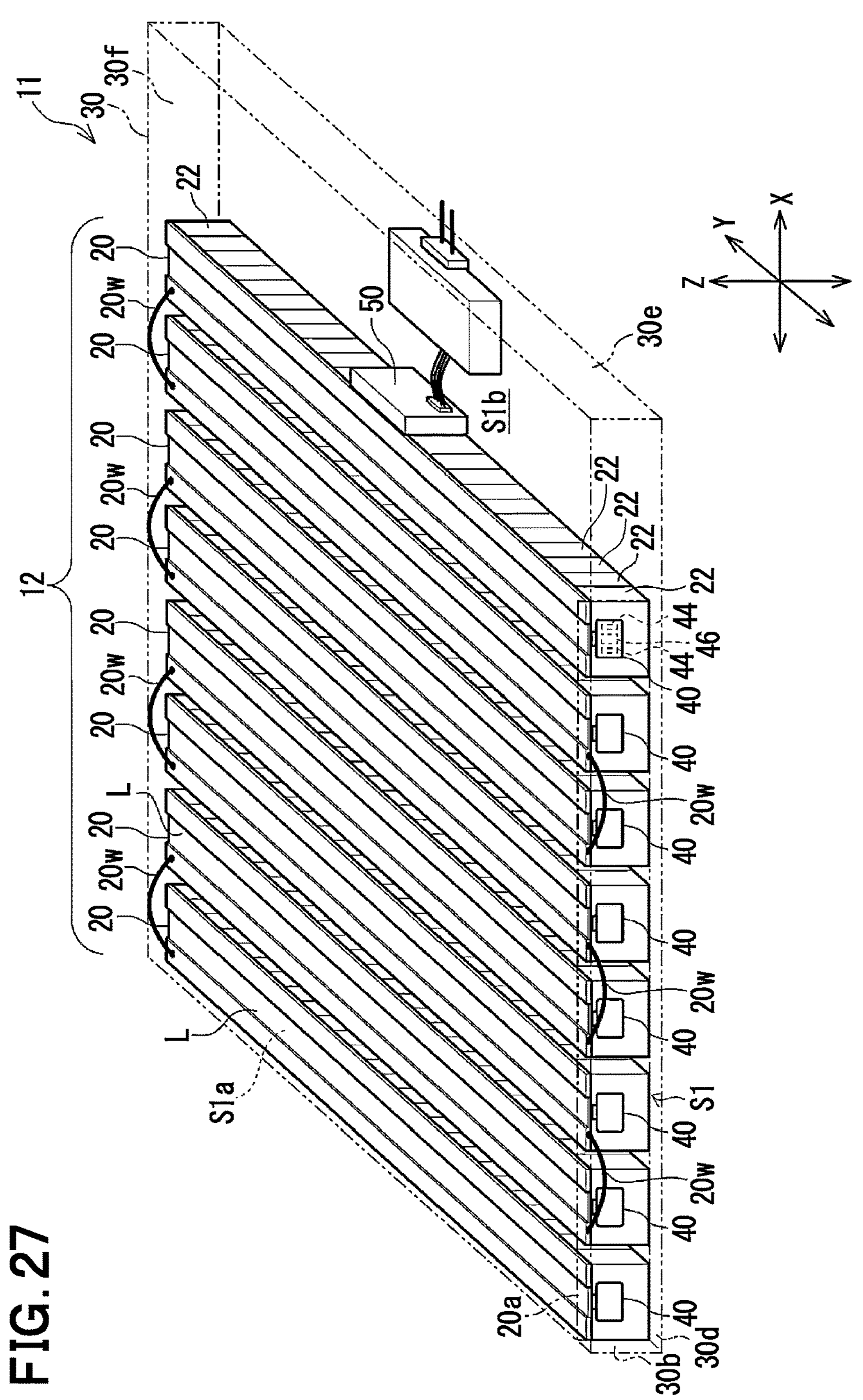
FIG. 27 is a perspective view schematically showing a structure of a battery pack in an eighth embodiment.

An eighth embodiment is to be described with reference to FIG. 27. As shown in FIG. 27, a monitoring device 40 is disposed along a side surface of each battery module 20 in a Y-direction. The monitoring device 40 includes a wireless communication unit 46 and a battery monitoring unit 44, and the battery monitoring unit 44 is connected to a detection line L. Multiple battery monitoring units 44 may be provided in each monitoring device 40. The battery monitoring unit 44 is connected to one end of the detection line L extending in the Y-direction. Accordingly, a voltage of a battery cell 22 can be detected.

As in the first embodiment, a space S1 is provided at an inner side of a first wall surface 30*a* of a housing 30. A wireless communication unit 54 of a control device 50 is capable of performing wireless communication with the wireless communication units 46 of the multiple monitoring devices 40 by using the space S1 as a pseudo waveguide space. The multiple monitoring devices 40 are disposed periodically (for example, at equal intervals) along an X-direction. Even in such a disposition mode of the eighth embodiment, it is possible to perform disposition while reducing a height as in the first embodiment described above.

Ninth Embodiment

Figure 28:
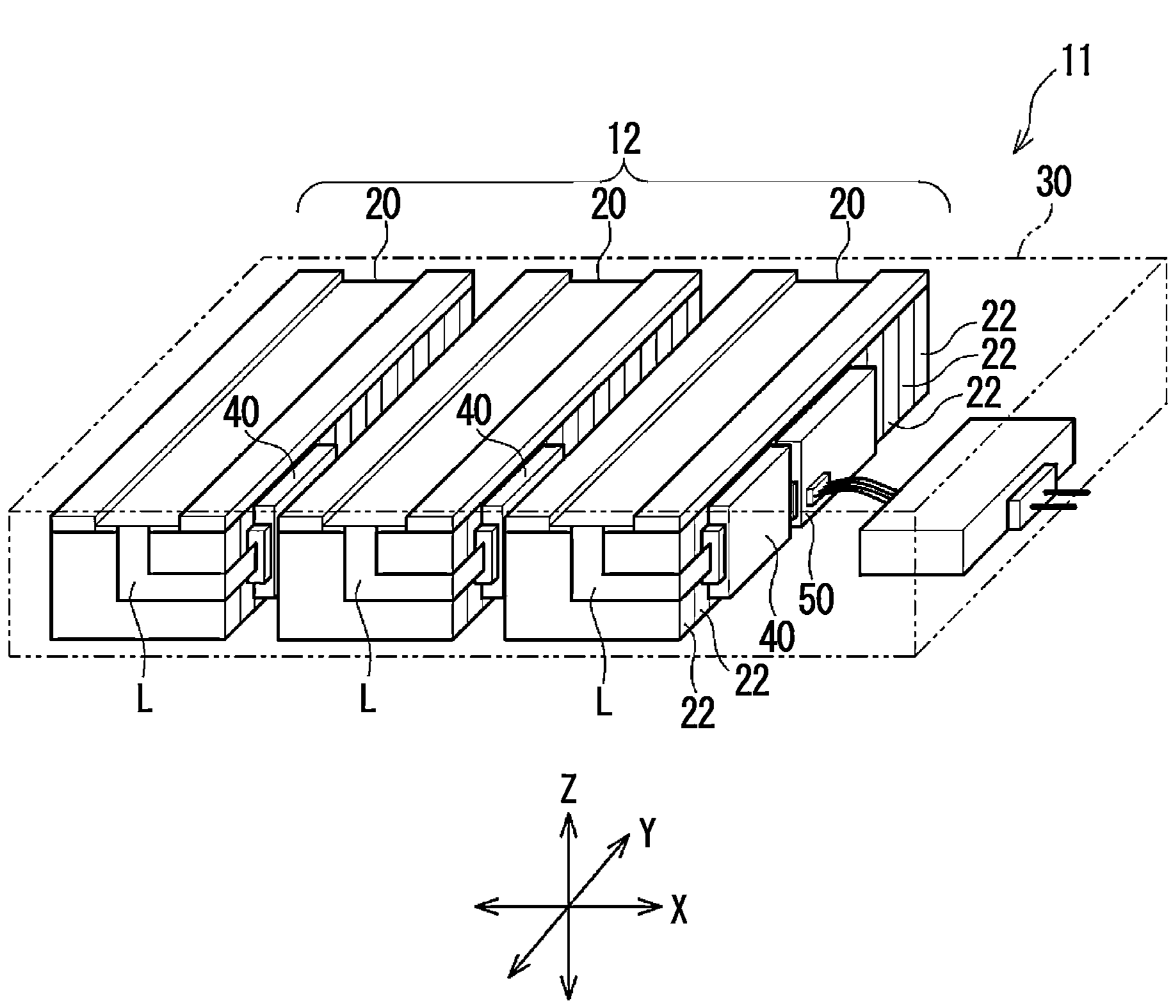
FIG. 28 is a perspective view schematically showing a structure of a battery pack in a ninth embodiment.

A ninth embodiment is to be described with reference to FIG. 28. As shown in FIG. 28, a monitoring device 40 may be disposed along a side surface of a battery module 20 in an X-direction. A detection line L is disposed along an upper surface of the battery module 20, and extends to the side surface in the X-direction via a side surface of the battery module 20 in a Y-direction in an L shape, and is further connected to the monitoring device 40 on the side surface in the X-direction along the Y-direction.

Similarly to the above-described embodiment, a control device 50 is wirelessly connected to the multiple monitoring devices 40. Even in such a disposition mode of the ninth embodiment, it is possible to make a configuration while reducing a height as in the first embodiment described above. According to the present embodiment, since the monitoring device 40 does not need to be disposed on the side surface of the battery module 20 in the Y-direction, it is possible to reduce a width of a housing 30 in the Y-direction and reduce a size of the housing 30.

In addition, since the monitoring device 40 does not need to be disposed on the upper surface of the battery module 20, a height of the housing 30 in a Z-direction can be reduced, and the size of the housing 30 can be reduced. When a communication connection environment between the control device 50 and the multiple monitoring devices 40 is emphasized, it is preferable to provide the space S1 or S2 shown in the above-described embodiment at an end of the housing 30 in the Y-direction or an upper end of the housing 30 in the Z-direction.

Tenth Embodiment

In the above-described embodiment, a mode is shown in which the battery monitoring system 1 is mounted on the vehicle 10. However, the invention is not limited to the system mounted on the vehicle 10. The invention may be applied to a stationary battery monitoring system 1 fixed outdoors or indoors. For example, the battery monitoring system 1 may be configured in which a control device 50 built in a battery replacement station, a battery rack, or the like and a monitoring device 40 wirelessly communicate with each other.

Therefore, according to the above-described embodiment, the communication speed is changed according to a state and a setting mode of the vehicle 10, and the mode is applied to the communication in the vehicle 10. However, the disclosure of the present application is not limited to use of mounting on the vehicle 10, and can also be applied to the battery monitoring system 1 using a stationary battery rack.

The stationary battery rack is disposed in a facility such as a house or a factory, and is connected to a household alternating current power supply or a power supply unit of the facility. A replaceable battery can be charged by the power supply unit supplying power supply to a replaceable battery of the vehicle 10 such as the electric vehicle 10 or an electric two-wheeled vehicle.

Therefore, a method in the above-described embodiment may be applied by mounting a technical configuration of the monitoring device 40 described in the above-described embodiment on a replacement battery and mounting a technical configuration of the control device 50 on a battery rack. As a communication method between the replacement battery and the battery rack, wired communication or wireless communication may be applied. Therefore, communication between the wireless communication unit 46 of the monitoring device 40 and the wireless communication unit 54 of the control device 50 is not limited to wireless communication, and may be wired communication.

When a battery module 20 is mounted on a stationary battery rack, the technical configuration of the described monitoring device 40 in the above-described embodiment may be mounted on the battery rack. In this case, in addition to the battery rack, the technical configuration of the control device 50 (ECU) may be mounted inside a home or factory separately from the battery rack. According to such a method, similar effects as those of the above-described embodiment can be obtained.

Hereinafter, a specific example thereof is to be described. The replaceable battery is attached to an electric vehicle 10 or the like and used as a driving power supply. When the replaceable battery is removed from the vehicle 10 by a user and accommodated in the battery rack, charging of the replaceable battery is started. When the control device 50 is mounted on the battery rack and the monitoring device 40 is mounted on the replaceable battery, the control device 50 on the battery rack is capable of monitoring a battery state of the replaceable battery by communicating with the monitoring device 40 on the replaceable battery. When the replaceable battery is accommodated in the battery rack for a long period, a lifetime of the replaceable battery is deteriorated. The battery rack is capable of monitoring a deterioration state of the replaceable battery and periodically grasping the battery state.

Assembled batteries 12 are mounted on the replaceable battery, and a battery ID is allocated to a battery module 20 of the battery pack 12. By allocating the battery ID to the battery module 20, a disposition location of the battery module 20 can be accurately grasped, and maintenance can be favorably performed at the time of failure.

At this time, the above-described control device 50 (also referred to as a battery management unit (BMU) or the like) that functions as a master may allocate a battery ID to each battery module 20, or a slave (for example, above-described monitoring device 40 or also referred to as a provisioning device) other than the master may allocate a battery ID to each battery module 20.

At this time, either the master or the slave detects whether the battery module 20 is replaced by detecting a contact point with the battery module 20 of the assembled batteries 12 on the replaceable battery. After the battery replacement is detected, the battery replacement may be notified to an external device (not illustrated) such as an external server, displayed on another display device (not illustrated), or a warning may be sounded. Accordingly, an abnormality such as theft can be detected.

OTHER EMBODIMENTS

For example, modifications and expansion described below can be performed without being limited to the above-described embodiment.

In the above-described embodiment, a mode is described in which, generally, the control device 50 operates as a master and the monitoring device 40 operates as a slave. Conversely, a mode may be applied in which the monitoring device 40 operates as a master and the control device 50 operates as a slave. That is, a master-slave relationship between the control device 50 and the monitoring device 40 is not limited to the above-described embodiment. The control device 50 may be a slave, and the monitoring device 40 may be a master.

Start information for a startup is not limited to on information on an ignition switch. For example, in addition to the on information on the ignition switch, unlocking information on a driver's seat, seating information on a driver's seat, unlocking information on a key switch, or the like may be used as the start information on the vehicle 10, or a startup may be detected by combining these pieces of information.

In the above-described embodiment, an example is shown in which the battery monitoring system 1 network-connects the multiple monitoring devices 40 centered around the control device 50 in a star shape, and enables packet communication. However, network topology between the control device 50 and the monitoring device 40 is not limited to such an example.

The control device 50 and the monitoring device 40 may form a mesh network. A network may be implemented by mixing at least two of a star-connection network, a mesh network, and a daisy chain network may be mixed. A network configuration applies a configuration in which multiple monitoring devices 40 are grouped and connected by wire to form one network, and the grouped monitoring devices 40 function as one device. The mesh network at this time is implemented by topology in which the control device 50 and the multiple groups of monitoring devices 40 are formed as a network. The network configuration may be applied.

The control device 50 and the monitoring device 40 may be connected via a daisy chain network. A network may be implemented by mixing at least two of a star-shaped network, a mesh network, and a daisy chain network. A mode is shown in which the control device 50 and the monitoring device 40 constitute a wireless connection network. However, a wired connection network may be mixed. Thus, the network topology of the control device 50 and the monitoring device 40 is not particularly limited.

For example, a wireless communication unit 46 may have a hardware configuration in which functions are divided into a wireless transmission unit and a wireless receiving unit. The monitoring device 40 may not include a microcomputer 45. That is, the wireless communication unit 46 may include only a wireless IC, and may be configured to be communicably connected to a battery monitoring unit 44. Sensing control and schedule control over self-diagnosis by the battery monitoring unit 44 may be executed by a main microcomputer 53 of the control device 50.

The main microcomputer 53 of the control device 50 estimates an internal resistance and an open-circuit voltage of the battery cell 22 based on a cell voltage and a cell current, and calculates SOH based on the estimated internal resistance and open-circuit voltage. However, the estimation of the internal resistance, the estimation of the open-circuit voltage, and the calculation of the SOH are not limited to such an example. For example, some or all of the processes of estimating the internal resistance, estimating the open-circuit voltage, and calculating the SOH may be performed in the monitoring device 40, for example, by the wireless communication unit 46.

An example in which the monitoring device 40 acquires battery-related information based on an acquisition request from the control device 50 is described, but the invention is not limited thereto. The monitoring device 40 may autonomously acquire the battery-related information and transmit the stored battery-related information to the control device 50 based on a transmission request from the control device 50.

In the above-described embodiment, an example is shown in which the multiple monitoring devices 40 centered around the control device 50 are wirelessly network-connected in a star shape. However, network topology between the control device 50 and the monitoring device 40 is not limited to such an example. A wired connection network may be mixed. Thus, the network topology of the control device 50 and the monitoring device 40 is not particularly limited.

A disposition and the number of the battery modules 20 and the battery cells 22 constituting the assembled batteries 12 are not limited to the above-described example. A disposition form of the monitoring device 40 and/or the control device 50 in a battery pack 11 is not limited to the above-described mode.

An example is described in which one control device 50 is in the battery pack 11. However, the invention is not limited thereto, and multiple control devices 50 may be provided. That is, the battery pack 11 may include multiple monitoring devices 40 and one or more control devices 50. The battery pack 11 may include multiple wireless communication systems constructed between the control device 50 and the multiple monitoring devices 40.

A mode is shown in which the monitoring device 40 includes one battery monitoring units 44. However, the invention is not limited to this, and the monitoring device 40 may include multiple battery monitoring units 44 (sensor ICs). The monitoring device 40 may not include the wireless communication unit 46. In this case, the main microcomputer 53 may constitute part of functions of the wireless communication unit 46.

An example is shown in which one monitoring device 40 is disposed for every two battery modules 20, but the invention is not limited thereto. For example, one monitoring device 40 may be disposed for three or more battery modules 20. For example, two or more monitoring devices 40 may be disposed for one battery module 20.

In the above-described embodiment, a mode is described in which one battery module 20 is set as one group, and multiple groups are disposed side by side and accommodated in the battery pack 11. However, the invention is not limited thereto. One group may not be provided with one battery module 20, one cell stack, and one battery block as a unit. The battery cells 22 obtained by dividing one battery module 20 may be considered as one group. For example, in a form of a cell to pack or a cell to chassis, the battery cells 22 may be packed and accommodated in the vehicle 10 without a module. In such a case, a collection including one or more battery cells 22 may be considered as a group.

The monitoring device 40 may be implemented across multiple groups of the battery cells 22. In this case, it is preferable that multiple battery monitoring units 44 are provided for each group. The monitoring device 40 may be provided for each group. In this case, it is preferable that the battery monitoring unit 44 is configured to monitor the battery cells 22 for each group. The number of battery cells 22 in each group may not be the same, and may be different for each group.

The control device 50, the monitoring device 40, the host ECU 16, and a method thereof described in the present disclosure may be implemented by a dedicated computer provided by including a memory and a processor programmed to execute one or more functions embodied in a computer program. Alternatively, the control device 50, the monitoring device 40, the host ECU 16, and the method thereof described in the present disclosure may be implemented by a dedicated computer provided by forming a processor with one or more dedicated hardware logic circuits.

Alternatively, the control device 50, the monitoring device 40, the host ECU 16, and the method thereof described in the present disclosure may be implemented by one or more dedicated computers formed by a combination of a memory and a processor programmed to execute one or more functions and a processor implemented by one or more hardware logic circuits. The computer program may be stored in a computer-readable non-transitory tangible recording medium as an instruction executed by a computer.

That is, means and/or functions provided by the processor or the like can be provided by software recorded in a tangible memory device, a computer that executes the software, only software, only hardware, or a combination thereof. For example, some or all of functions of the processor may be implemented as hardware. A mode of implementing a certain function as hardware includes a mode of implementing the certain function using one or more ICs or the like.

The processor may be implemented by using a CPU, an MPU, a GPU, or a DFP. DFP is an abbreviation for Data Flow Processor. The processor may be implemented by combining multiple types of calculation processing devices such as a CPU, an MPU, and a GPU. The processor may be implemented as a system on chip (SoC). SoC is an abbreviation for System on Chip.

Portions that execute the various processes described in the above-described embodiments may be implemented using hardware such as an FPGA or an ASIC. The various programs may be stored in a non-transitory tangible storage medium. As a storage medium for the program, various storage media such as an HDD, an SSD, a flash memory, and an SD card can be adopted. FPGA is an abbreviation for Field Programmable Gate Array. The HDD is an abbreviation for Hard disk Drive. SSD is an abbreviation for Solid State Drive. SD is an abbreviation for Secure Digital.

What is claimed is:

1. A monitoring device configured to monitor a state of a battery and transmit the state of the battery as battery information to a control device by wireless communication, the monitoring device comprising:

at least one of (i) a circuit and (ii) a processor with a memory storing computer program code executable by the processor, the at least one of the circuit and the processor being configured to cause the monitoring device to implement:

a monitoring-device-side communication unit configured to execute, before transmitting the battery information, a connection process to specify a control-device-side communication unit of a communication partner and establish connection with the control-device-side communication unit, and after establishing connection with the control-device-side communication unit, communicate the battery information, wherein the monitoring-device-side communication unit is configured to set a first communication speed when executing at least a part of a predetermined connection process of the connection process with the control-device-side communication unit and a second communication speed when transmitting the battery information to the control-device-side communication unit, the first communication speed is lower than the second communication speed.

2. The monitoring device according to claim 1, wherein the monitoring-device-side communication unit is configured to change the first communication speed to the control-device-side communication unit after receiving a connection request during the connection process.

3. The monitoring device according to claim 1, further comprising:

a battery monitoring unit including a start circuit configured to start up a body of the monitoring device upon receiving power supply, wherein the start circuit is configured to receive power supply only from a power supply unit connected by wire at a time of startup.

4. The monitoring device according to claim 3, wherein when executing the connection process with the control-device-side communication unit, the monitoring-device-side communication unit is configured to switch from a predetermined speed which is the first communication speed to a high speed which is the second communication speed before starting the battery monitoring unit.

5. The monitoring device according to claim 1, wherein the control-device-side communication unit is configured to allocate a time slot for receiving the battery information to each of a plurality of monitoring devices, and the monitoring-device-side communication unit is configured to allocate the battery information to the time slot, and transmit the battery information by performing communication at the second communication speed higher than the first communication speed when executing the connection process.

6. The monitoring device according to claim 1, wherein when the monitoring-device-side communication unit transmits an advance notice detection request that is to notify presence of the monitoring-device-side communication unit in the predetermined connection process executed non-synchronously with the control-device-side communication unit, the monitoring-device-side communication unit is configured to transmit the advance notice detection request and perform synchronization, and then perform transmission at a speed lower than the second communication speed when receiving a signal necessary for the connection process.

7. The monitoring device according to claim 1, wherein when the monitoring-device-side communication unit transmits a detection request for establishing a connection in the predetermined connection process executed non-synchronously with the control-device-side communication unit, the monitoring-device-side communication unit is configured to transmit the detection request and perform synchronization, and then perform transmission at a speed lower than the second communication speed when transmitting a signal necessary for the connection process.

8. The monitoring device according to claim 1, wherein when the connection process is completed, the monitoring-device-side communication unit is configured to switch to communication of the battery information and continue periodic communication processing.

9. The monitoring device according to claim 1, wherein the monitoring-device-side communication unit is configured to divide the battery information and transmit the divided battery information to the control-device-side communication unit while executing the connection process.

10. The monitoring device according to claim 1, wherein while executing the connection process with the control-device-side communication unit, the monitoring-device-side communication unit is configured to set a third communication speed when transmitting a packet including the battery information to the control-device-side communication unit to be equal to the second communication speed when transmitting the battery information to the control-device-side communication unit after execution of the connection process is completed.

11. The monitoring device according to claim 1, wherein a third communication speed, at which the monitoring-device-side communication unit communicates with the control-device-side communication unit when a vehicle is in a stop state, is lower than a fourth communication speed when the vehicle is in a start state.

12. The monitoring device according to claim 1, wherein the monitoring device is configured to execute an equalization process to equalize cell voltages among a plurality of battery cells at a predetermined timing when a vehicle is in a stop state, and a third communication speed, at which the monitoring-device-side communication unit communicates with the control-device-side communication unit while executing the equalization process when the vehicle is in the stop state, is higher than a speed, at which the monitoring-device-side communication unit transmits an advance notice detection request as the predetermined connection process.

13. The monitoring device according to claim 1, wherein in the state in which the monitoring-device-side communication unit communicates with the control-device-side communication unit using a cell voltage of the battery as battery information, when the control-device-side communication unit does not receive the cell voltage from the monitoring-device-side communication unit in a certain period, the monitoring-device-side communication unit is configured to execute the connection process with the control-device-side communication unit at a speed lower than a third communication speed of the battery information with which the control-device-side communication unit communicates with a second monitoring-device-side communication unit different than the monitoring-device-side communication unit.

14. The monitoring device according to claim 1, wherein the monitoring-device-side communication unit is configured to perform communication with the control-device-side communication unit by switching between a first channel group including one or more channels in a non-battery information communication frequency band for communicating non-battery information and a second channel group including one or more channels in a battery information communication frequency band for communicating battery information, the monitoring-device-side communication unit is configured to perform communication at a lower speed in the first channel group in the non-battery information communication frequency band than in the second channel group in the battery information communication frequency band, and when communicating the battery information with the control-device-side communication unit using the second channel group in the battery information communication frequency band, and when the control-device-side communication unit does not receive the battery information from the monitoring-device-side communication unit of the monitoring device, the monitoring-device-side communication unit is configured to switch from the second channel group in the battery information communication frequency band to the first channel group in the non-battery information communication frequency band, and execute the connection process with the control-device-side communication unit.

15. The monitoring device according to claim 1, wherein the monitoring-device-side communication unit is configured to switch between a second channel group including one or more channels in a battery information communication frequency band for transmitting battery information to the control-device-side communication unit and a first channel group including one or more channels in a non-battery information communication frequency band that is a band for transmitting an advance notice detection request that is to notify presence of the monitoring device and communicate with the control-device-side communication unit, and the monitoring-device-side communication unit is configured to transmit the advance notice detection request in the non-battery information communication frequency band before transmitting a continuous connection request for continuously connection in the battery information communication frequency band.

16. The monitoring device according to claim 15, wherein the monitoring-device-side communication unit is configured to transmit the continuous connection request at a higher speed than the advance notice detection request.

17. The monitoring device according to claim 1, wherein the connection process includes transmission of a continuous detection request, which is information necessary for completing connection establishment and transmission of advance notice detection request, which is an advance notice command for giving an advance notice of a transmission timing of the continuous detection request, the advance notice detection request is information to cause the control-device-side communication unit to wait based on a transmission reservation timing of the advance notice detection request to detect the continuous detection request at a timing when the continuous detection request is transmitted subsequently to the advance notice detection request, a third communication speed when transmitting the advance notice detection request is lower than a fourth communication speed when transmitting the continuous detection request, and the third communication speed when transmitting the advance notice detection request and the fourth communication speed when transmitting the continuous detection request are lower than the second communication speed when transmitting the battery information.

18. A control device configured to receive battery information from at least one monitoring device by wireless communication, the at least one monitoring device configured to monitor a state of a battery and transmit the state of the battery as the battery information by wireless communication, the control device comprising:

at least one of (i) a circuit and (ii) a processor with a memory storing computer program code executable by the processor, the at least one of the circuit and the processor being configured to cause the control device to implement:

a control-device-side communication unit configured to execute, before transmitting the battery information, a connection process to specify a control-device-side communication unit of a communication partner and establish connection with the control-device-side communication unit, and after establishing connection with the control-device-side communication unit, communicate the battery information with a monitoring-device-side communication unit of a monitoring device of the at least one monitoring device, wherein the control-device-side communication unit is configured to set a first communication speed when at least a part of a predetermined connection process of the connection process is executed with the monitoring device and a second communication speed when the battery information is received, the first communication speed is lower than the second communication speed.

19. The control device according to claim 18, wherein the control-device-side communication unit is configured to change the second communication speed at which the battery information is transmitted from the monitoring-device-side communication unit to the control-device-side communication unit after transmitting a connection request during the connection process.

20. The control device according to claim 18, wherein the control-device-side communication unit is configured to allocate a time slot for receiving the battery information to each of a plurality of monitoring devices.

21. The control device according to claim 18, wherein when the control-device-side communication unit receives an advance notice detection request that is to notify presence of the monitoring-device-side communication unit transmitted from the monitoring-device-side communication unit in the predetermined connection process executed non-synchronously with the monitoring-device-side communication unit, the control-device-side communication unit is configured to receive the advance notice detection request from the monitoring-device-side communication unit and perform synchronization, and then perform reception at a speed lower than the second communication speed when receiving a signal necessary for the connection process.

22. The control device according to claim 18, wherein when the control-device-side communication unit receives a detection request transmitted from the monitoring-device-side communication unit for establishing a connection in the predetermined connection process executed non-synchronously with the monitoring-device-side communication unit, the control-device-side communication unit is configured to receive the detection request from the monitoring-device-side communication unit and perform synchronization, and then perform reception at a speed lower than the second communication speed when receiving a signal necessary for the connection process.

23. The control device according to claim 18, wherein a plurality of monitoring devices are provided including the at least one monitoring device and a corresponding plurality of monitoring-device-side communication units are provided including the monitoring-device-side communication unit, the control-device-side communication unit is configured to individually communicate with each monitoring-device-side communication unit of the plurality of monitoring devices and individually switch a respective communication speed from each monitoring-device-side communication unit to the control-device-side communication unit.

24. The control device according to claim 18, wherein the control-device-side communication unit is configured to switch communication from the monitoring device that completes the connection process to communication of the battery information and continue communication.

25. The control device according to claim 18, wherein while switching a communication speed from another monitoring device to the control-device-side communication unit, the control-device-side communication unit is configured not to change a communication speed from the control-device-side communication unit to a plurality of monitoring devices.

26. The control device according to claim 18, wherein the control-device-side communication unit is configured to divide the battery information during the connection process and command the monitoring device to transmit the divided battery information.

27. The control device according to claim 26, wherein the control-device-side communication unit is configured to set a communication speed from the monitoring device when a vehicle is in a stop state to be lower than a communication speed when the vehicle is in a start state.

28. The control device according to claim 18, wherein the control-device-side communication unit is configured to set the communication speed from the monitoring-device-side communication unit, during an equalization process of cell voltages of the battery when a vehicle is in a stop state, to be higher than a communication speed when receiving an advance notice detection request from the monitoring-device-side communication unit as the predetermined connection process.

29. The control device according to claim 18, wherein in a state in which receiving a cell voltage of the battery as the battery information from the monitoring-device-side communication unit, and when not receiving the cell voltage from the monitoring-device-side communication unit in a certain period, the control-device-side communication unit is configured to perform a connection process with the monitoring-device-side communication unit at a speed lower than the second communication speed of the battery information with the monitoring-device-side communication unit other than a monitoring device that does not receive the cell voltage.

30. A battery information communication system comprising:

at least one monitoring device configured to monitor a state of a battery and transmit the state of the battery as battery information by wireless communication; and a control device configured to receive the battery information from the monitoring device by wireless communication, wherein the monitoring device includes at least one of (i) a circuit and (ii) a processor with a memory storing computer program code executable by the processor, the at least one of the circuit and the processor being configured to cause the monitoring device to implement a monitoring-device-side communication unit configured to execute, before transmitting the battery information, a connection process to specify a control-device-side communication unit of a communication partner and establish connection with the control-device-side communication unit, and after establishing connection with the control-device-side communication unit, communicate the battery information, the control device includes at least one of (i) a circuit and (ii) a processor with a memory storing computer program code executable by the processor, the at least one of the circuit and the processor being configured to cause the control device to implement the control-device-side communication unit configured to perform the connection process with the monitoring-device-side communication unit and communicate the battery information, and the control-device-side communication unit and the monitoring-device-side communication unit are configured to set a first communication speed when executing at least a part of a predetermined connection process of the connection process to each other and a second communication speed when communicating the battery information from the monitoring-device-side communication unit to the control-device-side communication unit, the first communication speed is lower than the second communication speed.

31. A non-transitory computer readable medium storing a battery information communication program to be executed by at least one monitoring device, the at least one monitoring device configured to monitor a state of a battery and transmit the state of the battery as battery information to a control device by wireless communication, the battery information communication program comprising instructions configured to, when executed by the at least one monitoring device, cause the at least one monitoring device to carry out:

causing a monitoring-device-side communication unit to execute, before transmitting the battery information, a communication procedure to execute a connection process to specify a control-device-side communication unit of a communication partner and establish connection with the control-device-side communication unit, and after establishing connection with the control-device-side communication unit, transmit the battery information; and setting, in the communication procedure, a first communication speed when executing at least a part of a predetermined connection process of the connection process and a second communication speed when transmitting the battery information from the monitoring-device-side communication unit to the control-deviceside communication unit, the first communication speed is lower than the second communication speed.

32. A battery information communication method to be executed by at least one monitoring device, the at least one monitoring device configured to monitor a state of a battery and transmit the state of the battery as battery information to a control device by wireless communication, the battery information communication method comprising:

before transmitting the battery information, in a connection process, specifying a control-device-side communication unit of a communication partner and establishing connection between a monitoring-device-side communication unit and the control-device-side communication unit;

after establishing connection between the monitoring-device-side communication unit and the control-device-side communication unit, transmitting, in a transmission process, the battery information; and performing, in the transmission process, communication at a first communication speed when executing at least a part of a predetermined connection process of the connection process and at a second communication speed when transmitting the battery information from the monitoring-device-side communication unit to the control-device-side communication unit, the first communication speed is lower than the second communication speed.

* * * * *